United States Patent
Ahn et al.

(10) Patent No.: US 10,800,796 B2
(45) Date of Patent: Oct. 13, 2020

(54) AROMATIC COMPOUND AND ORGANIC ELECTROLUMINESCENCE DEVICE INCLUDING THE SAME

(71) Applicant: Samsung Display Co., Ltd., Yongin-si, Gyeonggi-do (KR)

(72) Inventors: Heechoon Ahn, Suwon-si (KR); Soo-byung Ko, Yongin-si (KR); Mieun Jun, Hwaseong-si (KR); Sungbum Kim, Yongin-si (KR); Mina Jeon, Suwon-si (KR); Youngkook Kim, Suwon-si (KR); Seokhwan Hwang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 350 days.

(21) Appl. No.: 15/958,642

(22) Filed: Apr. 20, 2018

(65) Prior Publication Data
US 2019/0085001 A1  Mar. 21, 2019

(30) Foreign Application Priority Data

Sep. 21, 2017  (KR) .................. 10-2017-0122057

(51) Int. Cl.
*H01L 51/00* (2006.01)
*C07F 7/08* (2006.01)
(Continued)

(52) U.S. Cl.
CPC ............ *C07F 7/0816* (2013.01); *C09K 11/06* (2013.01); *H01L 51/0071* (2013.01);
(Continued)

(58) Field of Classification Search
None
See application file for complete search history.

(56) References Cited

U.S. PATENT DOCUMENTS

2010/0045170 A1  2/2010  Lee et al.
2015/0162542 A1*  6/2015  Ryu .................... H01L 51/0059
                                                              257/40
(Continued)

FOREIGN PATENT DOCUMENTS

JP          5730468      6/2015
KR        10-0910150     8/2009
(Continued)

OTHER PUBLICATIONS

Gilman et al. "Preparation and Reactions of Some Unsymmetrical Phenoxasilin Compounds" J. Org. Chem. 1962, 1418-1422. (Year: 1962).*

*Primary Examiner* — Robert S Loewe
(74) *Attorney, Agent, or Firm* — Lewis Roca Rothgerber Christie LLP

(57) ABSTRACT

An aromatic compound which improves emission efficiency and an organic electroluminescence device including the same are provided. The organic electroluminescence device includes: a first electrode; a second electrode opposite to the first electrode; and a plurality of organic layers between the first electrode and the second electrode, where at least one organic layer among the plurality of organic layers includes the aromatic compound. The aromatic compound is represented by Formula 1 below.

(Continued)

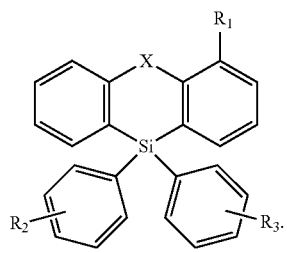

Formula 1

20 Claims, 1 Drawing Sheet

(51) Int. Cl.
*C09K 11/06* (2006.01)
*H01L 51/50* (2006.01)

(52) U.S. Cl.
CPC ...... *H01L 51/0094* (2013.01); *H01L 51/5024* (2013.01); *H01L 51/5056* (2013.01); *H01L 51/5072* (2013.01); *C09K 2211/104* (2013.01); *C09K 2211/107* (2013.01); *C09K 2211/1055* (2013.01); *C09K 2211/1096* (2013.01); *H01L 51/5012* (2013.01)

(56) References Cited

U.S. PATENT DOCUMENTS

2015/0318501 A1   11/2015   Watanabe et al.
2018/0013074 A1*   1/2018   Zeng ................... H01L 51/0073

FOREIGN PATENT DOCUMENTS

| KR | 10-2011-0049244 | 5/2011 |
| KR | 10-2015-0079960 | 7/2015 |
| WO | WO 2011/055912 A1 | 5/2011 |
| WO | WO 2015/080182 A1 | 6/2015 |

\* cited by examiner

AROMATIC COMPOUND AND ORGANIC ELECTROLUMINESCENCE DEVICE INCLUDING THE SAME

CROSS-REFERENCE TO RELATED APPLICATION

This application claims priority to and the benefit of Korean Patent Application No. 10-2017-0122057, filed in the Korean Intellectual Property Office on Sep. 21, 2017, the entire content of which is incorporated herein by reference.

BACKGROUND

Recently, the development of an organic electroluminescence display device as an image display device is being actively conducted. Different from a liquid crystal display device, the organic electroluminescence display device is a so-called self-luminescent display device in which holes and electrons injected from a first electrode and a second electrode recombine in an emission layer, and a luminescent material including an organic compound in the emission layer emits light to display an image.

An organic electroluminescence device includes, for example, a first electrode, a hole transport layer disposed on the first electrode, an emission layer disposed on the hole transport layer, an electron transport layer disposed on the emission layer, and a second electrode disposed on the electron transport layer. Holes are injected from the first electrode, and the injected holes move via the hole transport layer and are injected to the emission layer. Meanwhile, electrons are injected from the second electrode, and the injected electrons move via the electron transport layer and are injected to the emission layer. The holes and electrons injected to the emission layer recombine to generate excitons in the emission layer. The organic electroluminescence device emits light that is generated by the radiation deactivation of the excitons. In addition, the organic electroluminescence device is not limited to the above-described configuration, but various suitable modifications may be possible.

In the application of an organic electroluminescence device to a display device, the decrease of the driving voltage, and the increase of the emission efficiency and the life of the organic electroluminescence device are required, and developments on materials for an organic electroluminescence device attaining the requirements stably are being continuously pursued.

SUMMARY

An aspect according to embodiments of the present disclosure is directed toward an aromatic compound for an organic electroluminescence device having a high efficiency.

Another aspect according to embodiments of the present disclosure is directed toward an organic electroluminescence device including an aromatic compound in an organic layer and having a high efficiency and long life.

According to an embodiment of the inventive concept, an aromatic compound is represented by the following Formula 1:

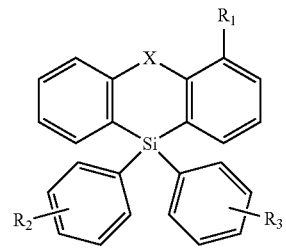

Formula 1

In Formula 1, $R_1$ to $R_3$ may be each independently represented by Formula 2 below, or a hydrogen atom, where at least one of $R_1$ to $R_3$ may be represented by Formula 2. In Formula 1, X may be O or S.

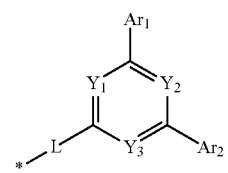

Formula 2

In Formula 2, $Y_1$ to $Y_3$ may be each independently CH or N.

In Formula 2, L may be a direct linkage, a substituted or unsubstituted arylene group having 6 to 12 carbon atoms for forming a ring, or a substituted or unsubstituted heteroarylene group having 5 to 11 carbon atoms for forming a ring.

In Formula 2, $Ar_1$ and $Ar_2$ may be each independently represented by Formula 3 or Formula 4, or a hydrogen atom, where at least one of $Ar_1$ or $Ar_2$ may be represented by Formula 3 or Formula 4:

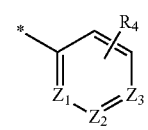

Formula 3

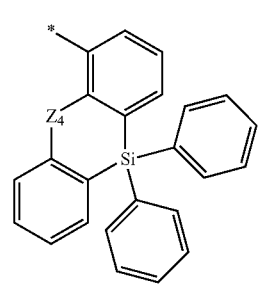

Formula 4

In Formula 3 and Formula 4, $Z_1$ to $Z_3$ may be each independently $CR_5$ or N.

In Formula 3 and Formula 4, $Z_4$ may be O or S; $R_4$ may be a hydrogen atom, a cyano group, or a substituted or unsubstituted silyl group; and $R_5$ may be a hydrogen atom, or a substituted or unsubstituted aryl group.

In an embodiment, the aromatic compound represented by Formula 1 may be represented by the following Formula 1-1 or Formula 1-2:

Formula 1-1

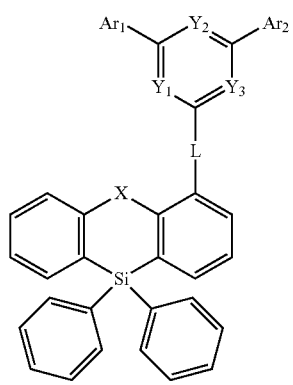

Formula 1-2

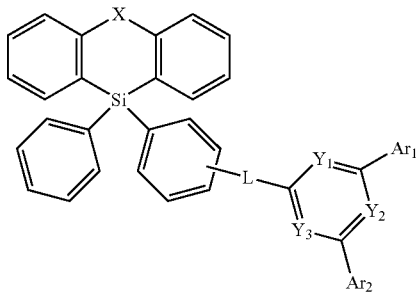

In Formula 1-1 and Formula 1-2, X, L, $Y_1$ to $Y_3$, $Ar_1$, and $Ar_2$ are the same as respectively defined in Formulae 1 and 2.

In an embodiment, a moiety represented by Formula 2 may be represented by one of the following Formula 2-1 to Formula 2-4:

Formula 2-1

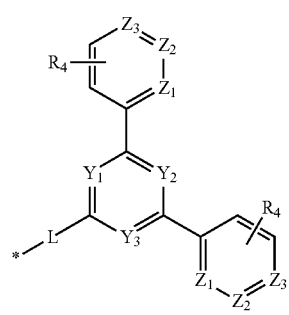

Formula 2-2

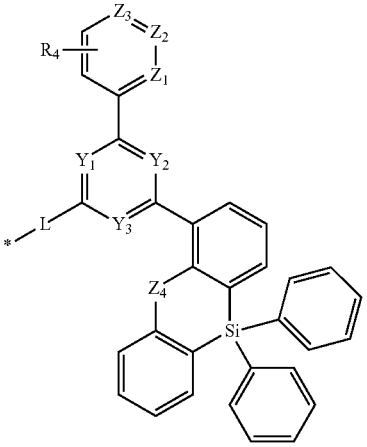

Formula 2-3

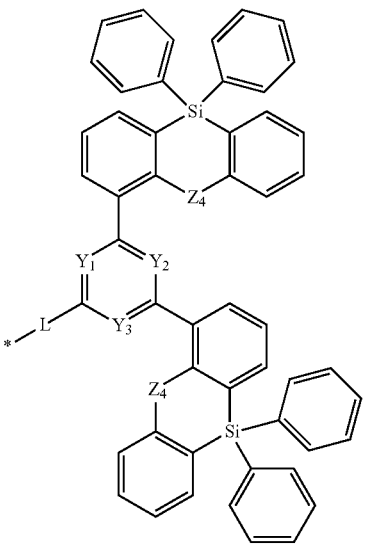

Formula 2-4

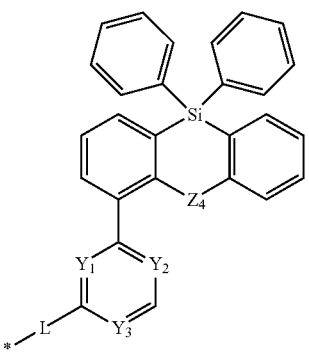

In Formula 2-1 to Formula 2-4, L, $Y_1$ to $Y_3$, $Z_1$ to $Z_4$, and $R_4$ are the same as respectively defined in Formulae 2 to 4.

In an embodiment, a moiety represented by Formula 3 may be represented by one of the following Formula 3-1 to Formula 3-7:

3-1
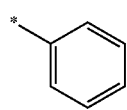

3-2
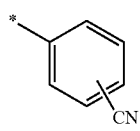

3-3
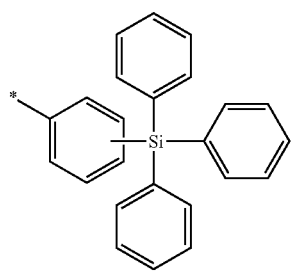

3-4
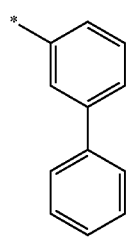

3-5
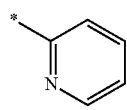

3-6
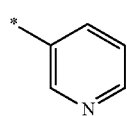

3-7
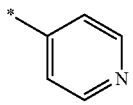

In an embodiment, a moiety represented by Formula 4 may be represented by the following Formula 4-1 or 4-2:

4-1
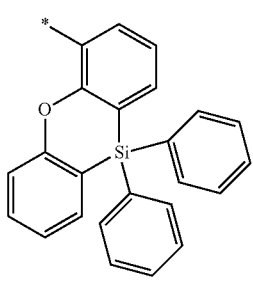

4-2
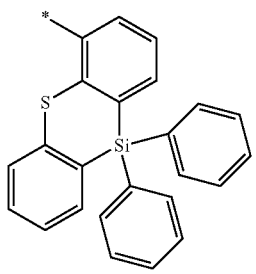

In an embodiment, L may be a direct linkage, a substituted or unsubstituted phenylene group, a substituted or unsubstituted divalent biphenyl group, or a substituted or unsubstituted heteroarylene group containing N as a heteroatom.

In an embodiment, L may be represented by one of the following Formula L-1 to Formula L-7:

L-1
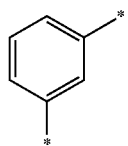

L-2
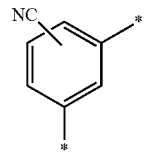

L-3
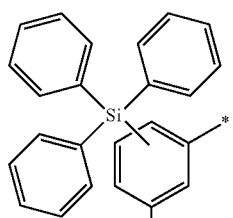

L-4
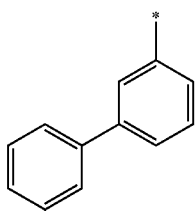

L-5
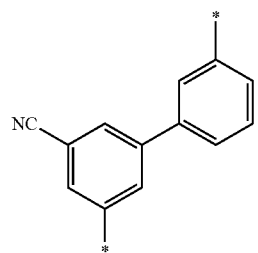

L-6
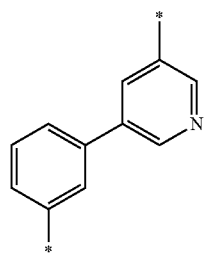
L-7
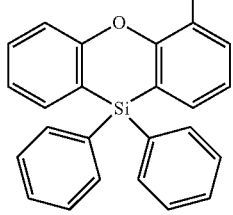
In an embodiment, the aromatic compound represented by Formula 1 may be one selected from the compounds represented in the following Compound Group 1:
Compound Group 1
1
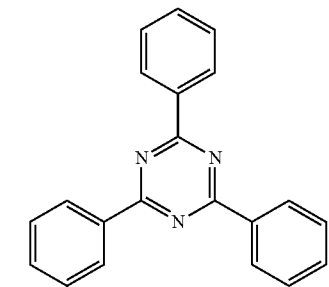
2
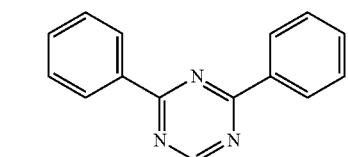
3
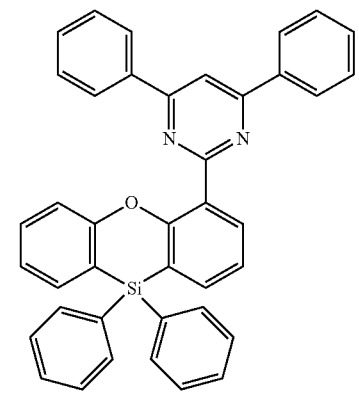
4
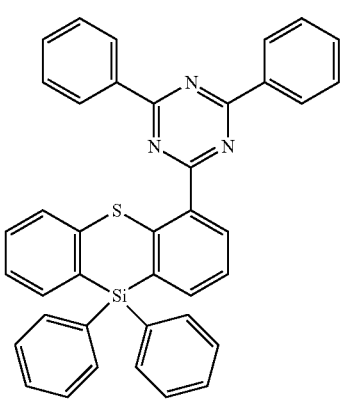 [SMILES: c1ccc(-c2nc(-c3ccccc3)nc(-c3cccc4c3Oc3ccccc3[Si]4(c3ccccc3)c3ccccc3)n2)cc1]
5
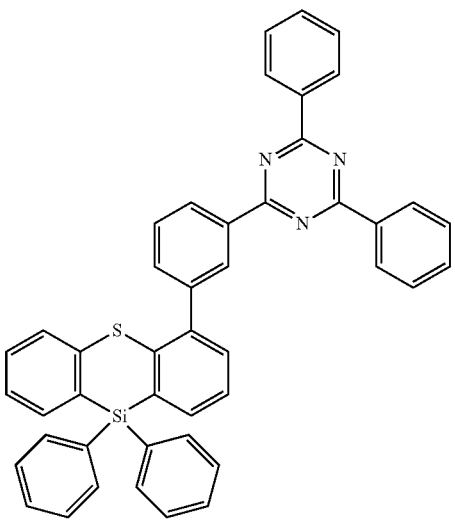

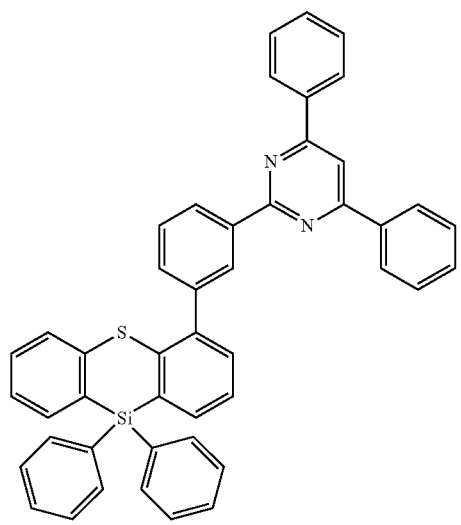
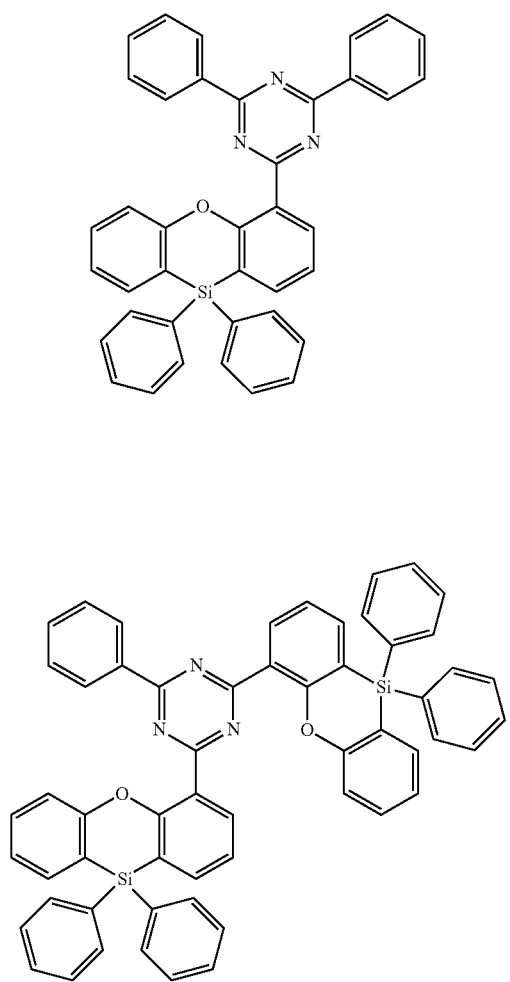
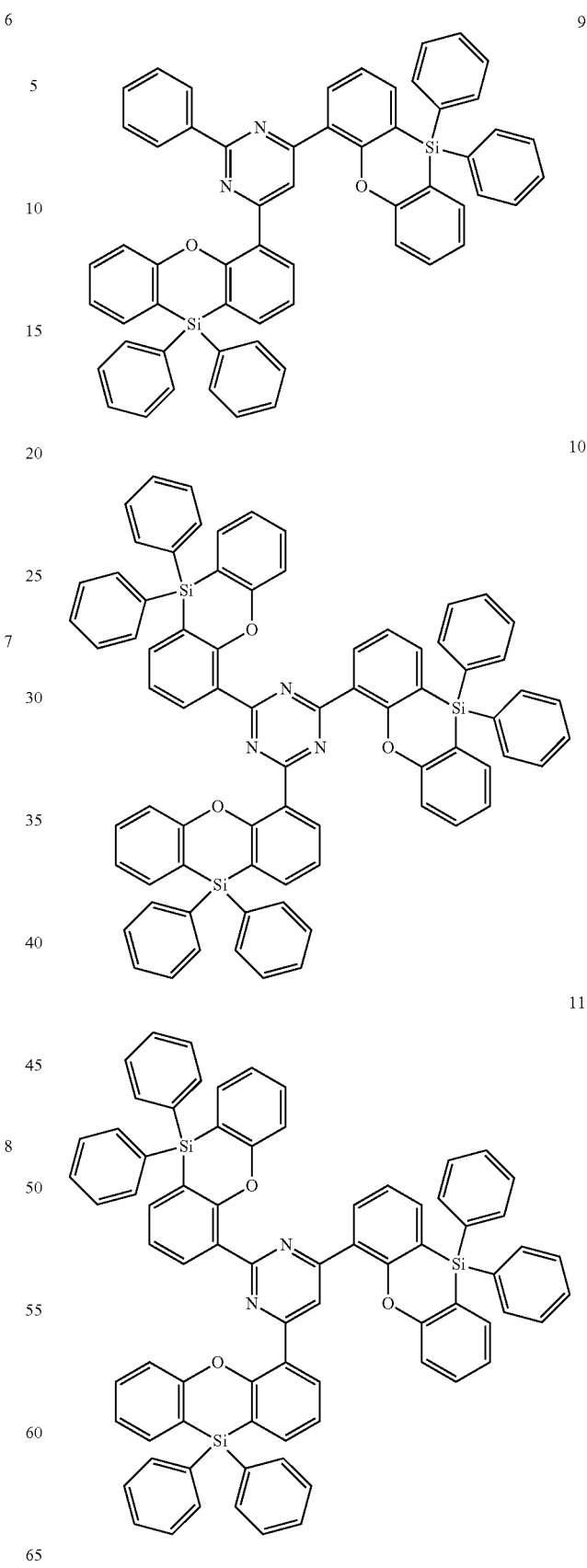

12
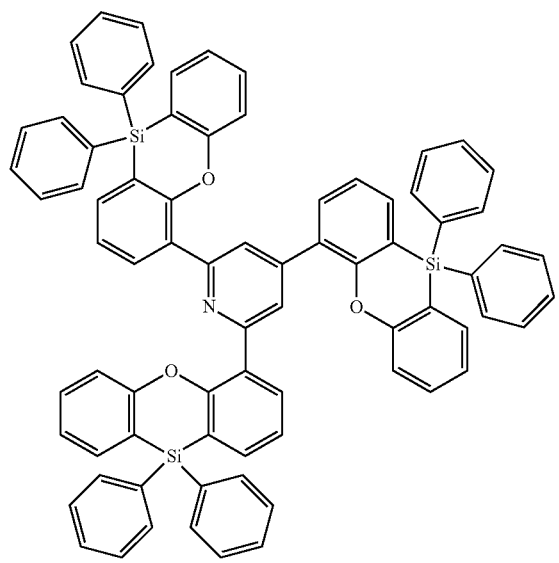
13
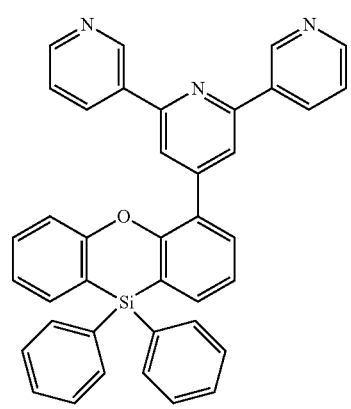
14
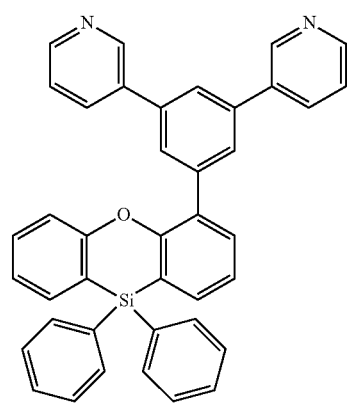
15
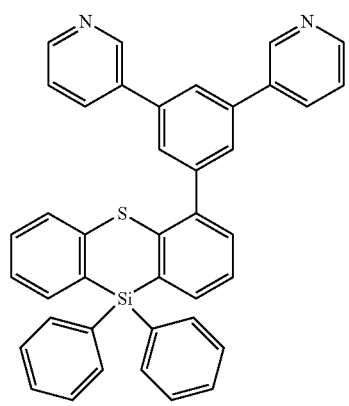
16
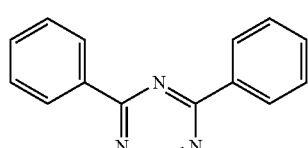
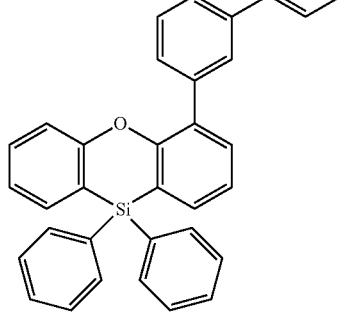
17

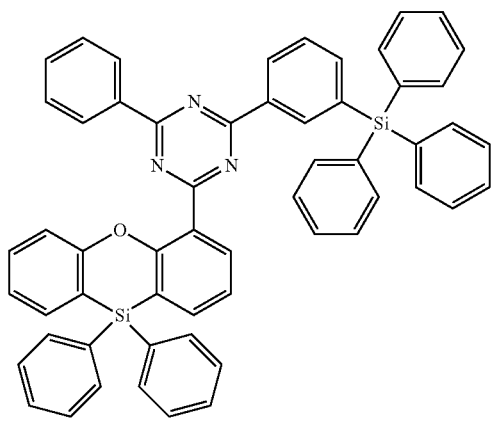
18
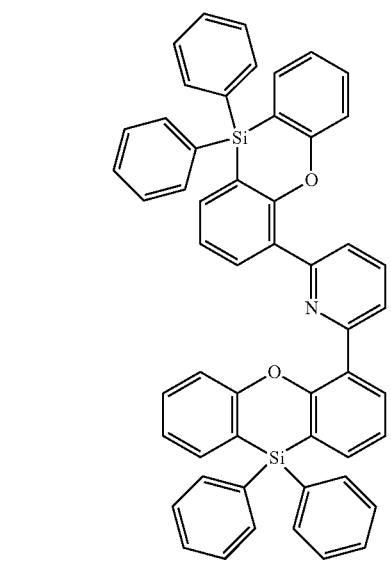
19
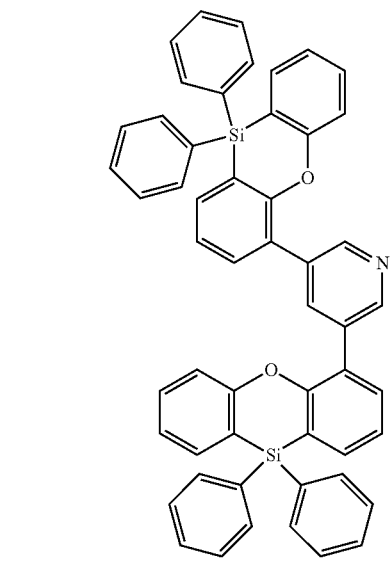
20
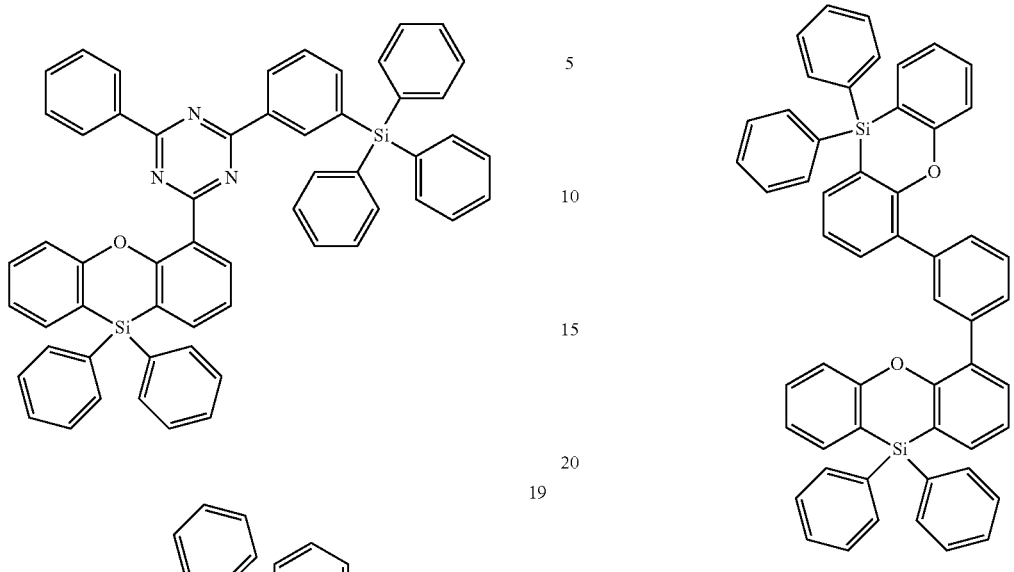
21
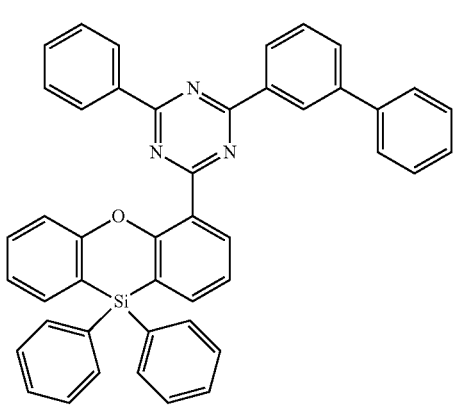
22
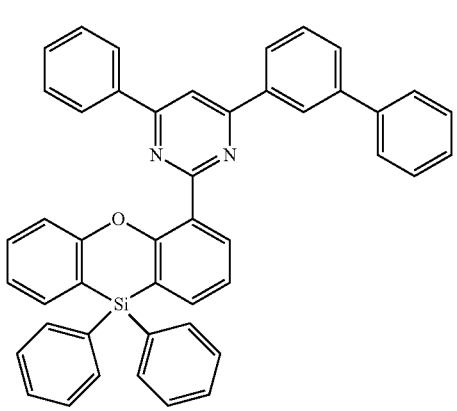
23

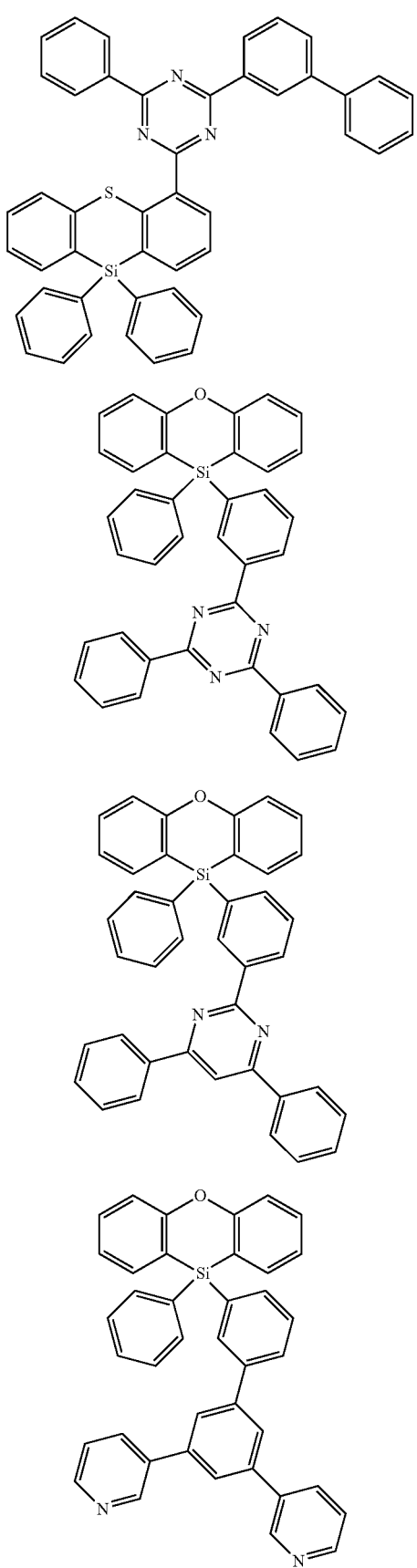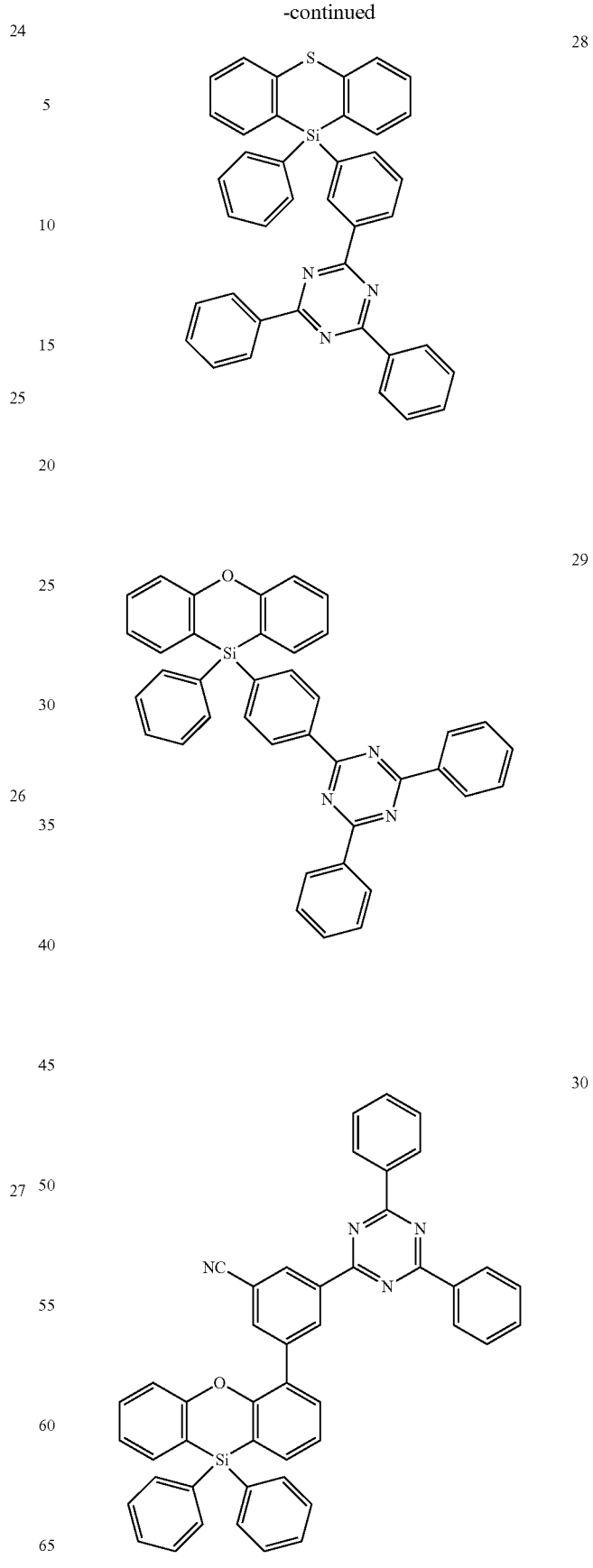

31
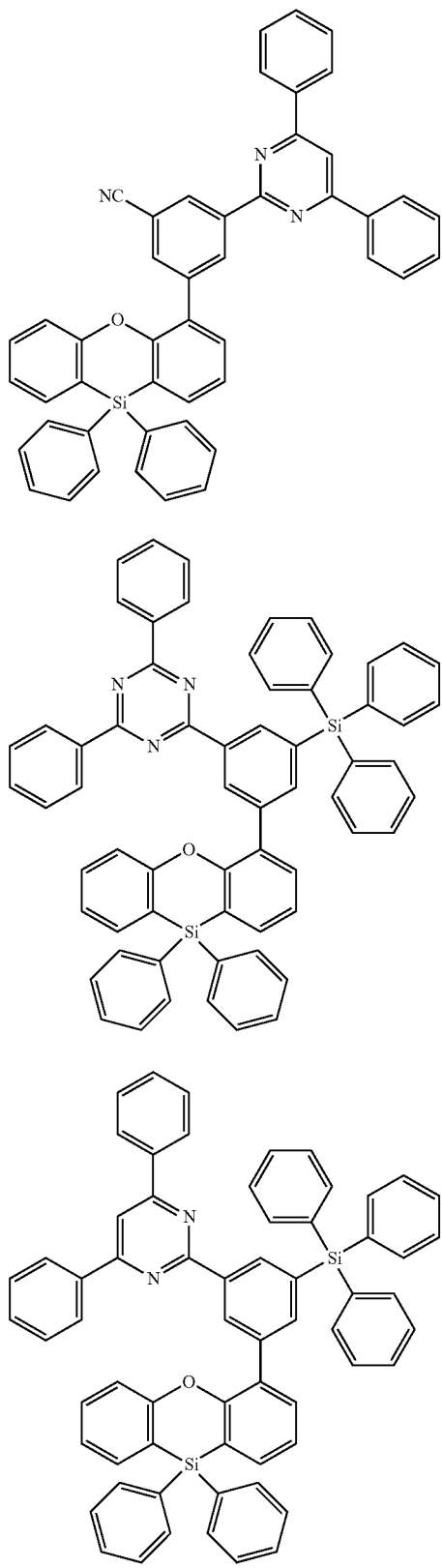
32
33
34
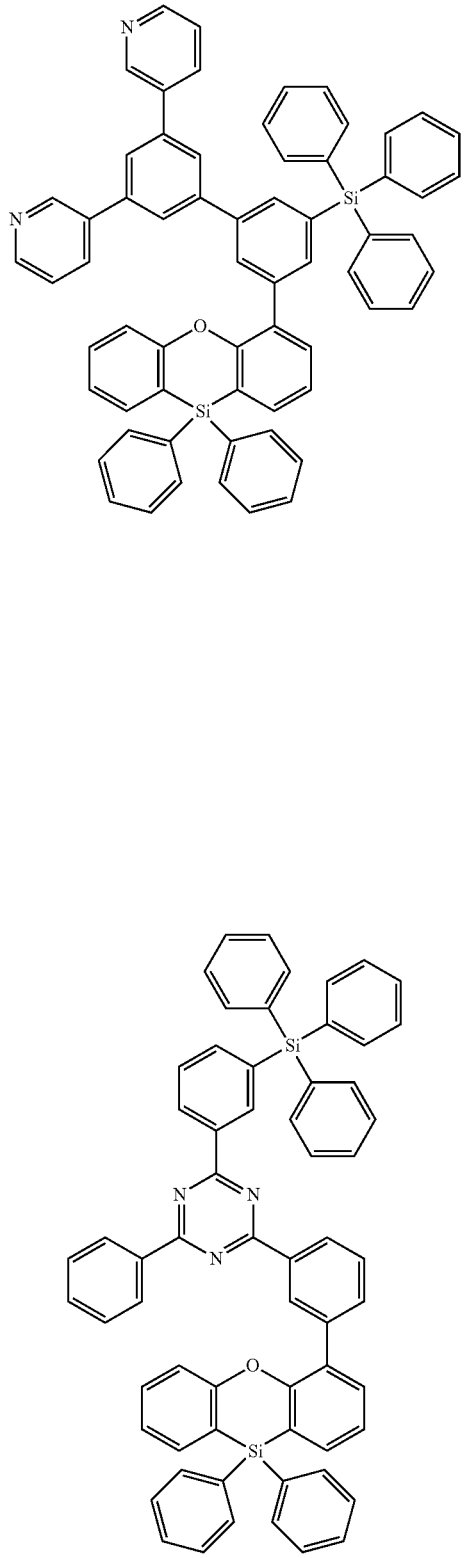
35

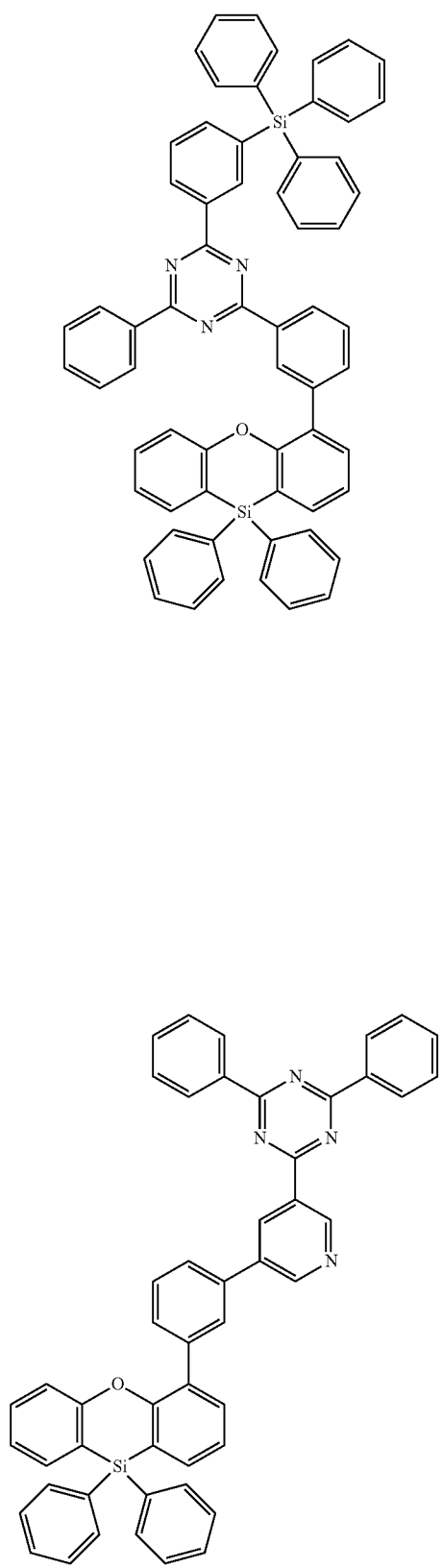
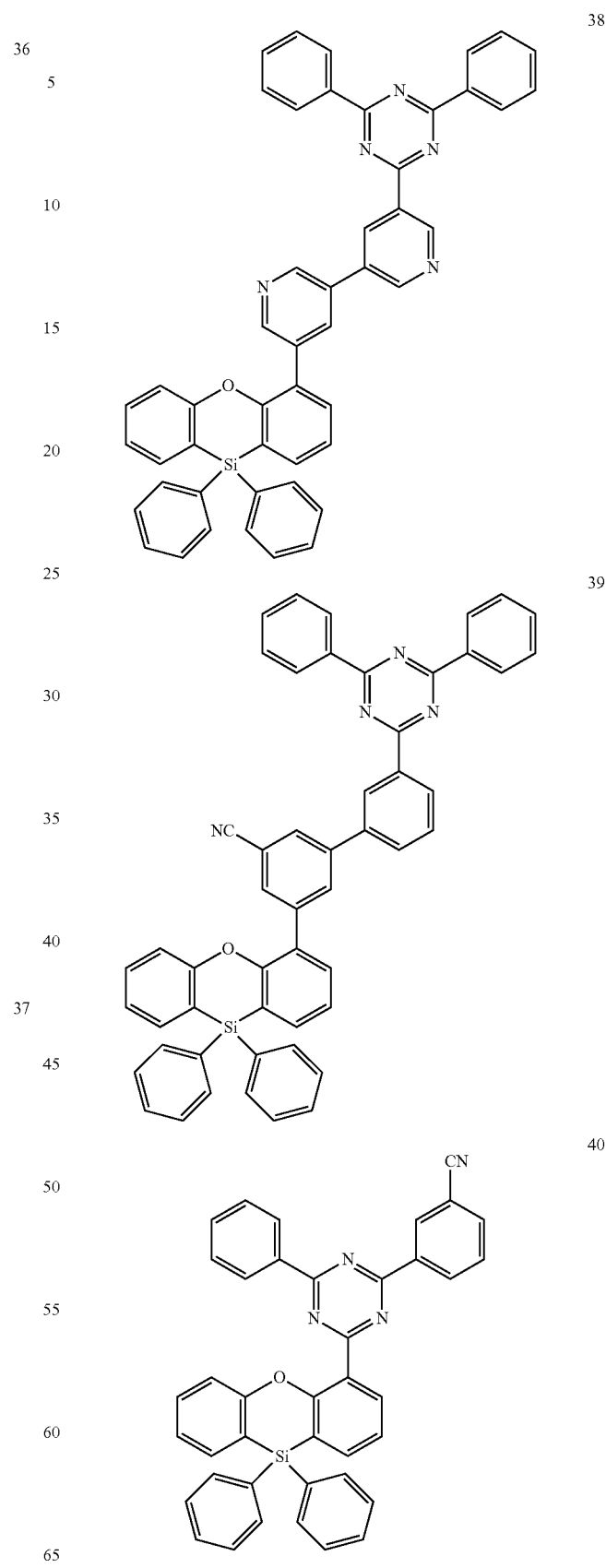

41
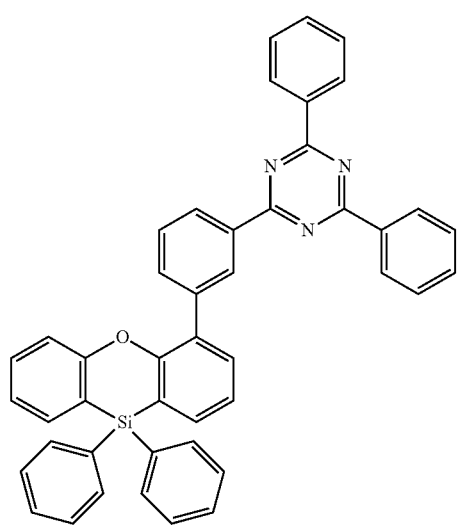
42
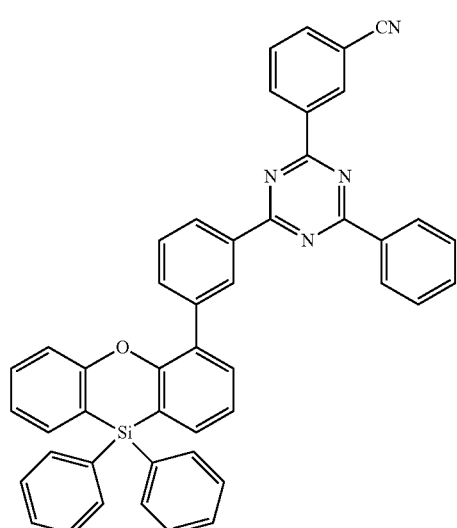
43
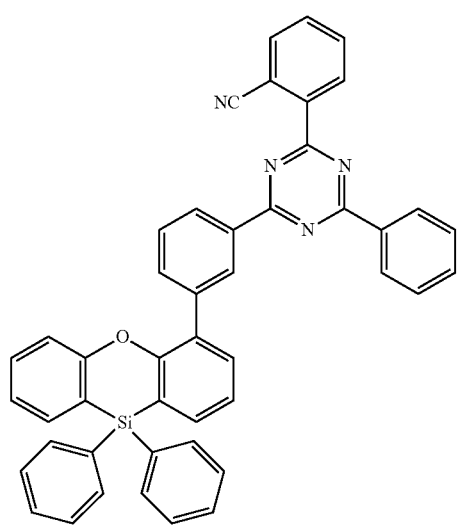
44
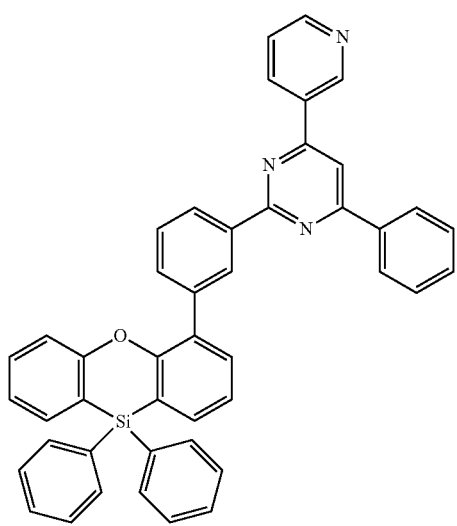
45
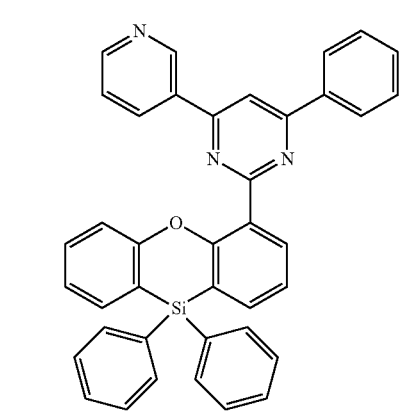
46
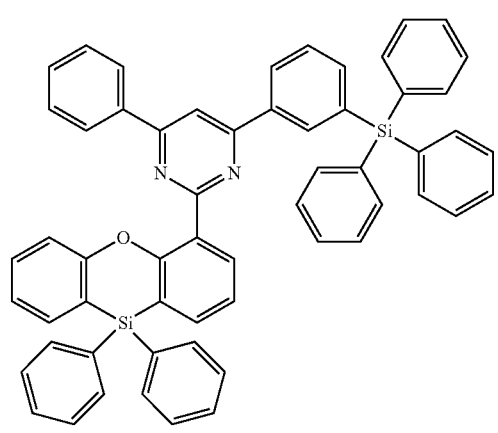

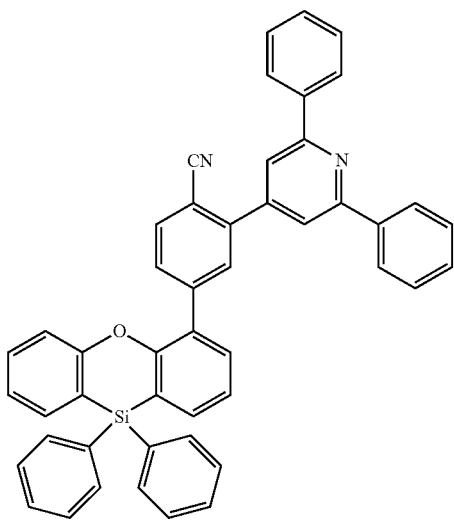

47

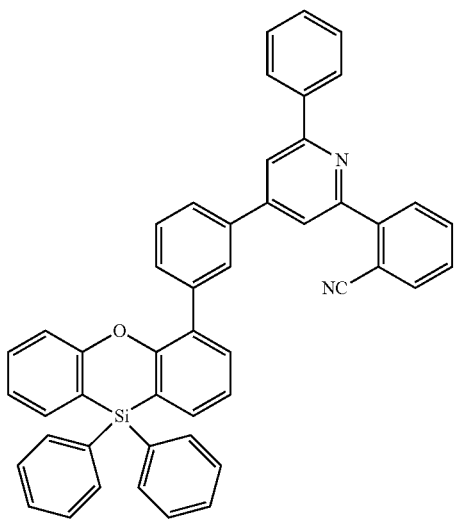

48

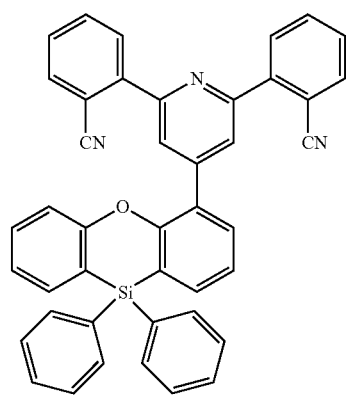

49

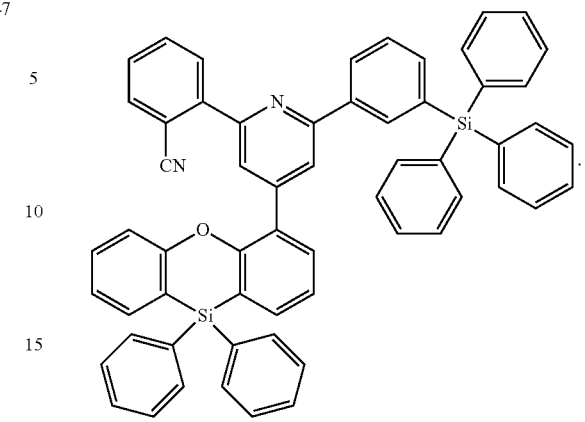

50

According to an embodiment of the inventive concept, an organic electroluminescence device includes a first electrode, a second electrode opposite to the first electrode, and a plurality of organic layers between the first electrode and the second electrode, wherein at least one organic layer among the plurality of organic layers includes an aromatic compound represented by the following Formula 1:

Formula 1

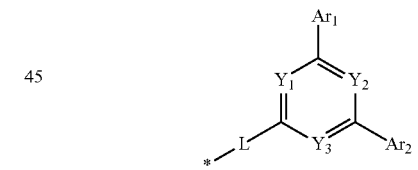

In Formula 1, $R_1$ to $R_3$ may be each independently represented by Formula 2 below, or a hydrogen atom, where at least one of $R_1$ to $R_3$ may be represented by Formula 2 below.

In Formula 1, X may be O or S.

Formula 2

In Formula 2, $Y_1$ to $Y_3$ may be each independently CH or N.

In Formula 2, L may be a direct linkage, a substituted or unsubstituted arylene group having 6 to 12 carbon atoms for forming a ring, or a substituted or unsubstituted heteroarylene group having 5 to 11 carbon atoms for forming a ring.

In Formula 2, $Ar_1$ and $Ar_2$ may be each independently represented by the following Formula 3 or Formula 4, or a hydrogen atom, where at least one of $Ar_1$ or $Ar_2$ may be represented by Formula 3 or Formula 4:

Formula 3

Formula 4

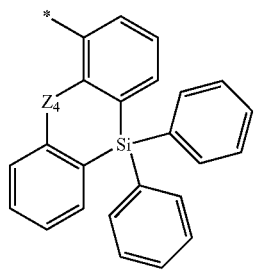

In Formula 3 and Formula 4, $Z_1$ to $Z_3$ may be each independently $CR_5$ or N.

In Formula 3 and Formula 4, $Z_4$ may be O or S; $R_4$ may be a hydrogen atom, a cyano group, or a substituted or unsubstituted silyl group; and $R_5$ may be a hydrogen atom, or a substituted or unsubstituted aryl group.

In an embodiment, the plurality of organic layers may include a hole transport region on the first electrode, an emission layer on the hole transport region, and an electron transport region on the emission layer, wherein the emission layer includes the aromatic compound represented by Formula 1.

In an embodiment, the emission layer may be a fluorescence emission layer including a first host and a first dopant, and the first host may include the aromatic compound represented by Formula 1.

In an embodiment, the emission layer may be a phosphorescence emission layer including a second host and a second dopant, and the second host may include the aromatic compound represented by Formula 1.

In an embodiment, the electron transport region may include the aromatic compound represented by Formula 1.

In an embodiment, the emission layer may emit blue light.

In an embodiment, at least one organic layer among the plurality of organic layers may include at least one selected from the aromatic compounds represented in the following Compound Group 1:

Compound Group 1

1

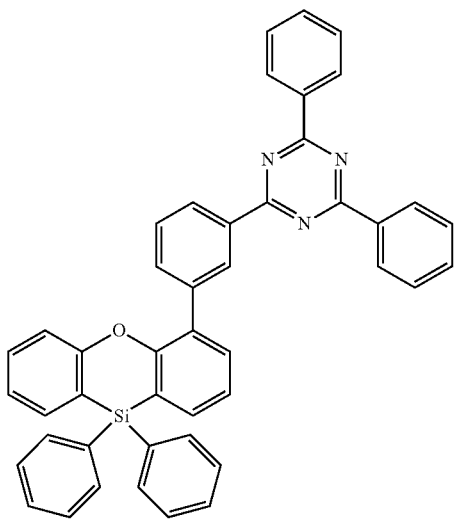

2

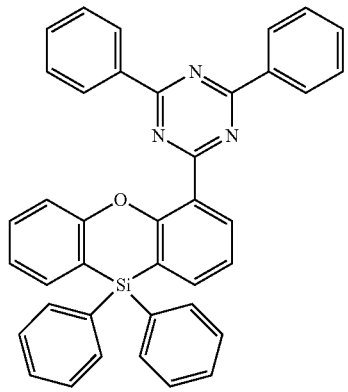

3

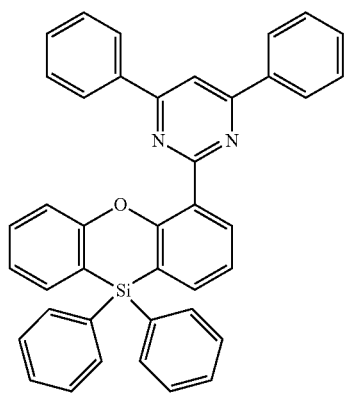

4

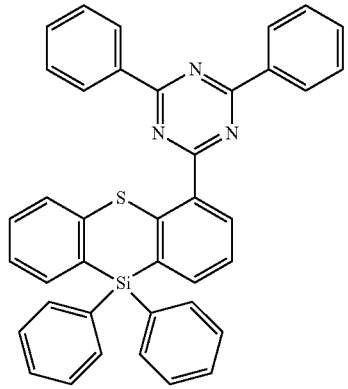

5
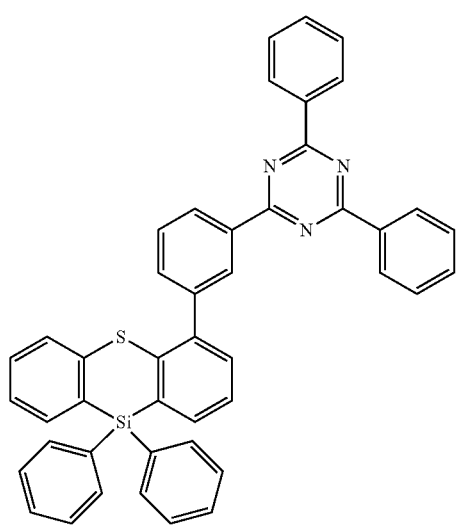 [SMILES: c1ccc(-c2nc(-c3ccccc3)nc(-c3cccc(-c4cccc5c4Sc4ccccc4[Si]5(c4ccccc4)c4ccccc4)c3)n2)cc1]
6
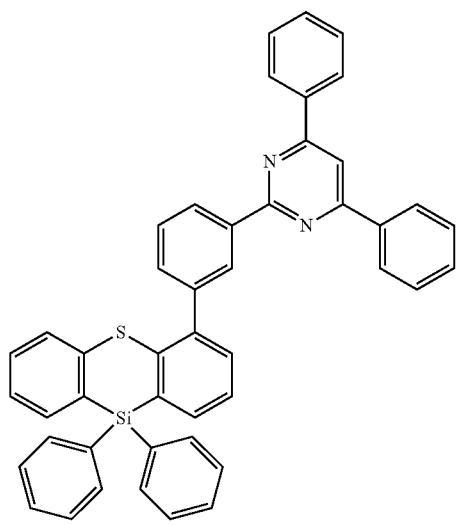
7
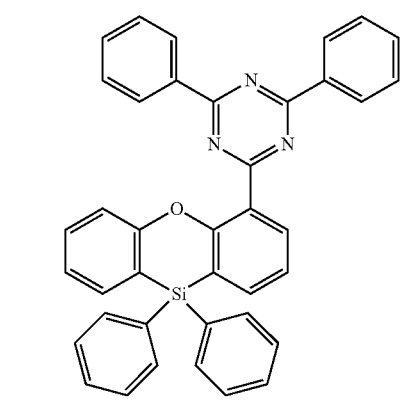
8
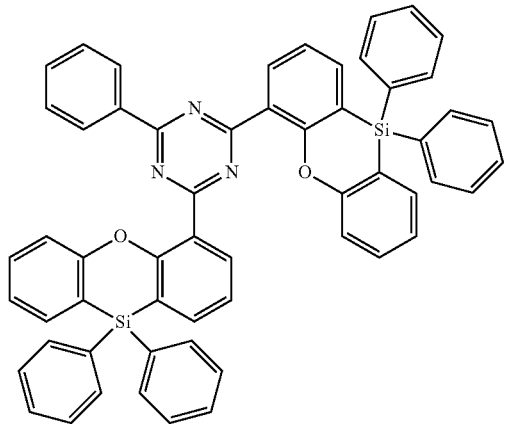 [SMILES: c1ccc(-c2nc(-c3cccc4c3Oc3ccccc3[Si]4(c3ccccc3)c3ccccc3)nc(-c3cccc4c3Oc3ccccc3[Si]4(c3ccccc3)c3ccccc3)n2)cc1]
9
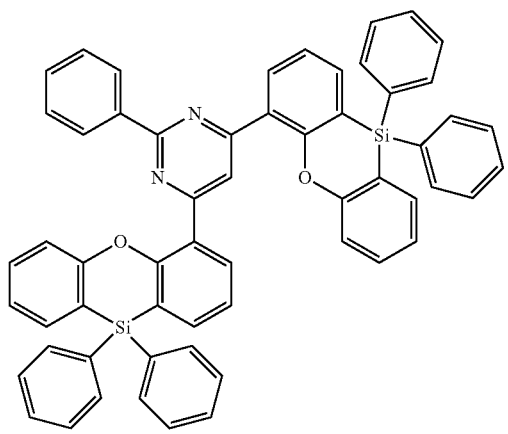
10
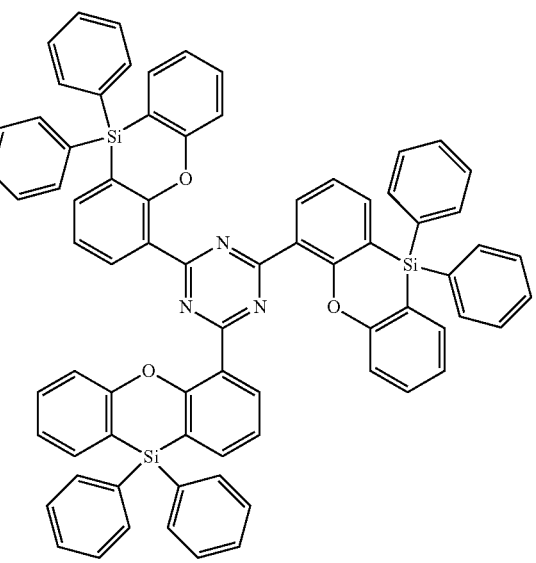

11
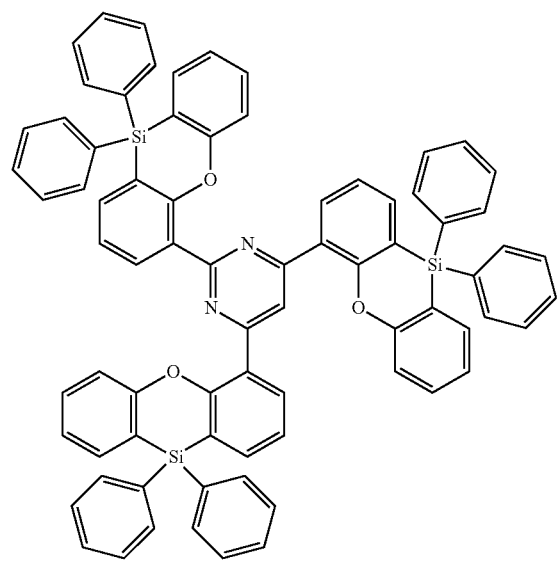
12
14
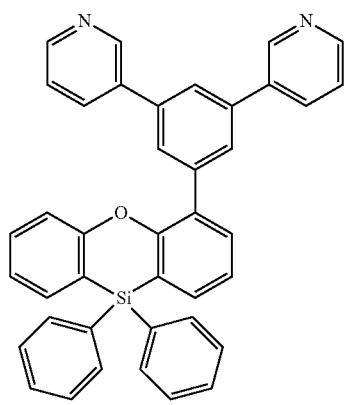
15
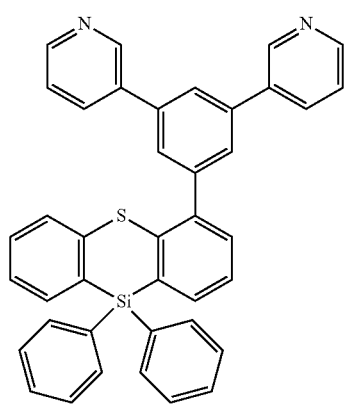
13
16
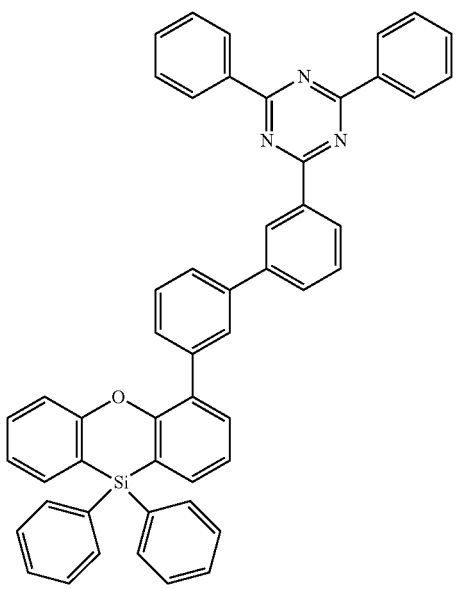

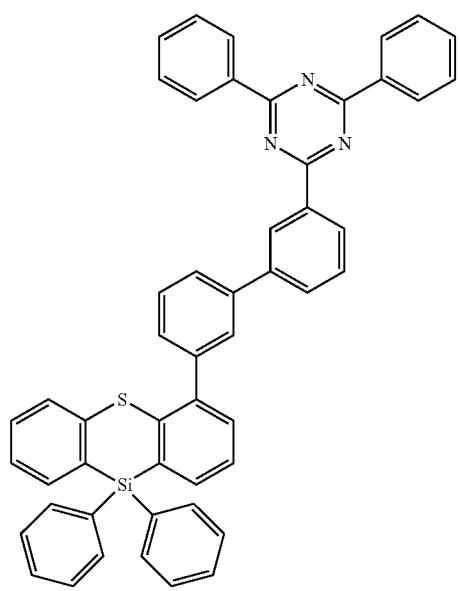
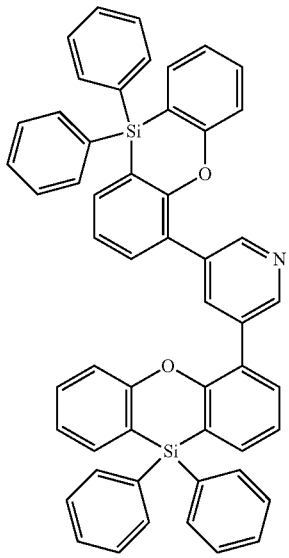

-continued
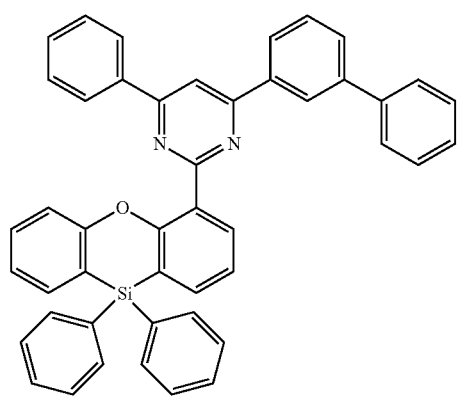
23
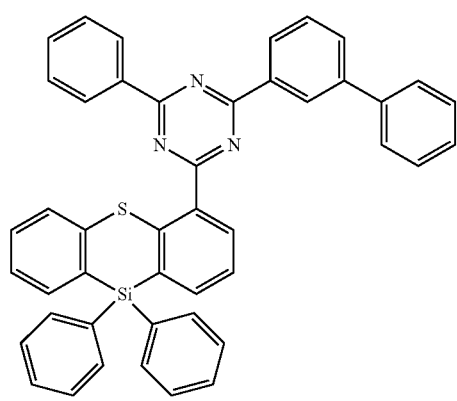
24
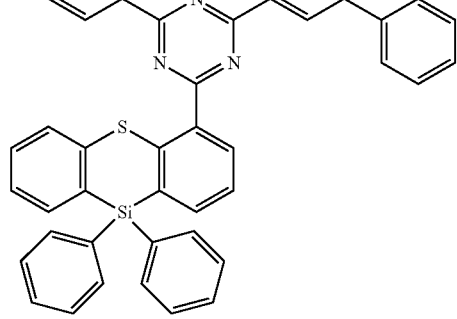
25
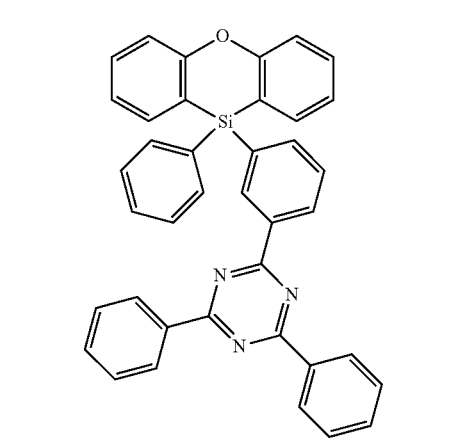
26
-continued
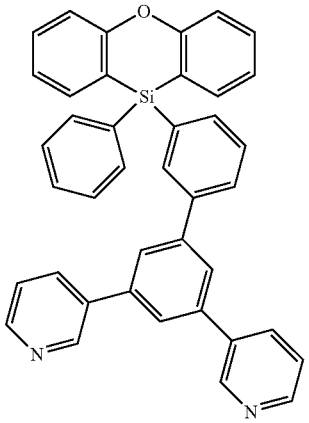
27
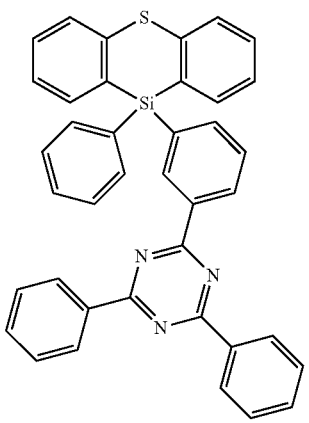
28
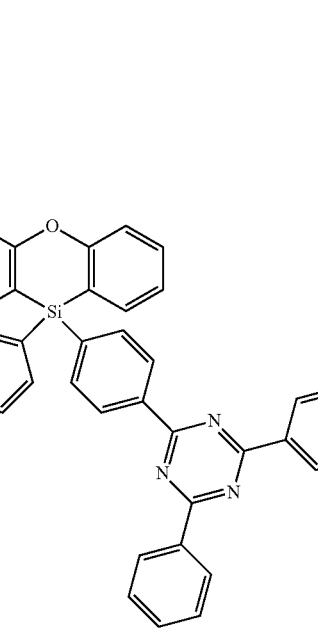
29

30
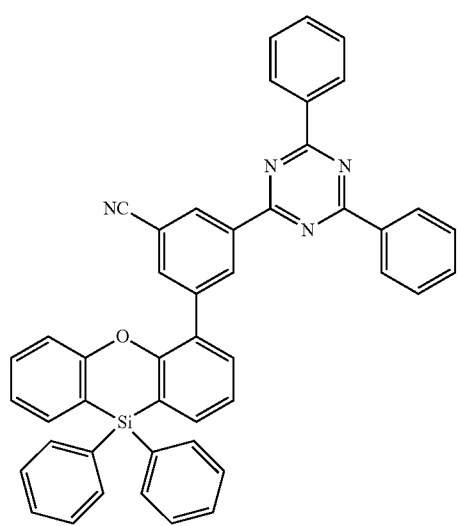
31
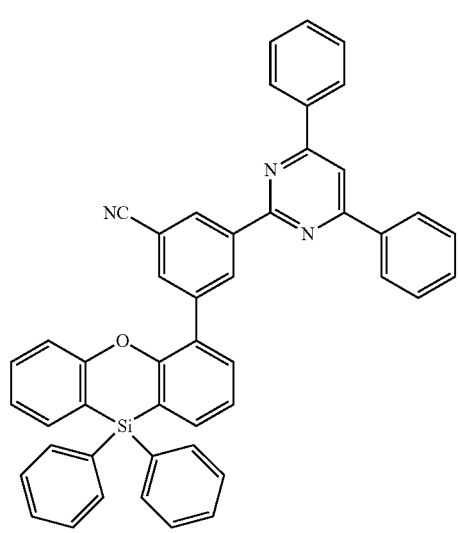
32
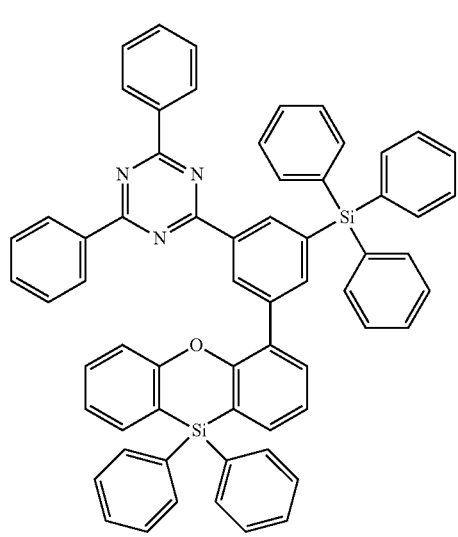
33
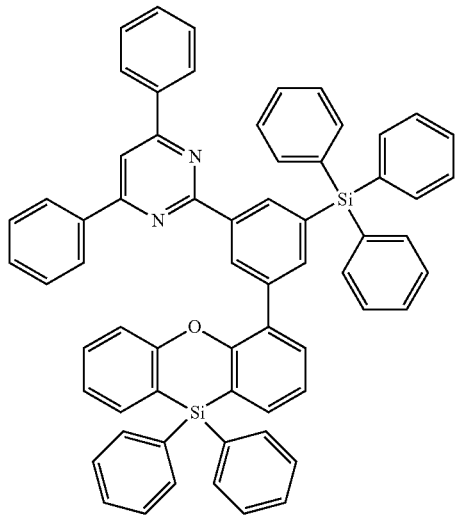
34
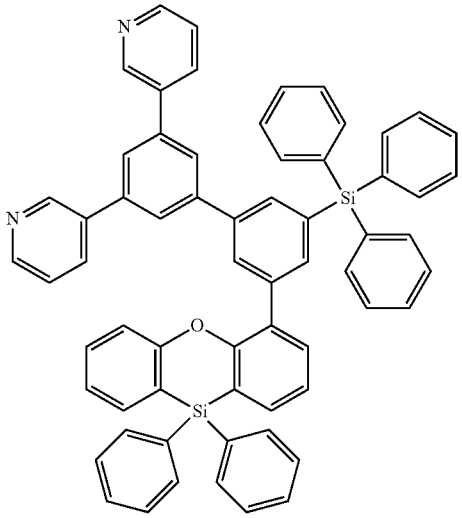
35
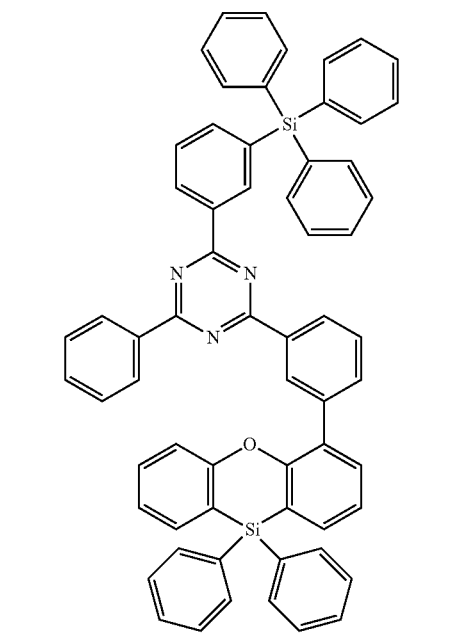

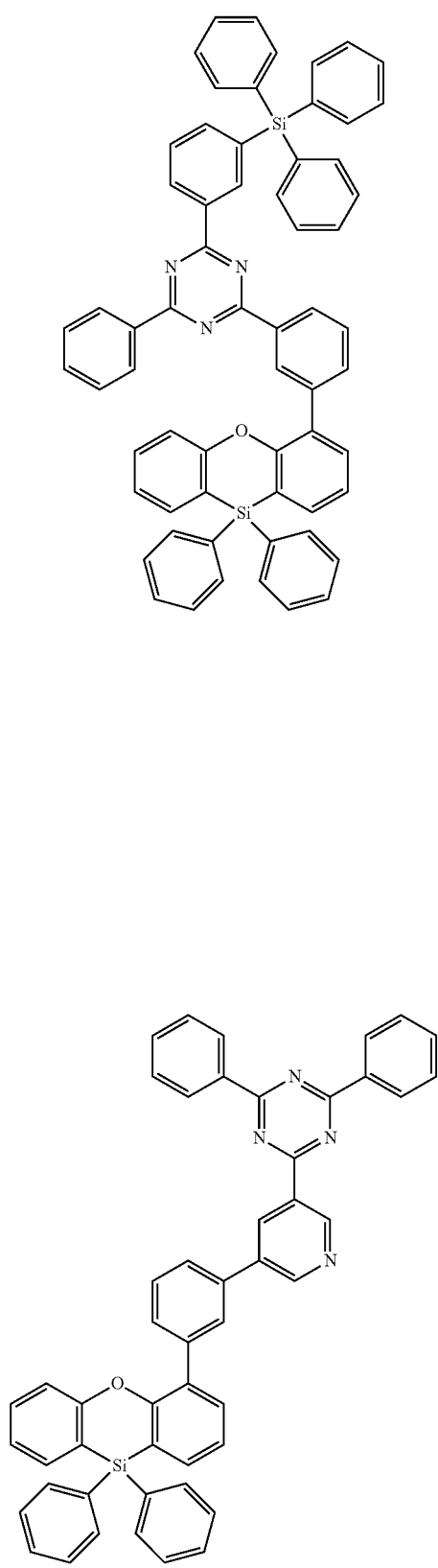
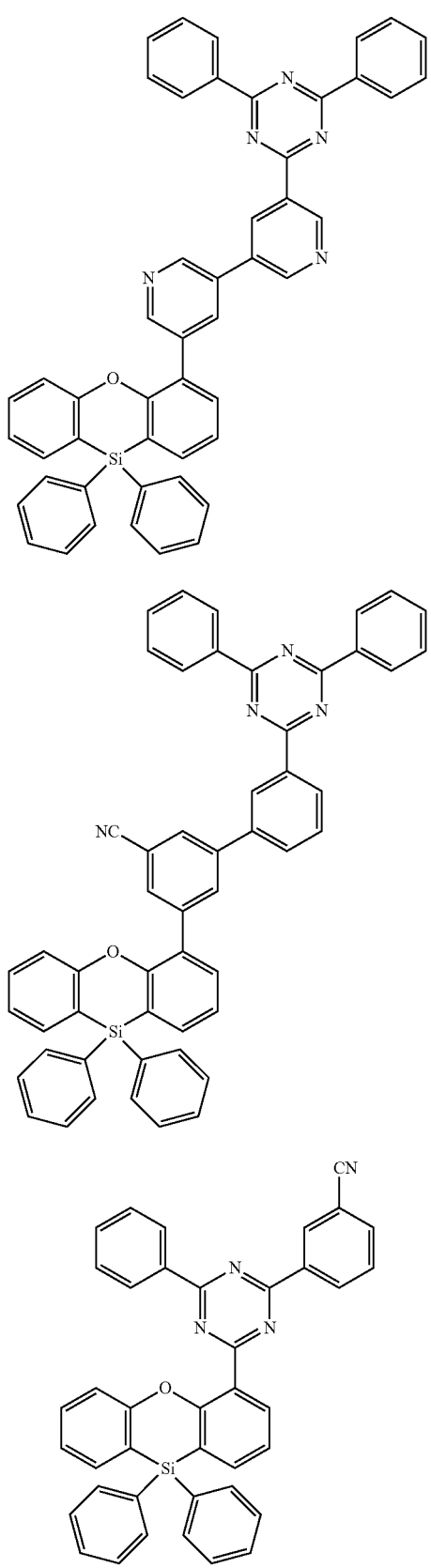

41
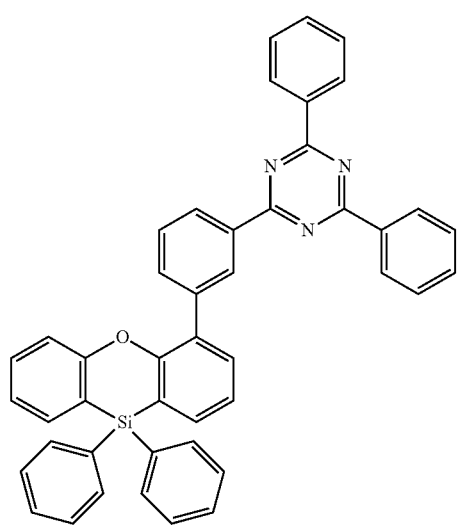
42
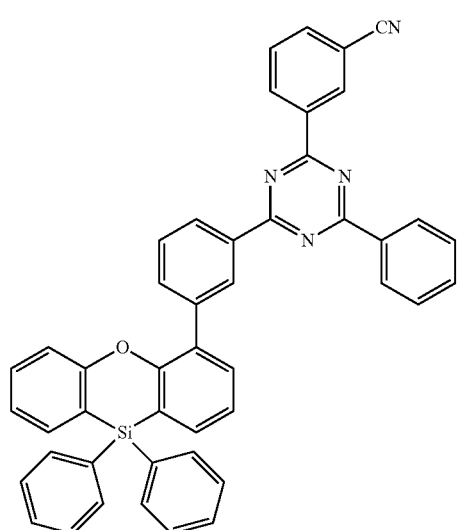
43
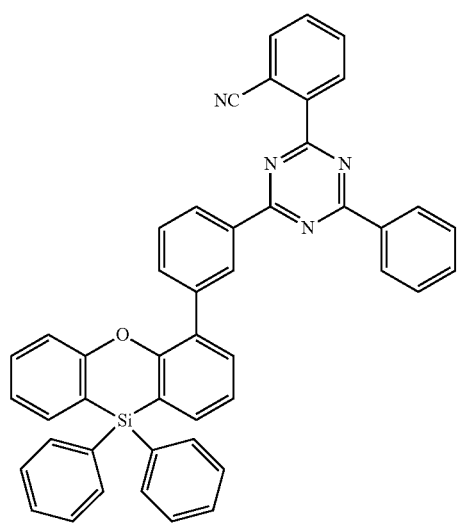
44
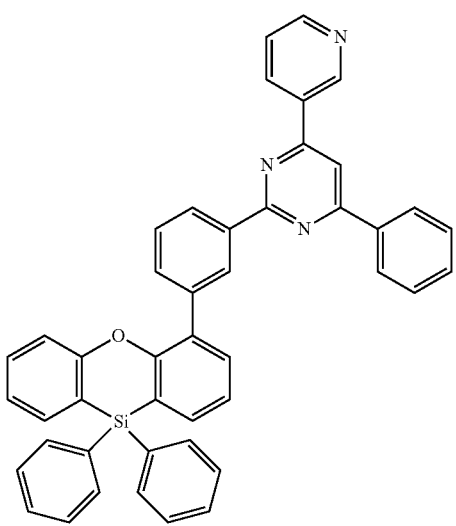
45
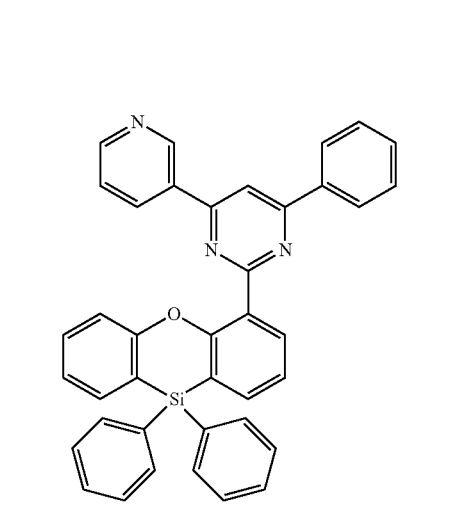
46
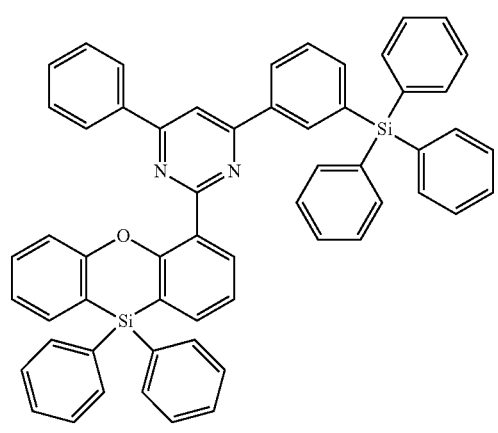 [SMILES: c1ccc(-c2nc(-c3cccc([Si](c4ccccc4)(c4ccccc4)c4ccccc4)c3)nc(-c3cccc4c3Oc3ccccc3[Si]4(c3ccccc3)c3ccccc3)n2)cc1]

47

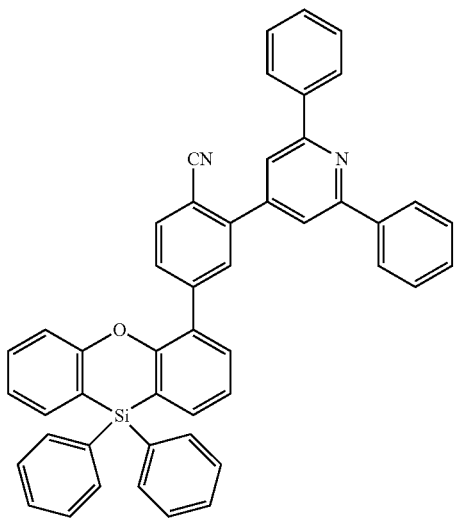

48

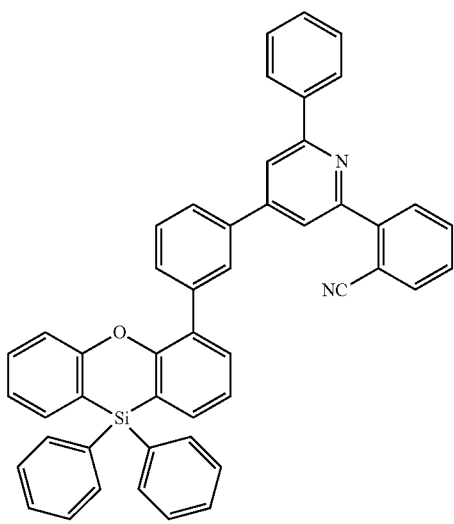

49

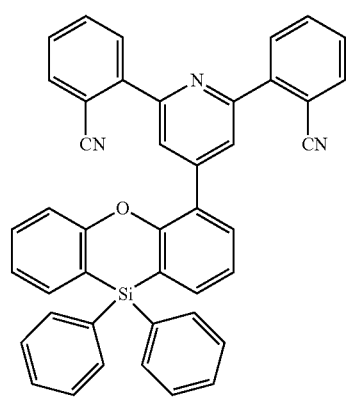

50

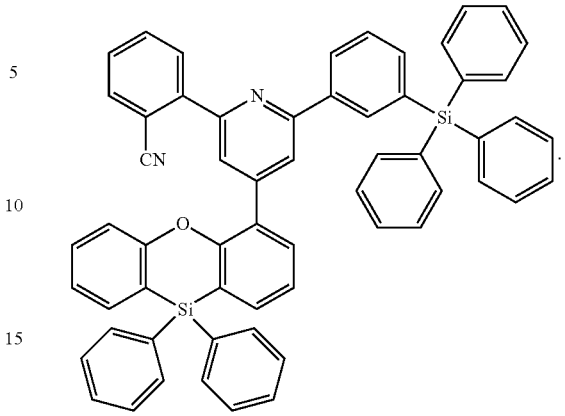

In an embodiment, the first electrode and the second electrode each independently include at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide of one or more thereof.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
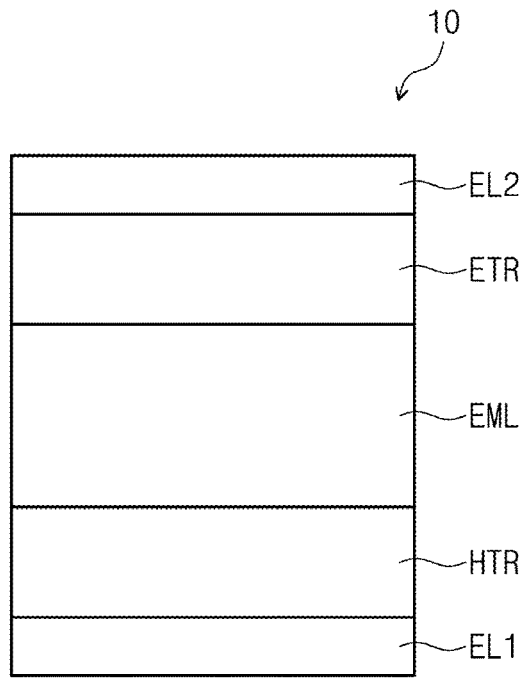
FIG. 1 is a cross-sectional view schematically illustrating an organic electroluminescence device according to an embodiment.

The inventive concept may have various modifications and may be embodied in different forms, and example embodiments will be explained in more detail with reference to the accompany drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

Like reference numerals refer to like elements throughout. In the drawings, the dimensions of structures may be exaggerated for clarity of illustration. It will be understood that, although the terms first, second, etc., may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

It will be understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. It will also be understood that when a layer, a film, a region, a plate, etc., is referred to as being "on" another part, it can be "directly on" the other part, or intervening layers may also be present.

In the description, "-*" represents a connecting site.

In the description, the term "substituted or unsubstituted" corresponds to (e.g., a functional group that is) substituted or unsubstituted with at least one substituent selected from a deuterium atom, a halogen atom, a nitro group, an amino group, a silyl group, a boron group, a phosphine oxide group, a phosphine sulfide group, an alkyl group, an alkenyl group, an aryl group, and a heterocyclic group. In addition, each of the substituents may be substituted or unsubstituted. For example, a biphenyl group may be interpreted as an aryl group or a phenyl group substituted with a phenyl group.

In the description, the terms "forming a ring via the combination with an adjacent group" may refer to forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the ring formed via the combination with an adjacent group may be combined with another ring to form a spiro structure.

In the description, the terms "an adjacent group" may refer to a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, the halogen atom may include a fluorine atom, a chlorine atom, a bromine atom and an iodine atom.

In the description, the alkyl group may be a linear, branched or cyclic group. The carbon number of the alkyl group may be from 1 to 50, from 1 to 30, from 1 to 20, from 1 to 10, or from 1 to 6. Non-limiting examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, c-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the aryl group refers to a (e.g., an optional) functional group or a substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Non-limiting examples of the aryl group may include phenyl, naphthyl, fluorenyl, anthracenyl, phenanthryl, biphenyl, terphenyl, quaterphenyl, quinqphenyl, sexiphenyl, triphenylene, pyrenyl, benzofluoranthenyl, chrysenyl, etc.

In the description, the fluorenyl group may be substituted, and two substituents may combine to each other to form a spiro structure.

In the description, the heteroaryl group may be a heteroaryl group including at least one of O, N, P, Si or S as a heteroatom. The carbon number for forming a ring of the heteroaryl group may be 2 to 30, or 2 to 20. Examples of the heteroaryl group may include monocyclic heteroaryl group or polycyclic heteroaryl group. Examples of the polycyclic heteroaryl group may have a dicyclic or tricyclic structure. Non-limiting examples of the heteroaryl group may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuranyl, phenanthroline, thiazolyl, isooxazolyl, oxadiazolyl, thiadiazolyl, benzothiazolyl, phenothiazinyl, dibenzosilole, dibenzofuranyl, etc.

In the description, explanation on the aryl group may be applied to the arylene group except that the arylene group is a divalent group.

In the description, explanation on the heteroaryl group may be applied to the heteroarylene group except that the heteroarylene group is a divalent group.

Hereinafter, an aromatic compound according to an embodiment will be explained.

An aromatic compound of an embodiment is represented by the following Formula 1:

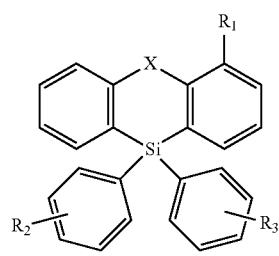

Formula 1

In Formula 1, $R_1$ to $R_3$ may be each independently represented by Formula 2 below, or a hydrogen atom, where at least one of $R_1$ to $R_3$ may be represented by Formula 2 below.

X may be O or S.

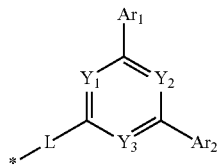

Formula 2

In Formula 1, $R_1$ may be represented by Formula 2, and $R_2$ and $R_3$ may be each independently a hydrogen atom. In addition, $R_3$ may be represented by Formula 2, and $R_1$ and $R_2$ may be each independently a hydrogen atom.

In Formula 2, $Y_1$ to $Y_3$ may be each independently CH or N.

For example, Formula 2 may be a phenyl derivative if all of $Y_1$ to $Y_3$ are CH, may be a pyridine derivative if one of $Y_1$ to $Y_3$ is N and the remainder is CH, may be a pyrimidine derivative if two of $Y_1$ to $Y_3$ are N and the remainder is CH, or may be a triazine derivative if all of $Y_1$ to $Y_3$ are N.

L may be a direct linkage, a substituted or unsubstituted arylene group having 6 to 12 carbon atoms for forming a ring, or a substituted or unsubstituted heteroarylene group having 5 to 11 carbon atoms for forming a ring. For example, L may be a substituted or unsubstituted phenylene group. For example, L may be an unsubstituted phenylene group.

$Ar_1$ and $Ar_2$ may be each independently represented by the following Formula 3 or Formula 4, or a hydrogen atom, where at least one of $Ar_1$ and $Ar_2$ may be represented by the following Formula 3 or Formula 4:

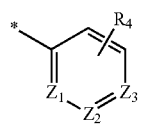

Formula 3

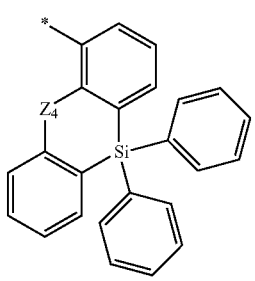

Formula 4

In Formula 3 and Formula 4, $Z_1$ to $Z_3$ may be each independently $CR_5$ or N. For example, all of $Z_1$ to $Z_3$ may be $CR_5$, or at least one of $Z_1$ to $Z_3$ may be N.

$Z_4$ may be O or S.

$R_4$ may be a hydrogen atom, a cyano group, or a substituted or unsubstituted silyl group.

$R_5$ may be a hydrogen atom, or a substituted or unsubstituted aryl group.

For example, $R_4$ may be an unsubstituted triphenylsilyl group, and $R_5$ may be an unsubstituted phenyl group.

In Formula 1, $R_1$ may be a substituent represented by Formula 2, and $R_2$ and $R_3$ be each independently a hydrogen atom. In addition, in Formula 1, $R_3$ may be a substituent represented by Formula 2, and $R_1$ and $R_2$ may be each independently a hydrogen atom.

In one embodiment, the aromatic compound represented by Formula 1 may be represented by the following Formula 1-1 or Formula 1-2:

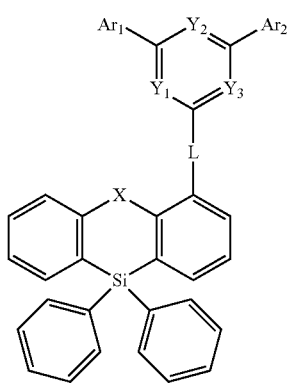

Formula 1-1

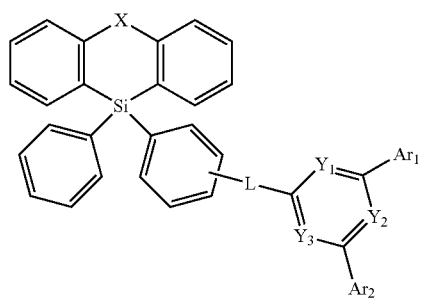

Formula 1-2

In Formula 1-1 and Formula 1-2, descriptions of X, L, $Y_1$ to $Y_3$, $Ar_1$, and $Ar_2$ are the same as respectively described in association with Formula 1 and Formula 2 above.

Formula 1-1 represents an aromatic compound represented by Formula 1 where $R_1$ is represented by Formula 2, and Formula 1-2 represents an aromatic compound represented by Formula 1 where $R_3$ is represented by Formula 2. In Formula 1-1 and Formula 1-2, $Y_1$ to $Y_3$ are each independently CH or N, and $Ar_1$ and $Ar_2$ are each independently represented by Formula 3 or Formula 4, or a hydrogen atom, where at least one of $Ar_1$ and $Ar_2$ may be represented by Formula 3 or Formula 4.

Meanwhile, a moiety (e.g., the at least one of $R_1$ to $R_3$) represented by Formula 2 may be represented by one of the following Formula 2-1 to Formula 2-4:

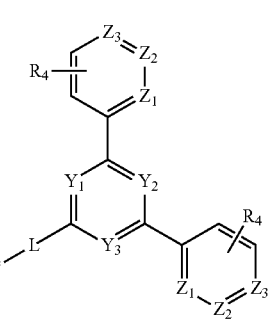

Formula 2-1

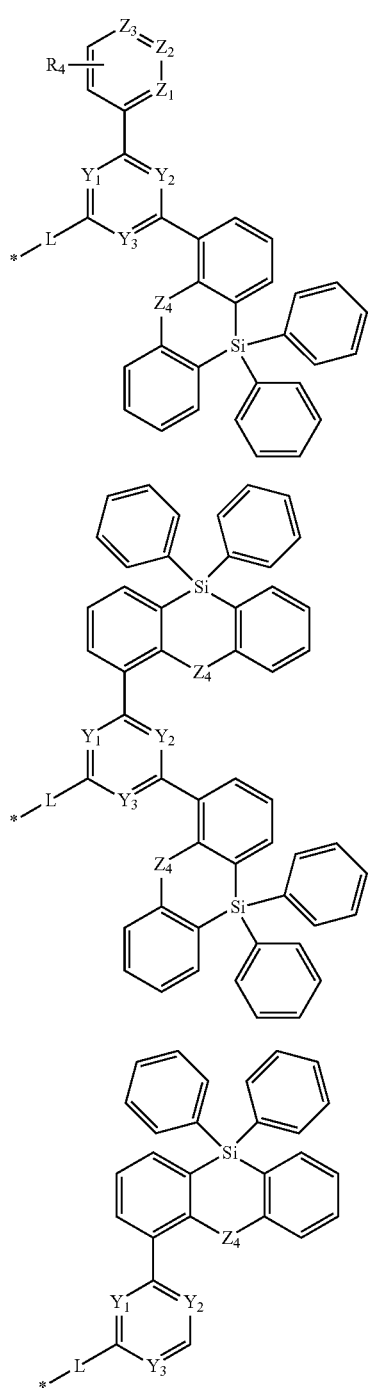

Formula 2-2

Formula 2-3

Formula 2-4

Formula 2-1 represents a moiety of Formula 2 where Ar₁ and Ar₂ are each independently represented by Formula 3, Formula 2-2 represents a moiety of Formula 2 where Ar₁ is represented by Formula 3 and Ar₂ is represented by Formula 4, Formula 2-3 represents a moiety of Formula 2 where Ar₁ and Ar₂ are each independently represented by Formula 4, and Formula 2-4 represents a moiety of Formula 2 where Ar₁ is represented by Formula 4 and Ar₂ is a hydrogen atom.

In Formula 2-1 to Formula 2-4, $Z_1$ to $Z_3$ may be each independently $CR_5$ or N; $Z_4$ may be O or S; $R_4$ may be a hydrogen atom, a cyano group, or a substituted or unsubstituted silyl group. For example, $R_4$ may be a triphenylsilyl group. $R_5$ may be a hydrogen atom, or a substituted or unsubstituted aryl group. For example, $R_5$ may be a substituted or unsubstituted phenyl group. For example, $R_5$ may be an unsubstituted phenyl group.

In Formula 2, L may be a direct linkage, a substituted or unsubstituted phenylene group, a substituted or unsubstituted divalent biphenyl group, or a substituted or unsubstituted heteroarylene group containing N as a heteroatom.

For example, L may be represented by any one of the following L-1 to L-7:

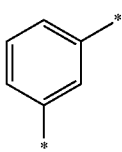

L-1

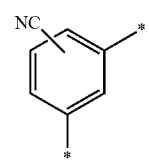

L-2

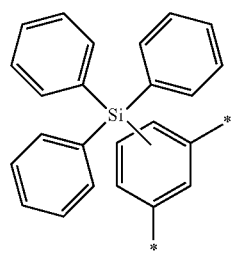

L-3

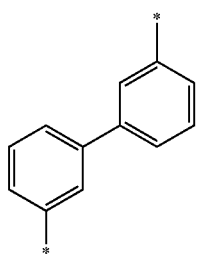

L-4

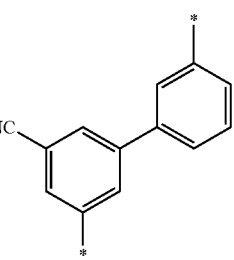

L-5

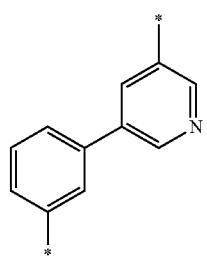

L-6

Meanwhile, a moiety (e.g., the at least one of Ar$_1$ or Ar$_2$) represented by Formula 3 may be represented by one of the following Formula 3-1 to Formula 3-7:

A moiety (e.g., the at least one of Ar$_1$ or Ar$_2$) represented by Formula 4 may be represented by the following Formula 4-1 or 4-2:

In one embodiment, the aromatic compound represented by Formula 1 may be one selected from the compounds represented in the following Compound Group 1, but an embodiment of the inventive concept is not limited thereto:

Compound Group 1

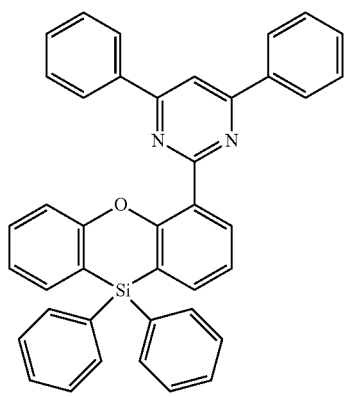
3
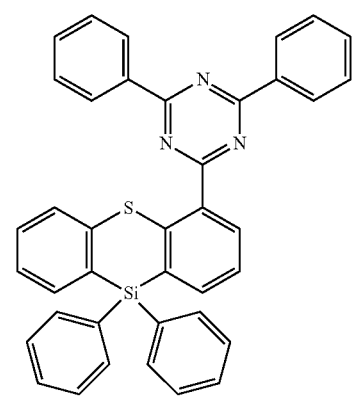
4
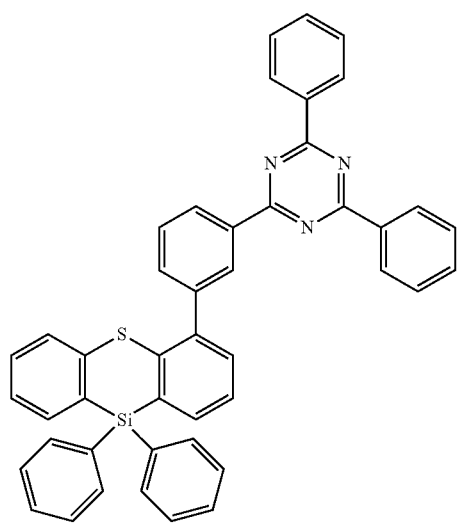
5
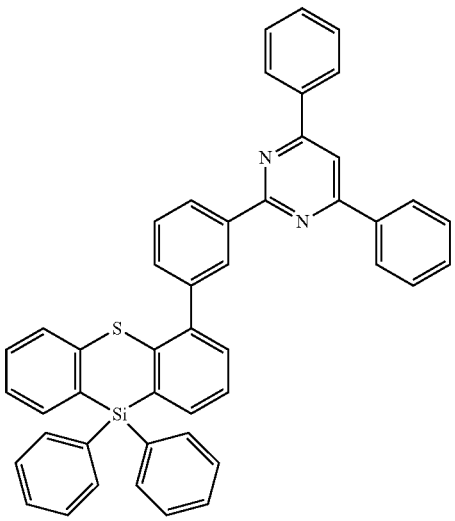
6
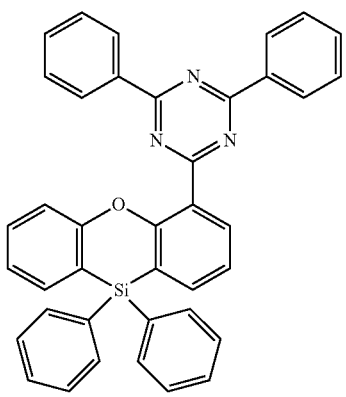
7
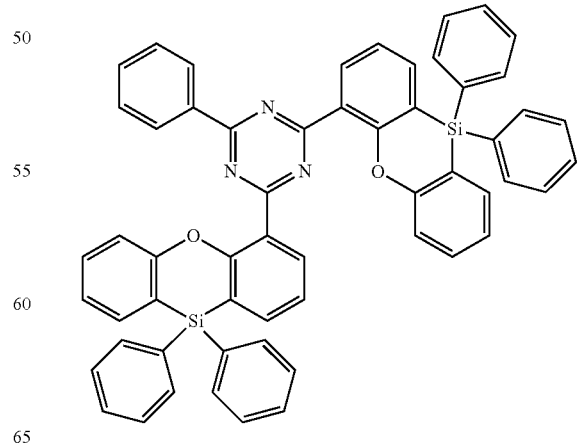
8

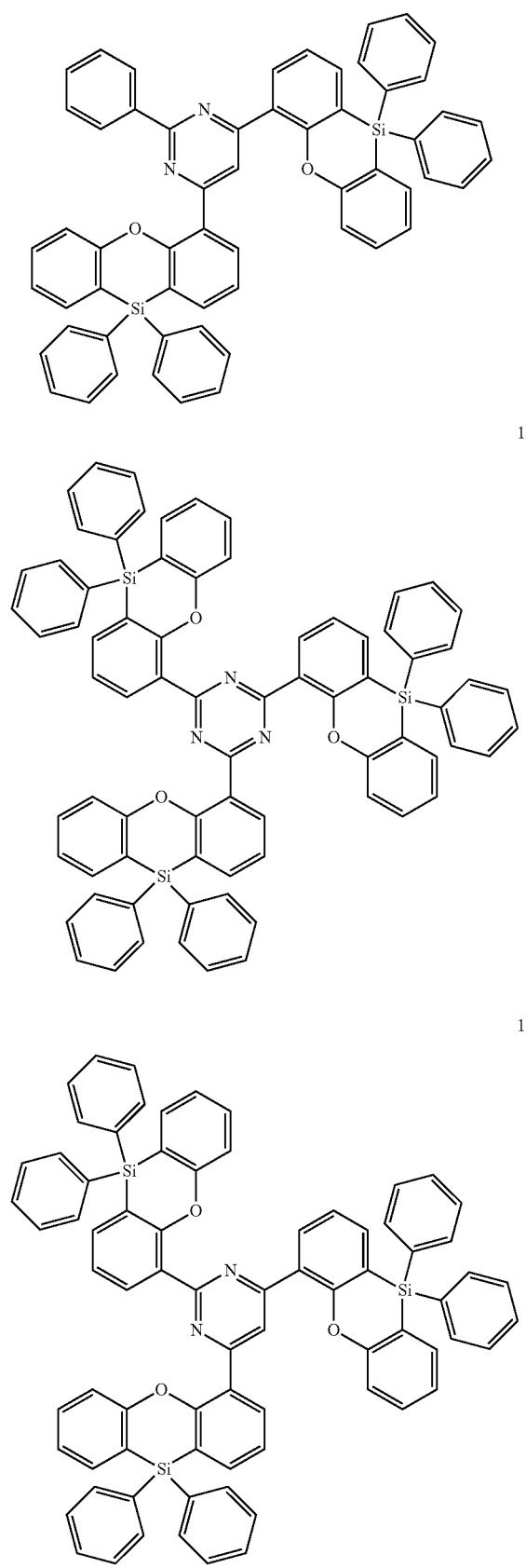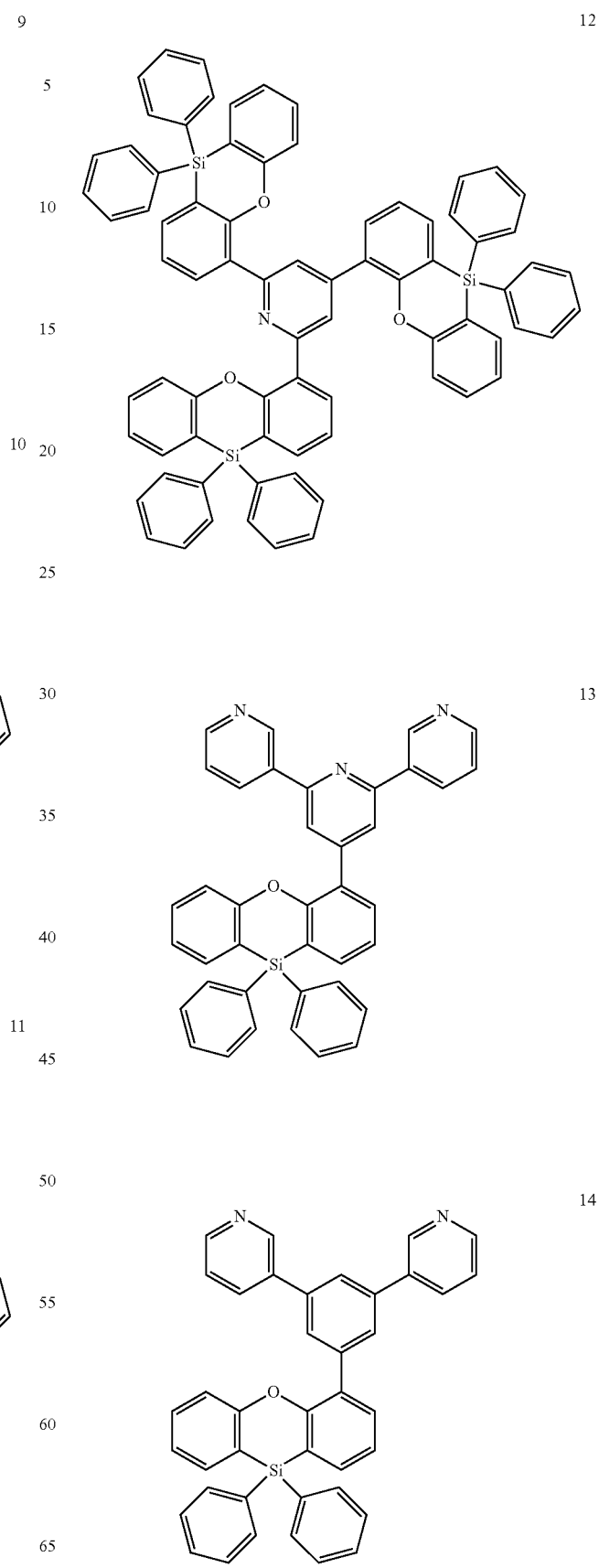

-continued
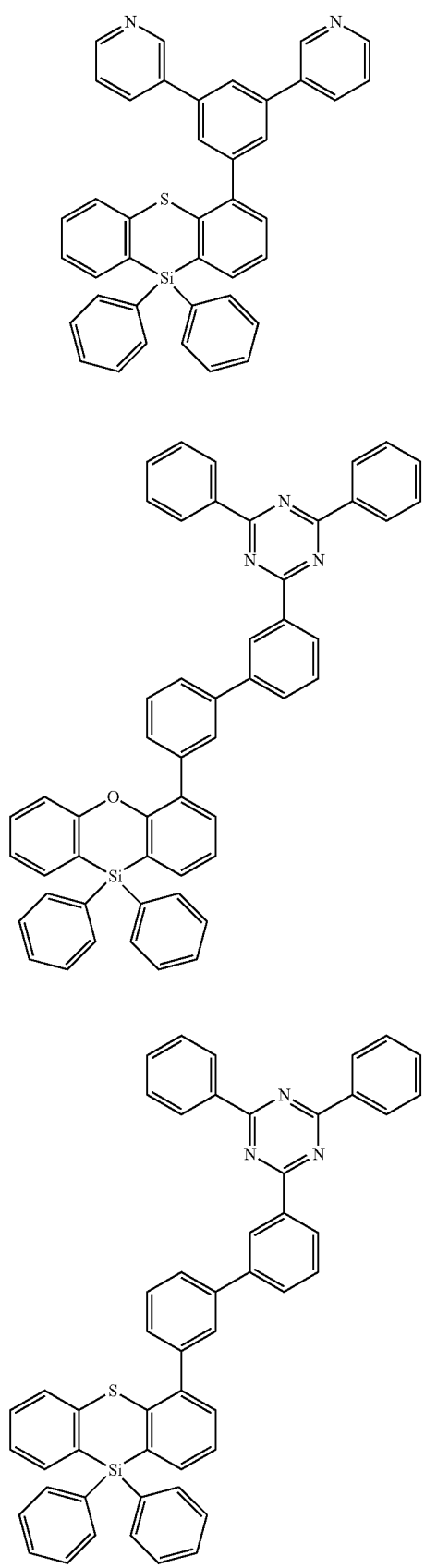
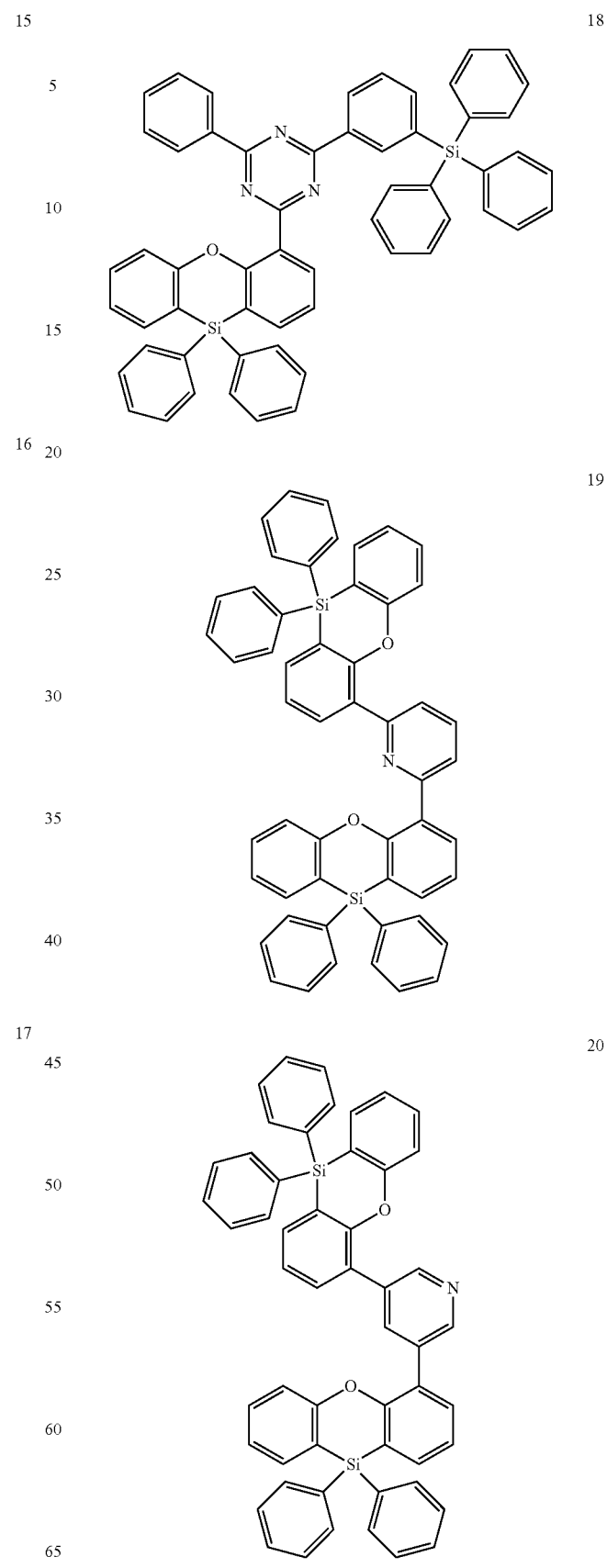

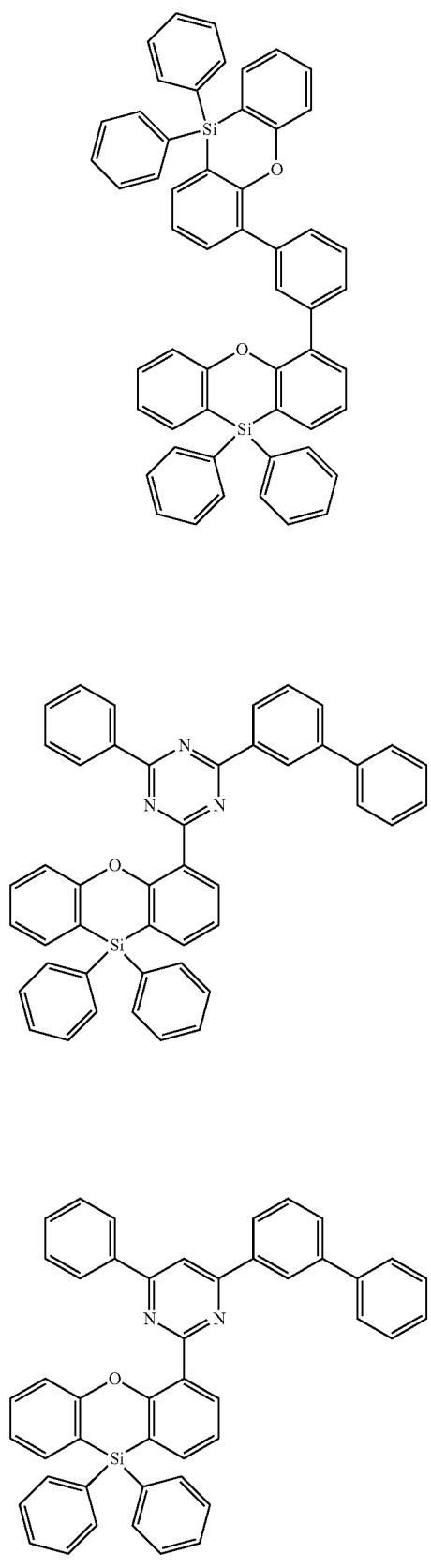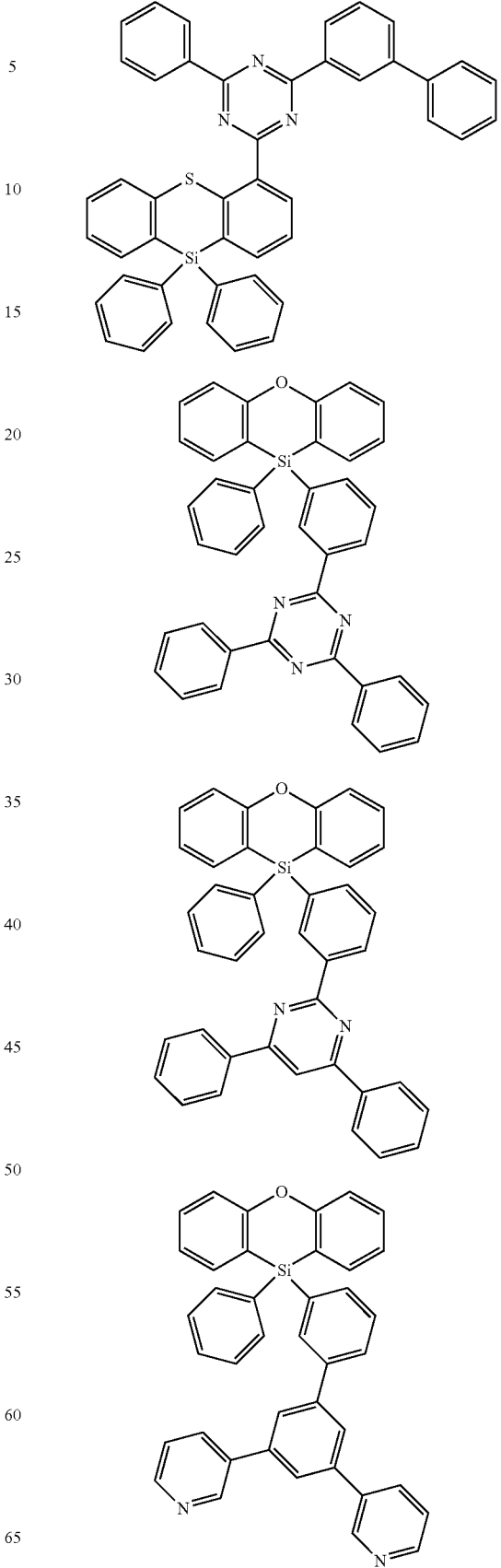

28
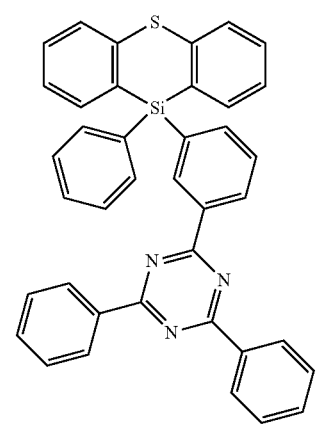
29
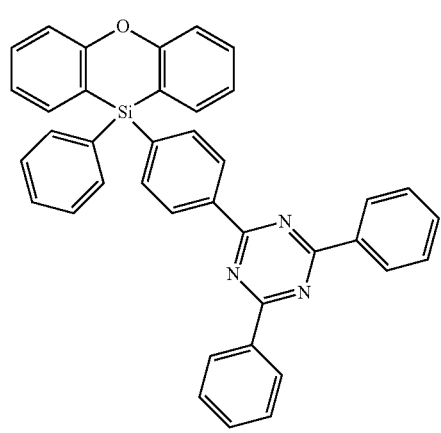 [SMILES: c1ccc(-c2nc(-c3ccccc3)nc(-c3ccc([Si]4(c5ccccc5)c5ccccc5Oc5ccccc54)cc3)n2)cc1]
30
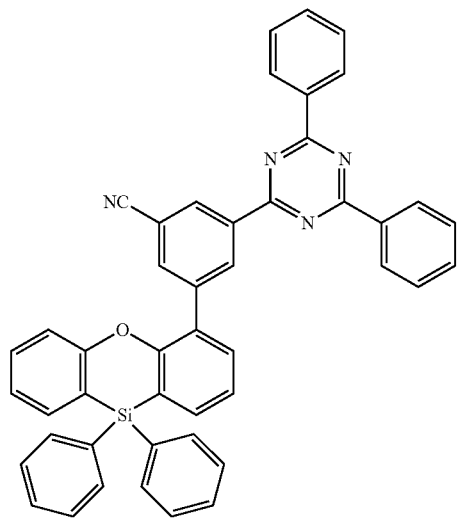
31
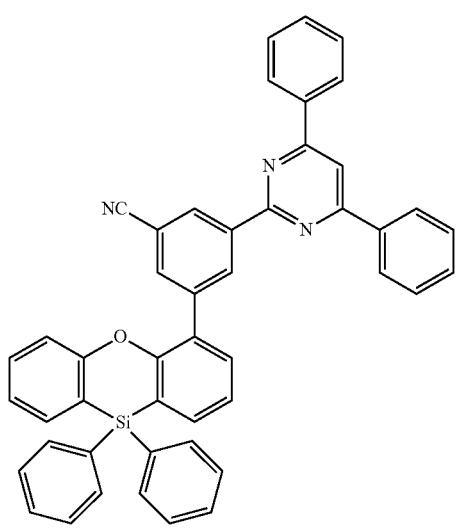
32
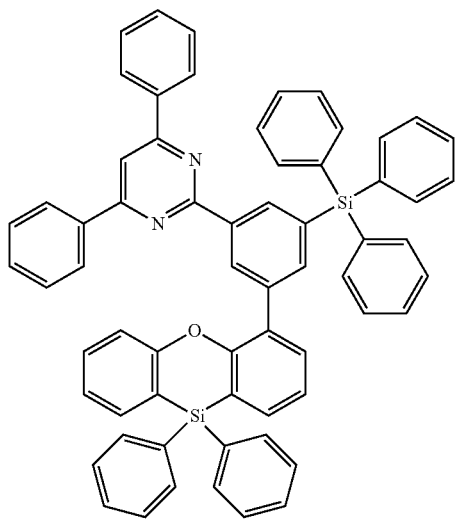
33

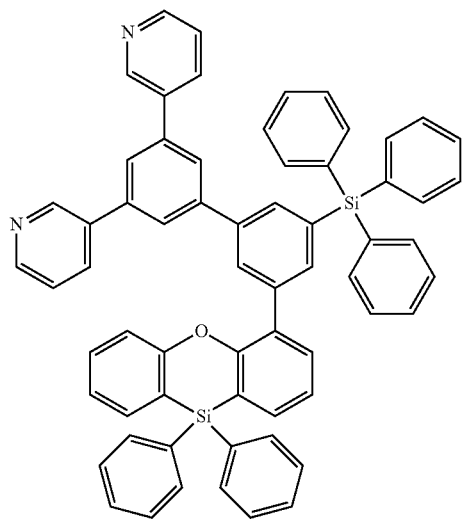
34
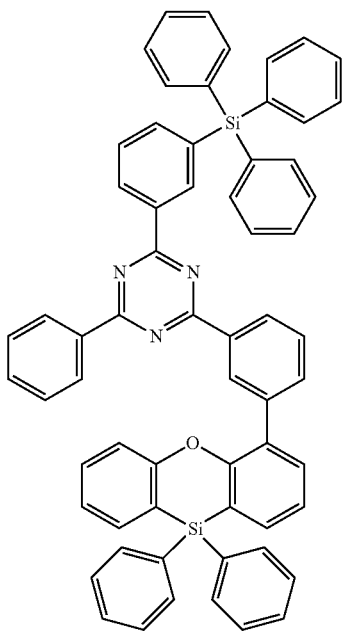
36
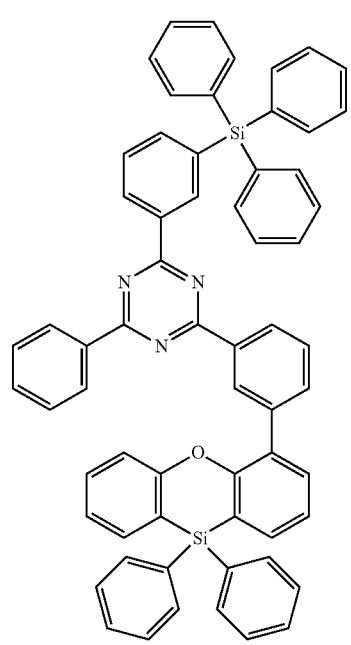
35
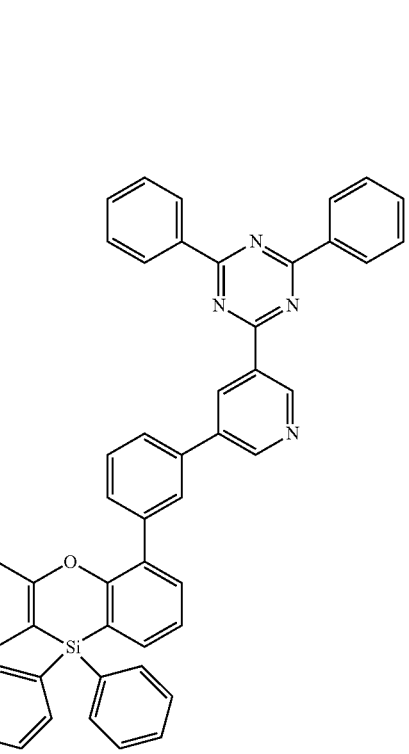
37

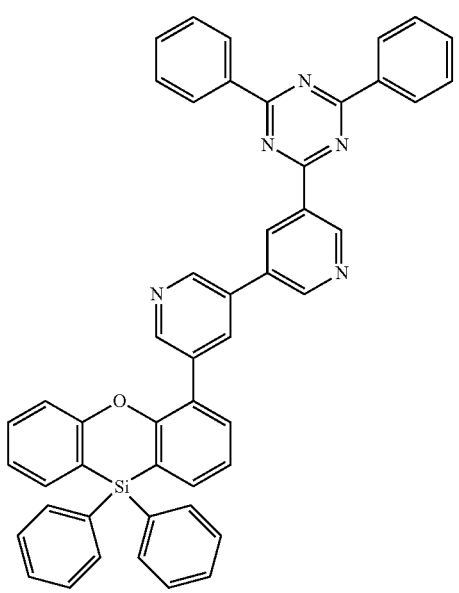
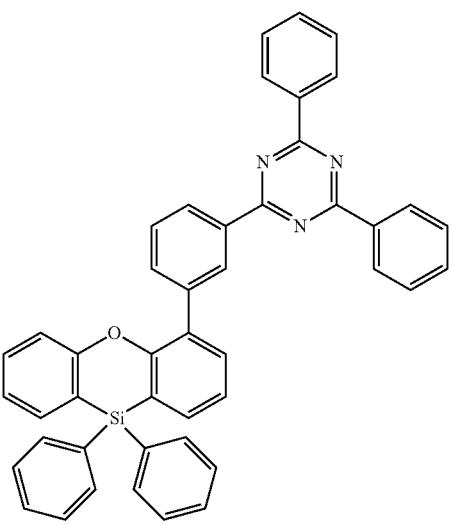
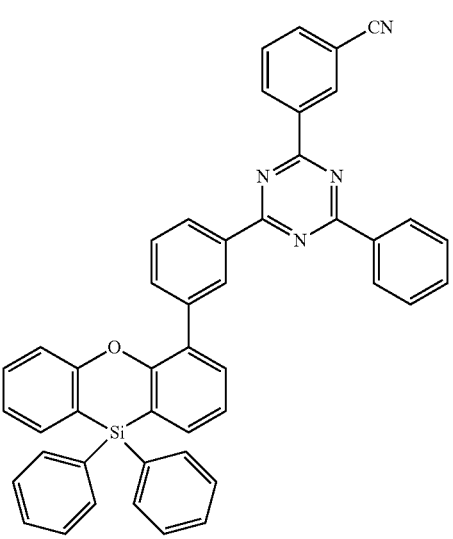
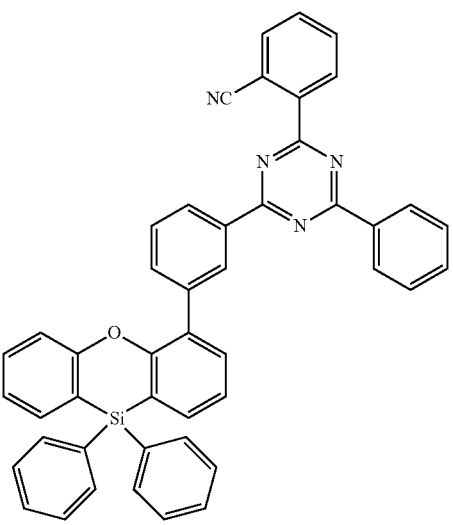

44
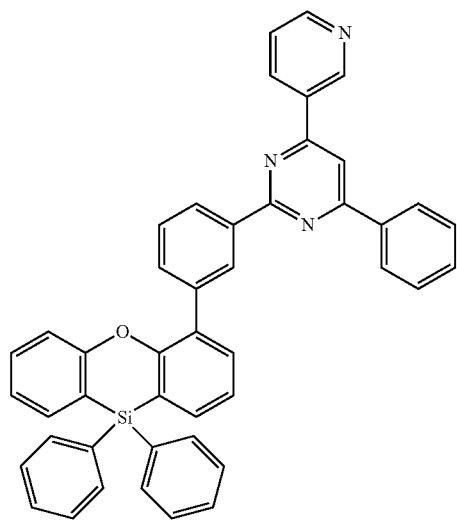
45
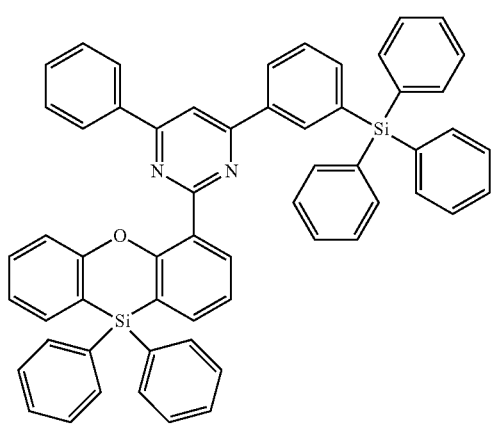
46
47
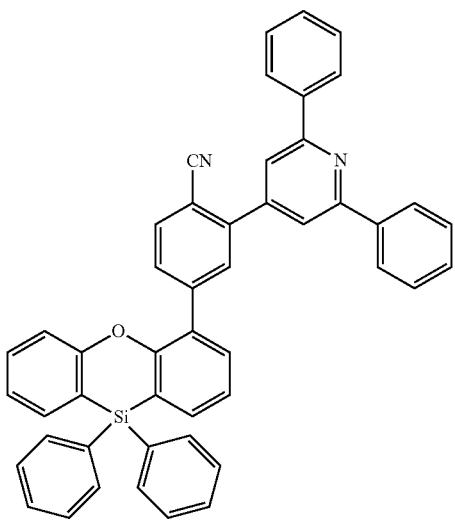
48
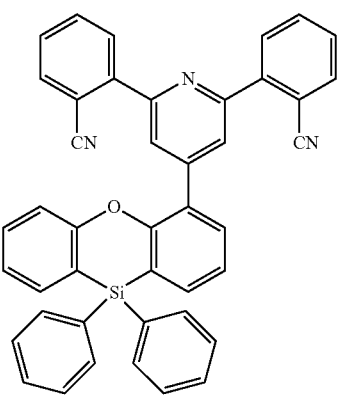
49

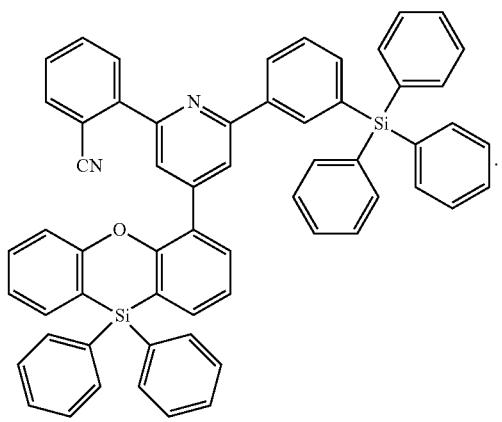

The above-described aromatic compound of an embodiment may be utilized as a material for an organic electroluminescence device to improve the emission efficiency of the organic electroluminescence device. The aromatic compound of an embodiment may have a high lowest triplet excitation energy (T1). Since the aromatic compound of an embodiment has a high lowest triplet excitation energy, the diffusion of triplet excitons generated in an emission layer to a hole transport region may be restrained, and the emission efficiency of an organic electroluminescence device may be improved.

The aromatic compound of an embodiment may be utilized as a material of an emission layer of an organic electroluminescence device to improve the emission efficiency and external quantum efficiency of the organic electroluminescence device.

Hereinafter, an organic electroluminescence device according to an embodiment of the inventive concept will be explained. Hereinafter, description of the above-described aromatic compound according to an embodiment of the inventive concept will not be repeated, and unexplained parts will follow the above explanation on the aromatic compound according to an embodiment of the inventive concept.

Figure 2:
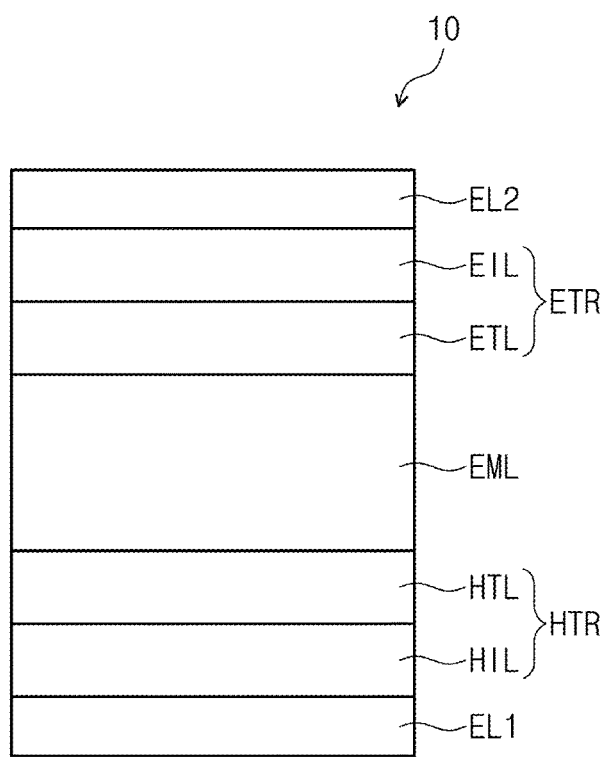
FIG. 2 is a cross-sectional view schematically illustrating an organic electroluminescence device according to an embodiment.

FIG. 1 and FIG. 2 are cross-sectional views schematically illustrating an organic electroluminescence device according to an embodiment of the inventive concept. Referring to FIGS. 1 and 2, an organic electroluminescence device 10 according to an embodiment may include a first electrode EL1, a hole transport region HTR, an emission layer EML, an electron transport region ETR, and a second electrode EL2 laminated one by one. Meanwhile, when compared to FIG. 1, FIG. 2 illustrates a cross-sectional view of an organic electroluminescence device of an embodiment, in which a hole transport region HTR includes a hole injection layer HIL and a hole transport layer HTL, and an electron transport region ETR includes an electron injection layer EIL and an electron transport layer ETL.

The first electrode EL1 and the second electrode EL2 are oppositely disposed to each other, and a plurality of organic layers may be disposed between the first electrode EL1 and the second electrode EL2. The plurality of the organic layers may include the hole transport region HTR, the emission layer EML, and the electron transport region ETR.

The organic electroluminescence device 10 of an embodiment may include the aromatic compound of an embodiment in the emission layer EML.

In the explanation on an organic electroluminescence device 10 below, a case of including an aromatic compound of an embodiment in an emission layer EML will be explained in more detail. However, an embodiment of the inventive concept is not limited thereto. The aromatic compound of an embodiment may be included in at least one of the plurality of organic layers disposed between the first electrode EL1 and the second electrode EL2. For example, the aromatic compound according to an embodiment of the inventive concept may be included in the electron transport region ETR.

The first electrode EL1 has conductivity. The first electrode EL1 may be formed utilizing a metal alloy or a conductive compound. The first electrode EL1 may be an anode.

The first electrode EL1 may be a transmissive electrode, a transflective electrode, or a reflective electrode. If the first electrode EL1 is the transmissive electrode, the first electrode EL1 may be formed utilizing a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may include a plurality of layers including a reflective layer, or a transflective layer formed utilizing the above materials, and a transmissive layer formed utilizing ITO, IZO, ZnO, or ITZO. For example, the first electrode EL1 may include a plurality of layers of ITO/Ag/ITO.

The hole transport region HTR is provided on the first electrode EL1. The hole transport region HTR may include at least one of a hole injection layer HIL, a hole transport layer HTL, a hole buffer layer, or an electron blocking layer. The thickness of the hole transport region HTR may be, for example, from about 1,000 Å to about 1,500 Å.

The hole transport region HTR may be a single layer formed utilizing a single material, a single layer formed utilizing a plurality of different materials, or may have a multilayer structure including a plurality of layers formed utilizing a plurality of different materials.

For example, the hole transport region HTR may have the structure of a single layer such as a hole injection layer HIL, or a hole transport layer HTL, or may have a structure of a single layer formed utilizing a hole injection material and a hole transport material. Alternatively, the hole transport region HTR may have a structure of a single layer formed utilizing a plurality of different materials, or a structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, stacked from the first electrode in the stated order, without being limited thereto.

The hole transport region HTR may be formed utilizing various suitable methods such as a vacuum deposition method, a spin coating method, a cast method, a Langmuir-Blodgett (LB) method, an inkjet printing method, a laser printing method, and a laser induced thermal imaging (LITI) method.

If the hole transport region HTR includes the hole transport layer HTL, the hole transport region HTR may include any suitable hole transport material available in the art. For example, the hole transport region HTR may include 1,1-bis[(di-4-trileamino)phenyl]cyclohexane (TAPC), carbazole derivatives (such as N-phenyl carbazole and polyvinyl carbazole), N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphtyl)-N,N'-diphenylbenzidine (NPB), etc. However, an embodiment of the inventive concept is not limited thereto.

If the hole transport region HTR includes the hole injection layer HIL, the hole transport region HTR may include any suitable hole injection material available in the art. For example, the hole transport region HTR may include triphenylamine-containing polyetherketone (TPAPEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound (such as copper phthalocyanine), 4,4',4"-tris(3-methylphenylphenylamino)triphenylamine (m-MTDATA), N,N'-di(1-naphthyl)-N,N'-diphenylbenzidine (NPB), 4,4',4"-tris(N,N-diphenylamino)triphenylamine (TDATA), 4,4',4"-tris(N,N-2-naphthyphenylamino)-triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), or polyaniline/poly(4-styrenesulfonate) (PANI/PSS). However, an embodiment of the inventive concept is not limited thereto.

The thickness of the hole transport region HTR may be from about 100 Å to about 10,000 Å, for example, from about 100 Å to about 1,000 Å. If the hole transport region HTR includes both the hole injection layer HIL and the hole transport layer HTL, the thickness of the hole injection layer HIL may be from about 100 Å to about 10,000 Å, for example, from about 100 Å to about 1,000 Å, and the thickness of the hole transport layer HTL may be from about 30 Å to about 1,000 Å. If the thicknesses of the hole transport region HTR, the hole injection layer HIL, and the hole transport layer HTL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may be, for example, a p-dopant. Non-limiting examples of the p-dopant may be one of a quinone derivative, a metal oxide, or a cyano group-containing compound. For example, non-limiting examples of the p-dopant may include quinone derivatives (such as tetracyanoquinodimethane (TCNQ) and 2,3,5,6-tetrafluoro-tetracyanoquinodimethane (F4-TCNQ)), and a metal oxide (such as tungsten oxide and molybdenum oxide).

As described above, the hole transport region HTR may further include at least one of a hole buffer layer or an electron blocking layer in addition to the hole transport layer HTL and the hole injection layer HTL. The hole buffer layer may compensate a resonance distance according to the wavelength of light emitted from the emission layer EML and increase light emission efficiency. Materials included in the hole transport region HTR may be utilized as materials included in the hole buffer layer. The electron blocking layer EBL is a layer reducing or preventing electron injection from the electron transport region ETR to the hole transport region HTR.

For example, the hole transport region HTR may include a hole injection layer HIL, a hole transport layer HTL and an electron blocking layer EBL in an embodiment.

The emission layer EML is provided on the hole transport region HTR. The thickness of the emission layer EML may be from about 100 Å to about 600 Å. The emission layer EML may be a single layer formed utilizing a single material, a single layer formed utilizing a plurality of different materials, or may have a multilayer structure having a plurality of layers formed utilizing a plurality of different materials.

The emission layer EML may include the aromatic compound according to an embodiment of the inventive concept. For example, the emission layer EML may include the aromatic compound represented by Formula 1 and may emit phosphorescence or fluorescence.

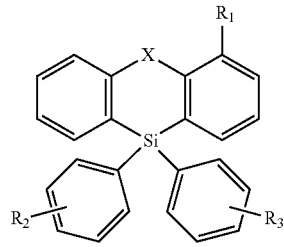

Formula 1

In Formula 1, $R_1$ to $R_3$ may be each independently represented by Formula 2 below, or a hydrogen atom, where at least one of $R_1$ to $R_3$ may be represented by Formula 2 below.

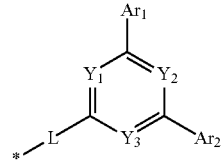

Formula 2

In Formula 2, $Y_1$ to $Y_3$ may be each independently CH or N.

L may be a direct linkage, a substituted or unsubstituted arylene group having 6 to 12 carbon atoms for forming a ring, or a substituted or unsubstituted heteroarylene group having 5 to 11 carbon atoms for forming a ring.

$Ar_1$ and $Ar_2$ may be each independently represented by the following Formula 3 or Formula 4, or a hydrogen atom, where at least one of $Ar_1$ and $Ar_2$ may be represented by the following Formula 3 or Formula 4:

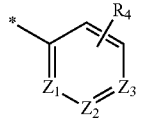

Formula 3

Formula 4

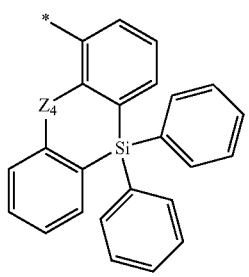

In Formula 3 and Formula 4, $Z_1$ to $Z_3$ may be each independently $CR_5$ or N.

$Z_4$ may be O or S.

$R_4$ may be a hydrogen atom, a cyano group, or a substituted or unsubstituted silyl group.

$R_5$ may be a hydrogen atom, or a substituted or unsubstituted aryl group.

In Formula 1 to Formula 4, $R_1$ to $R_5$, X, $Y_1$ to $Y_3$, L, $Ar_1$, $Ar_2$, and $Z_1$ to $Z_4$ are the same as respectively described above in association with the aromatic compound of an embodiment.

An aromatic compound represented by Formula 1 has a high lowest triplet excitation energy (T1). For example, the aromatic compound represented by Formula 1 may have the lowest triplet excitation energy (T1) of about 3.2 eV or more.

The emission layer EML may include at least one of the compounds represented in the following Compound Group 1:

Compound Group 1

1

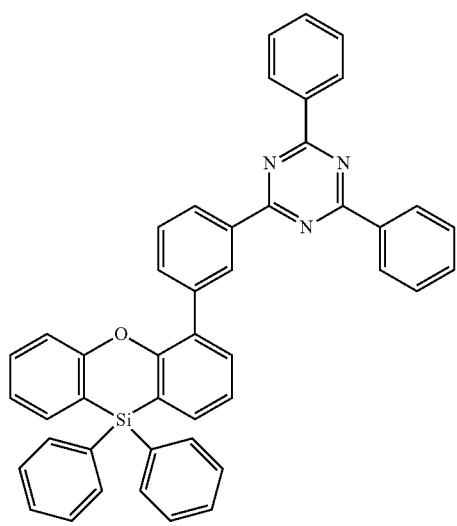

2

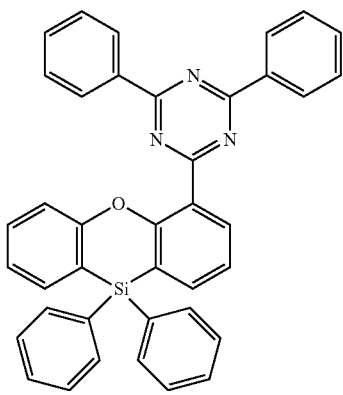

3

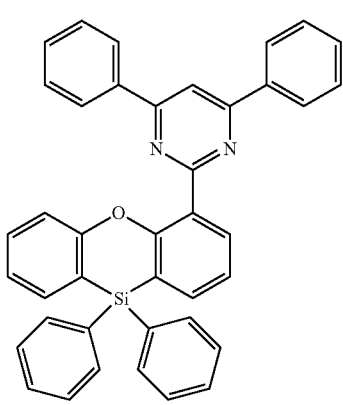

4

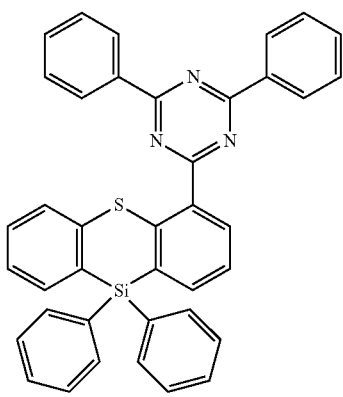

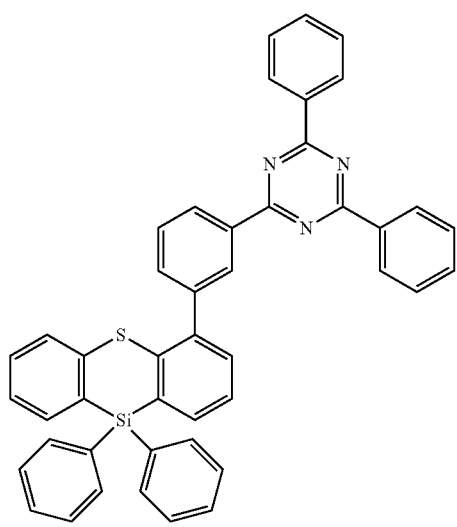
5
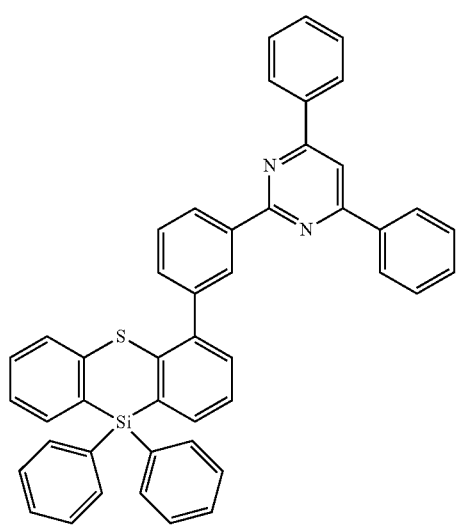
6
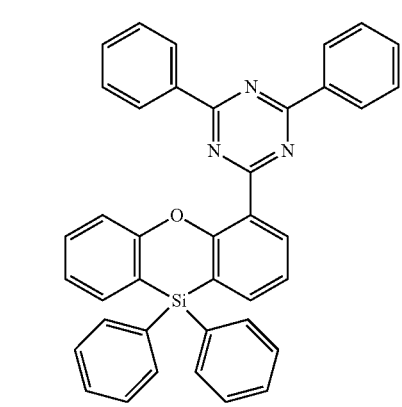
7
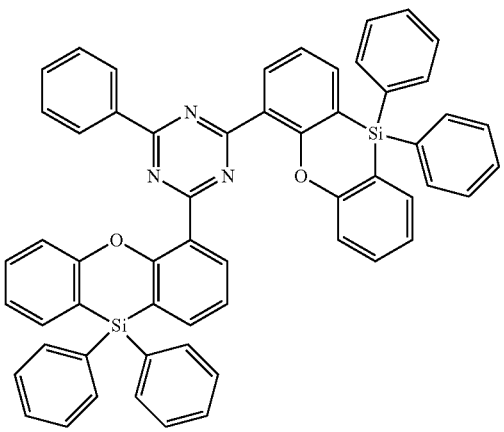
8
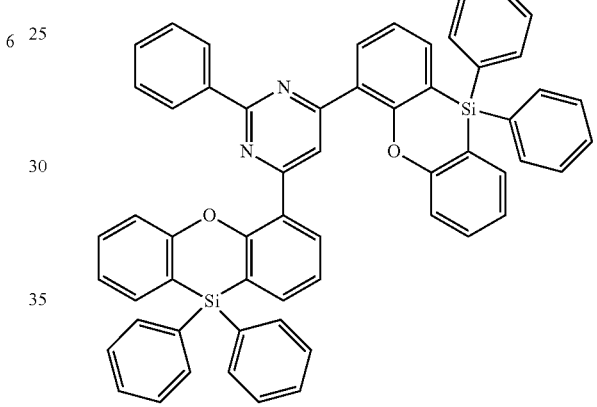
9
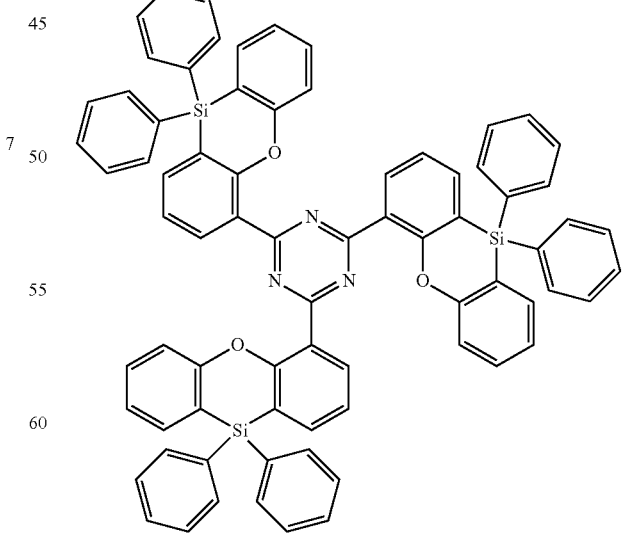
10

11
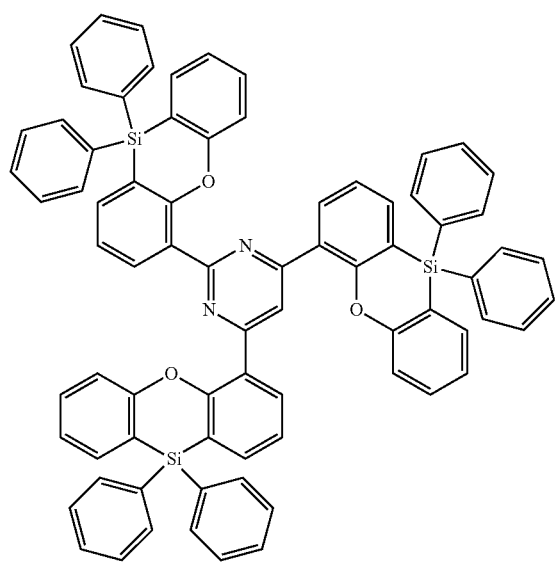
12
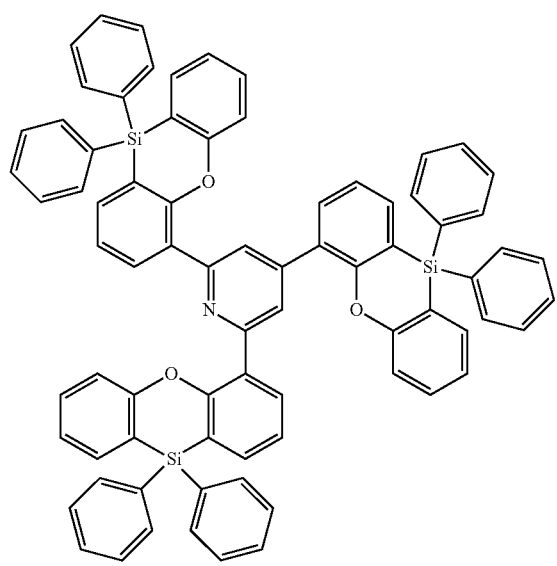
13
14
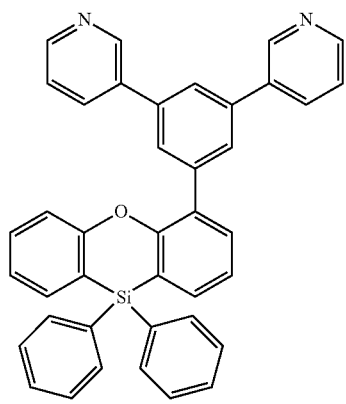
15
16
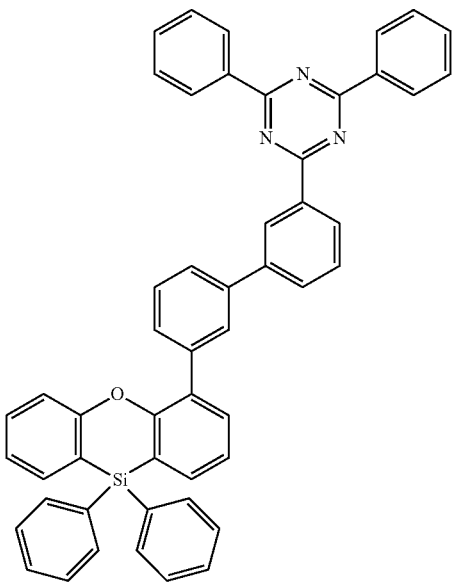

17
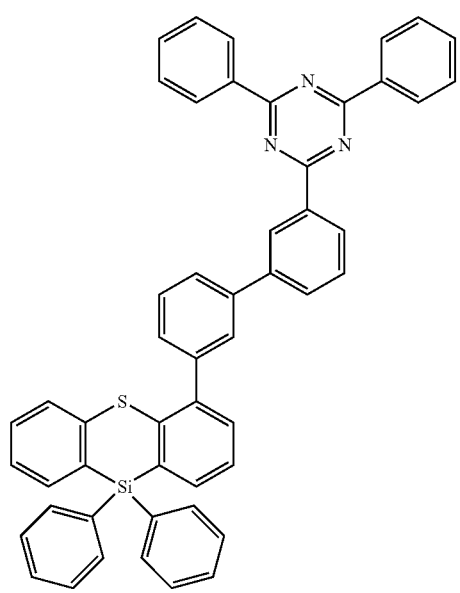
18
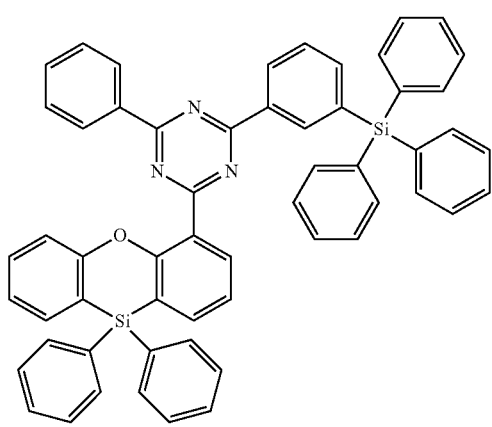
19
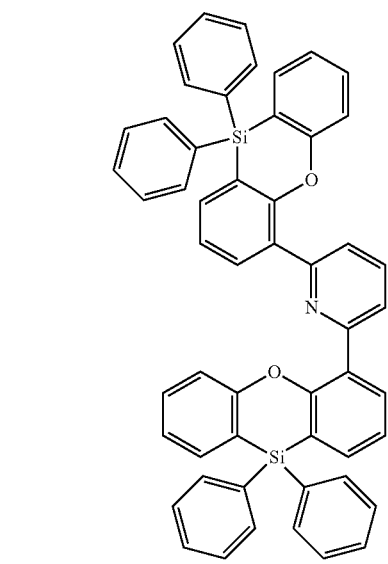
20
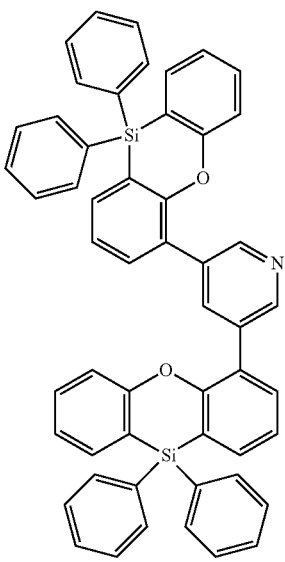
21
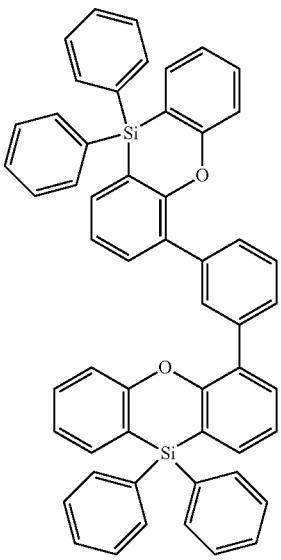
22
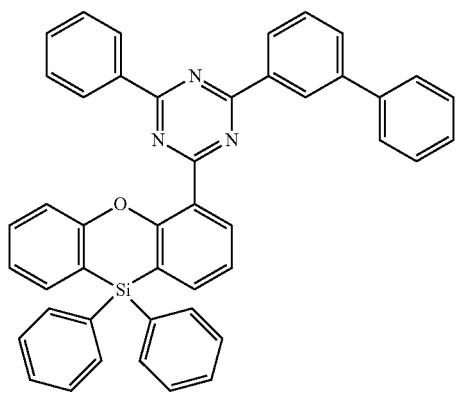

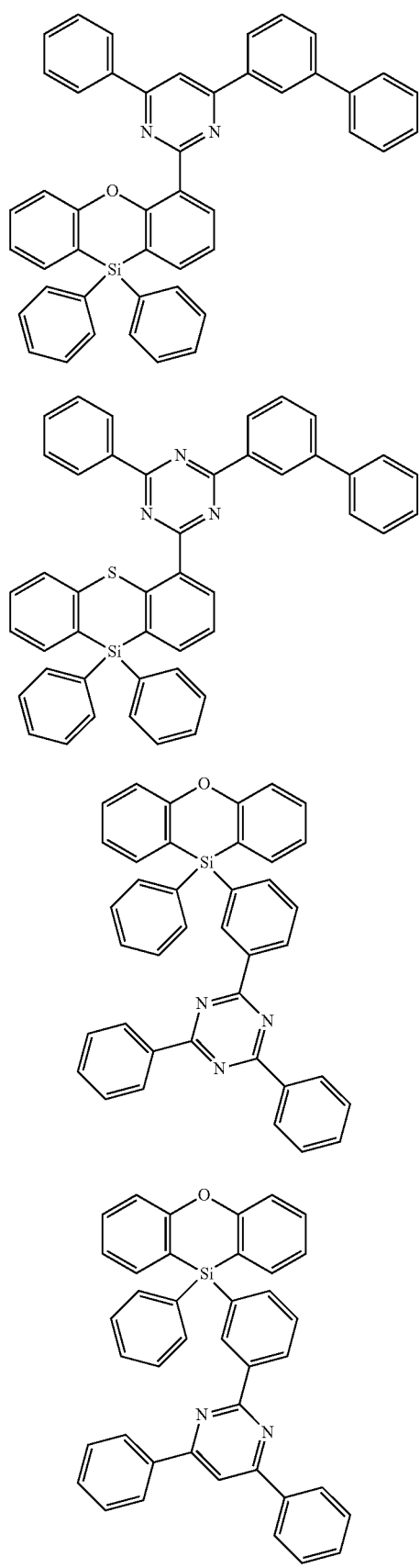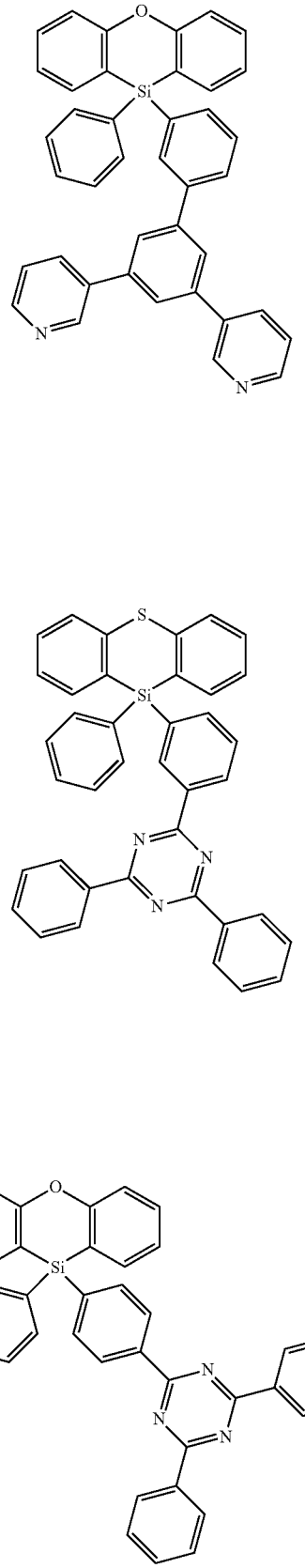

30
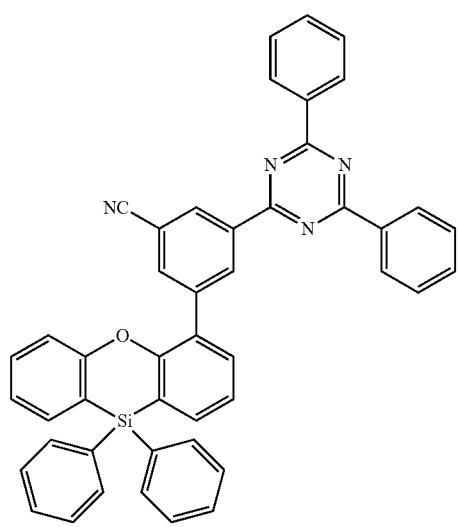
31
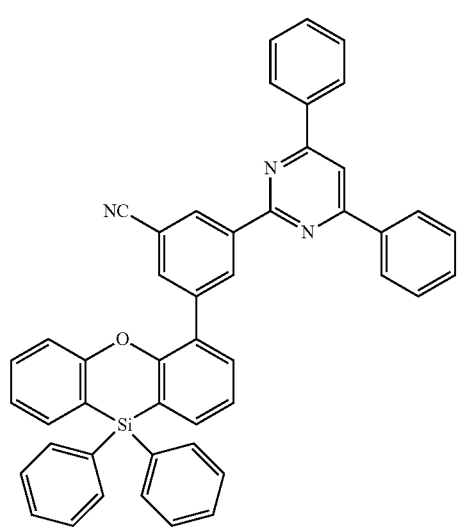
32
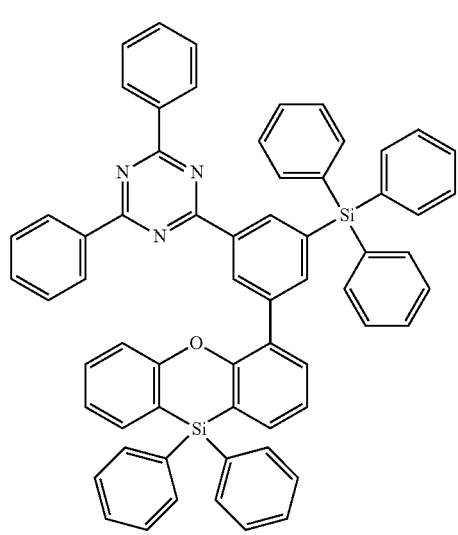
33
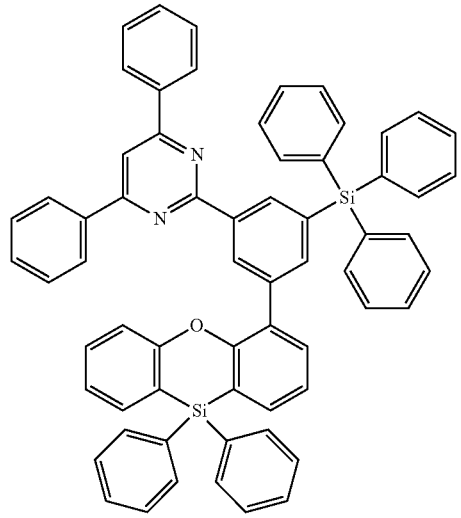 [SMILES: c1ccc(-c2cc(-c3ccccc3)nc(-c3cc(-c4cccc5c4Oc4ccccc4[Si]5(c4ccccc4)c4ccccc4)cc([Si](c4ccccc4)(c4ccccc4)c4ccccc4)c3)n2)cc1]
34
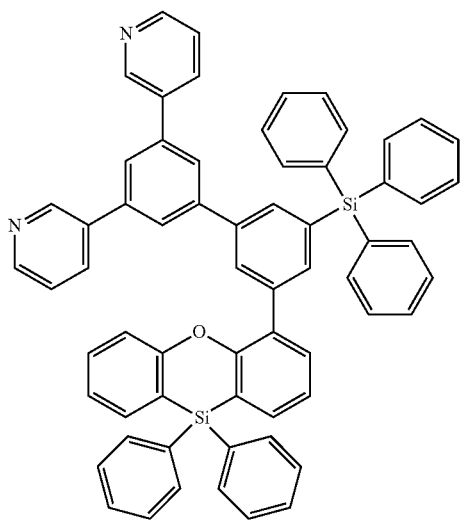
35
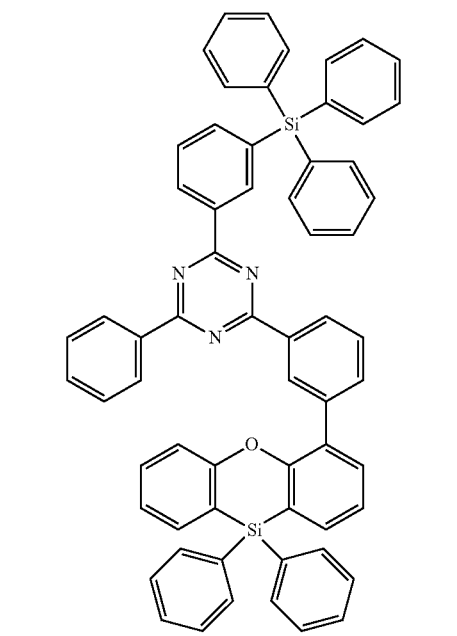

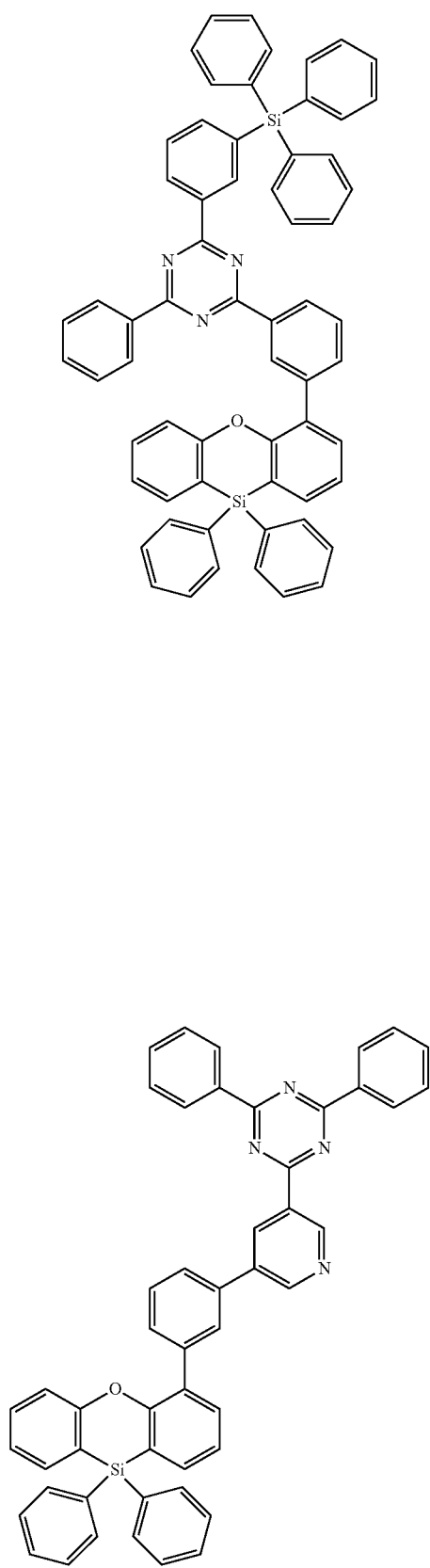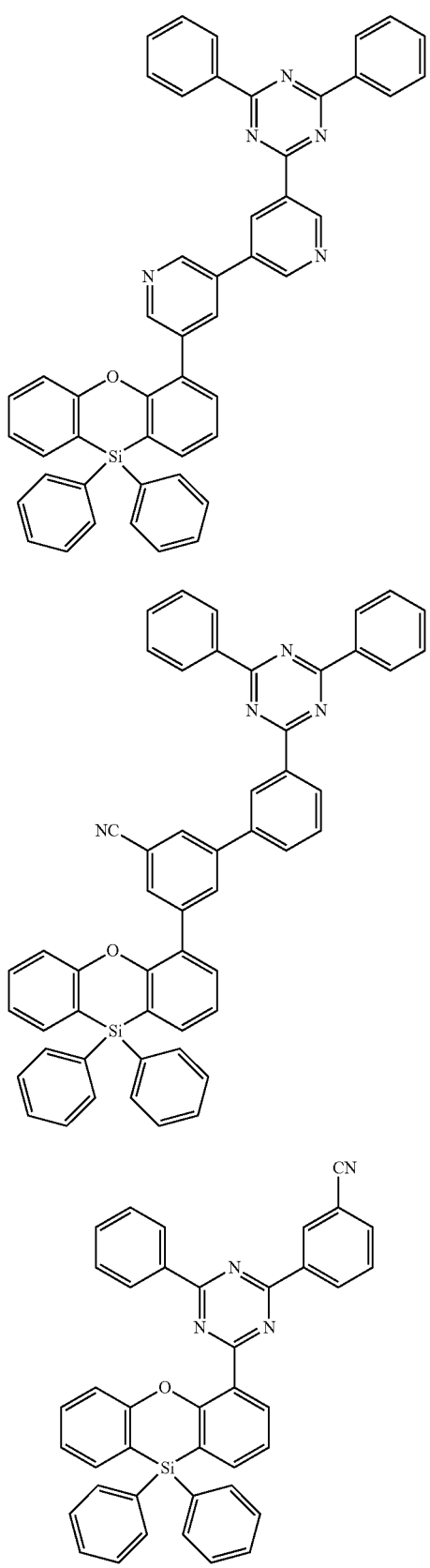

41
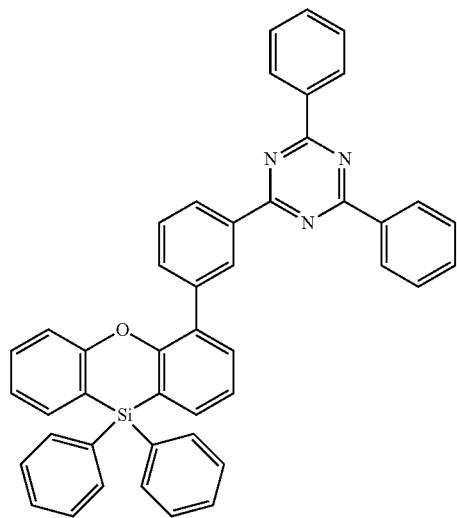
42
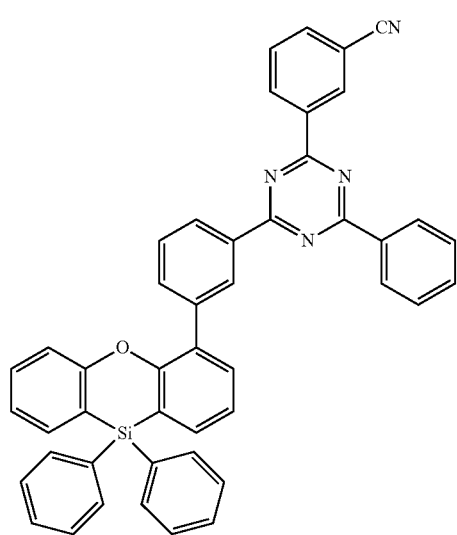
43
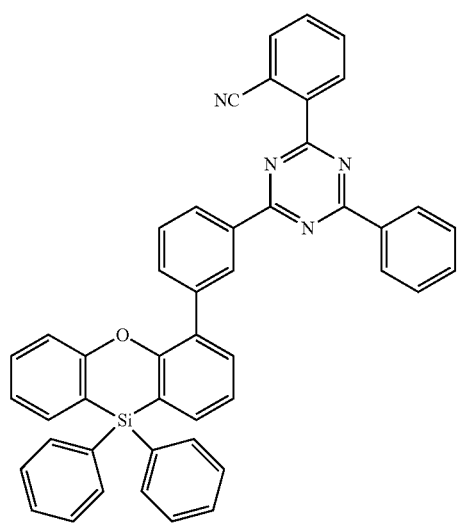
44
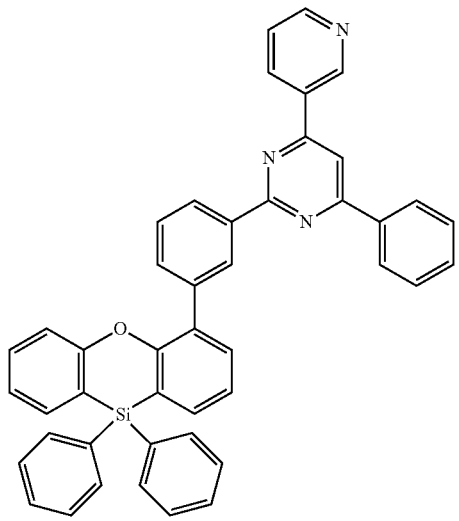
45
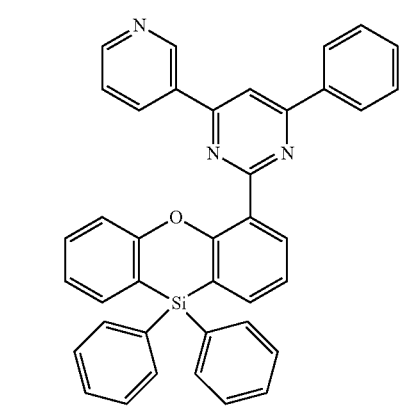
46
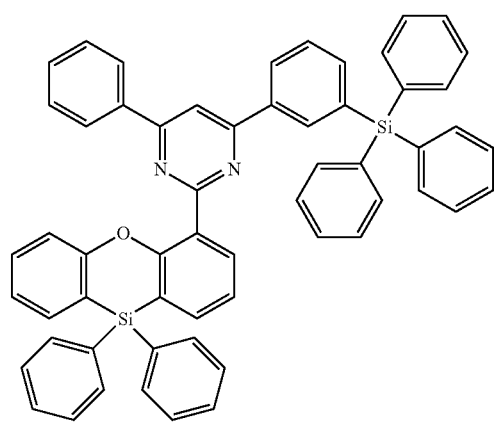

47

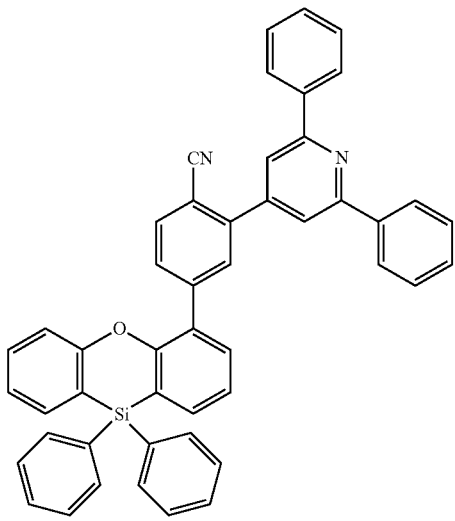

48

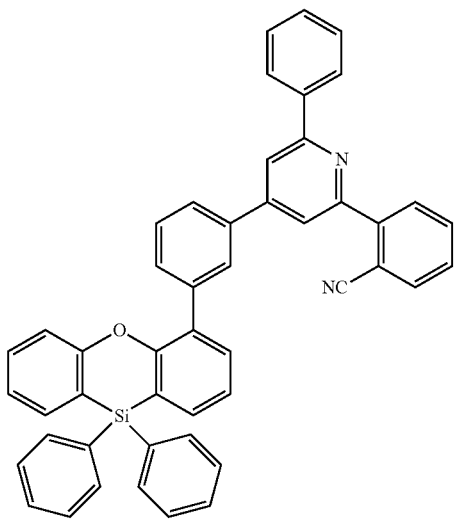

49

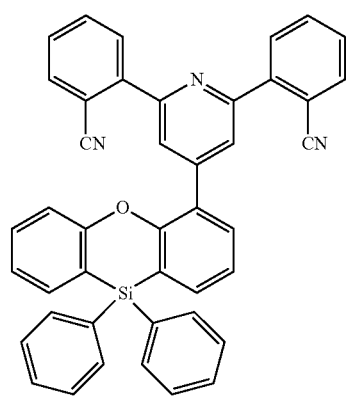

50

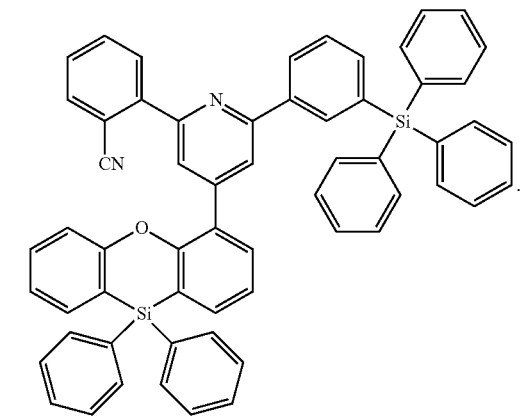

The organic electroluminescence device 10 of an embodiment includes the aromatic compound of an embodiment represented by Formula 1 in an emission layer EML and may have improved emission efficiency. In addition, the organic electroluminescence device 10 of an embodiment includes the aromatic compound of an embodiment represented by Formula 1 in an emission layer EML and may have improved external quantum efficiency.

The emission layer EML may emit one of red light, green light, blue light, white light, yellow light, or cyan light. For example, the emission layer EML may emit blue light in an organic electroluminescence device of an embodiment.

The emission layer EML may include a fluorescent material or a phosphorescent material. In addition, the emission layer EML may include a host and/or a dopant. In addition, the emission layer EML may have a thickness of, for example, about 100 Å to about 600 Å.

In an embodiment, the emission layer EML may be a fluorescence emission layer. The emission layer EML of the organic electroluminescence device 10 of an embodiment may be a delayed fluorescence emission layer. The emission layer EML emitting fluorescence may include a first host and a first dopant.

The aromatic compound of an embodiment represented by Formula 1 may be utilized as a host material of an emission layer EML emitting fluorescence. In an embodiment, the emission layer EML may be a fluorescence emission layer, and the emission layer EML may include the aromatic compound of an embodiment and any suitable phosphorescent dopant available in the art. For example, the aromatic compound according to an embodiment may be included as a host material of the emission layer EML.

Meanwhile, in an embodiment, the emission layer EML may include, as a dopant, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalene-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

The aromatic compound according to an embodiment of the inventive concept may be included as a dopant material of an emission layer EML. For example, the aromatic compound of an embodiment may be utilized as a dopant material which emits fluorescence. In an embodiment, the emission layer EML may be a fluorescence emission layer, and the emission layer EML may include any suitable host material available in the art and the aromatic compound of an embodiment. For example, the aromatic compound of an embodiment may be included as a dopant material of an emission layer EML.

Meanwhile, the emission layer EML may include any suitable host material available in the art in an embodiment. The host material may be any suitable material available in the art without specific limitation and may include, for example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthaline-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethylbiphenyl (CDBP), 2-methyl-9,10-bis(naphthalen-2-yl)anthracene (MADN), bis[2-(diphenylphosphino)phenyl] ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc.

In an embodiment, the emission layer EML may be a phosphorescence emission layer. The emission layer EML emitting phosphorescence may include a second host which is a phosphorescent host and a second dopant which is a phosphorescent dopant.

In an embodiment, the emission layer EML may include the aromatic compound of an embodiment as the second host. The aromatic compound represented by Formula 1 may be utilized as a phosphorescent host of the emission layer EML, and the emission layer EML may further include a suitable (e.g., known) phosphorescent dopant material. In addition, in an embodiment, the emission layer EML may further include any suitable host material available in the art together with the aromatic compound represented by Formula 1.

The emission layer EML may include the aromatic compound of an embodiment and any suitable phosphorescent dopant available in the art material. For example, the phosphorescent dopant may utilize a metal complex including iridium (Ir), platinum (Pt), osmium (Os), gold (Au), titanium (Ti), zirconium (Zr), hafnium (Hf), europium (Eu), terbium (Tb), or thulium (Tm). For example, iridium(III) bis(4,6-difluorophenylpyridinato-N,C2')picolinate (FIrpic), bis(2,4-difluorophenylpyridinato (Fir6), or platinum octaethyl porphyrin (PtOEP) may be utilized as a phosphorescent dopant. However, an embodiment of the inventive concept is not limited thereto.

Meanwhile, the emission layer EML may further include any suitable phosphorescent host material available in the art, for example, bis(4-(9H-carbazol-9-yl)phenyl)diphenylsilane (BCPDS).

If the emission layer EML emits red light, the emission layer EML may include, for example, tris(dibenzoylmethanato)phenanthroline europium ($PBD:Eu(DBM)_3(Phen)$), or a phosphorescent material including perylene. If the emission layer EML emits red light, the dopant included in the emission layer EML may be selected from a metal complex or an organometallic complex (such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP)), rubrene and the derivatives thereof, or 4-dicyanomethylene-2-(p-dimethylaminostyryl)-6-methyl-4H-pyran (DCM) and the derivatives thereof.

If the emission layer EML emits green light, the emission layer EML may further include a phosphorescent material including, for example, tris(8-hydroxyquinolino)aluminum (Alq3). If the emission layer EML emits green light, the dopant included in the emission layer EML may be selected from a metal complex or an organometallic complex (such as fac-tris(2-phenylpyridine)iridium (Ir(ppy)3)), or a coumarin and the derivatives thereof.

If the emission layer EML emits blue light, the emission layer EML may further include a phosphorescent material including at least one selected from, for example, spiro-DPVBi, spiro-6P, distyryl-benzene (DSB), distyryl-arylene (DSA), a polyfluorene (PFO)-based polymer, and a poly(p-phenylene vinylene) (PPV)-based polymer. If the emission layer EML emits blue light, the dopant included in the emission layer EML may be selected from a metal complex or an organometallic complex (such as $(4,6-F2ppy)_2Irpic$), or perylene and the derivatives thereof.

The electron transport region ETR is provided on the emission layer EML. The electron transport region ETR may include at least one of a hole blocking layer, an electron transport layer ETL or an electron injection layer EIL. However, an embodiment of the inventive concept is not limited thereto.

The electron transport region ETR may be a single layer formed utilizing a single material, a single layer formed utilizing a plurality of different materials, or may have a multilayer structure having a plurality of layers formed utilizing a plurality of different materials.

For example, the electron transport region ETR may have a single layer structure of the electron injection layer EIL or the electron transport layer ETL, or a single layer structure formed utilizing an electron injection material and an electron transport material. In addition, the electron transport region ETR may have a single layer structure having a plurality of different materials, or a structure of electron transport layer ETL/electron injection layer EIL, or hole blocking layer/electron transport layer ETL/electron injection layer EIL, stacked from the first electrode EL1 in the stated order, without being limited thereto. The thickness of the electron transport region ETR may be, for example, from about 1,000 Å to about 1,500 Å.

The electron transport region ETR may be formed utilizing various suitable methods such as a vacuum deposition method, a spin coating method, a cast method, a Langmuir-Blodgett (LB) method, an inkjet printing method, a laser printing method, and a laser induced thermal imaging (LITI) method.

If the electron transport region ETR includes the electron transport layer ETL, the electron transport region ETR may include any suitable material available in the art. For example, the electron transport region ETR may include tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl)anthracene (ADN), or a mixture thereof, without being limited thereto.

If the electron transport region ETR includes the electron transport layer ETL, the thickness of the electron transport layer ETL may be from about 100 Å to about 1,000 Å and may be, for example, from about 150 Å to about 500 Å. If the thickness of the electron transport layer ETL satisfies the above-described range, satisfactory electron transport properties may be obtained without substantial increase of a driving voltage.

If the electron transport region ETR includes the electron injection layer EIL, the electron transport region ETR may include any suitable material available in the art. For example, the electron transport region ETR may include LiF, lithium quinolate (LiQ), $Li_2O$, BaO, NaCl, CsF, a metal in lanthanoides (such as Yb), or a metal halide (such as RbCl, and RbI). However, an embodiment of the inventive concept is not limited thereto. The electron injection layer EIL may also be formed utilizing a mixture material of an electron transport material and an insulating organo metal salt. The organo metal salt may be a material having an energy band gap of about 4 eV or more. The organo metal salt may include, for example, metal acetates, metal benzoates, metal acetoacetates, metal acetylacetonates, or metal stearates.

If the electron transport region ETR includes the electron injection layer EIL, the thickness of the electron injection layer EIL may be from about 1 Å to about 100 Å, for example, from about 3 Å to about 90 Å. If the thickness of the electron injection layer EIL satisfies the above described ranges, satisfactory electron injection properties may be obtained without inducing the substantial increase of a driving voltage.

The electron transport region ETR may include a hole blocking layer, as described above. The hole blocking layer may include, for example, at least one of 2,9-dimethyl-4,7-diphenyl-1,10-phenanthroline (BCP), or 4,7-diphenyl-1,10-phenanthroline (Bphen). However, an embodiment of the inventive concept is not limited thereto.

The second electrode EL2 is provided on the electron transport region ETR. The second electrode EL2 has conductivity. The second electrode EL2 may be formed utilizing a metal alloy or a conductive compound. The second electrode EL2 may be a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Alternatively, the second electrode EL2 may have a multilayered structure including a reflective layer or a transflective layer formed utilizing the above-described materials and a transparent conductive layer formed utilizing ITO, IZO, ZnO, ITZO, etc.

The second electrode EL2 may be coupled or connected with an auxiliary electrode. If the second electrode EL2 is coupled or connected with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, and the excitons may emit light via transition from an excited state to a ground state.

If the organic electroluminescence device 10 is a top emission device, the first electrode EL1 may be a reflective electrode, and the second electrode EL2 may be a transmissive electrode or a transflective electrode. If the organic electroluminescence device 10 is a bottom emission device, the first electrode EL1 may be a transmissive electrode or a transflective electrode, and the second electrode EL2 may be a reflective electrode.

An organic electroluminescence device of an embodiment includes the aromatic compound of an embodiment and may have improved emission efficiency. In addition, the organic electroluminescence device of an embodiment includes the aromatic compound having a high lowest triplet energy according to an embodiment in a hole transport region, and the diffusion of triplet excitons generated in an emission layer may be restrained and high external quantum efficiency may be achieved.

Meanwhile, the organic electroluminescence device of an embodiment may be a blue emitting device, a green emitting device, a red emitting device or a white emitting device. In addition, if the organic electroluminescence device of an embodiment is a blue emitting device, high emission efficiency may be achieved. However, an embodiment of the inventive concept is not limited thereto.

Hereinafter an aromatic compound of an embodiment and an organic electroluminescence device including the aromatic compound of an embodiment will be explained in more detail with reference to embodiments and comparative embodiments. The following embodiments are only illustrations to assist the understanding of the inventive concept, and the scope of the inventive concept is not limited thereto.

EXAMPLES

1. Synthesis of Aromatic Compounds

First, a synthetic method of the aromatic compounds according to exemplary embodiments will be explained referring to synthetic methods of Compound 2, Compound 5, Compound 8, Compound 18, Compound 29, Compound 33 and Compound 43 in Compound Group 1. In addition, the following synthetic methods of the aromatic compounds are for illustrations, and the synthetic method of the aromatic compound according to an embodiment of the inventive concept is not limited to the following examples.

Synthesis of Compound 2

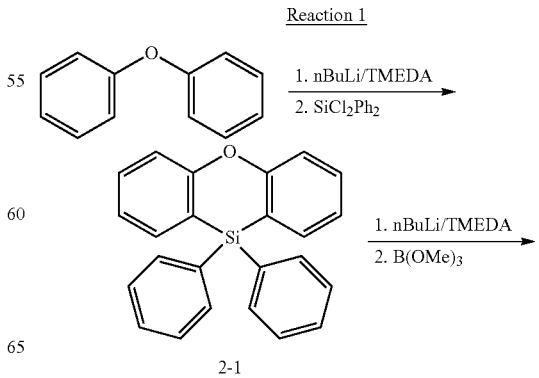

Synthesis of Compound 5

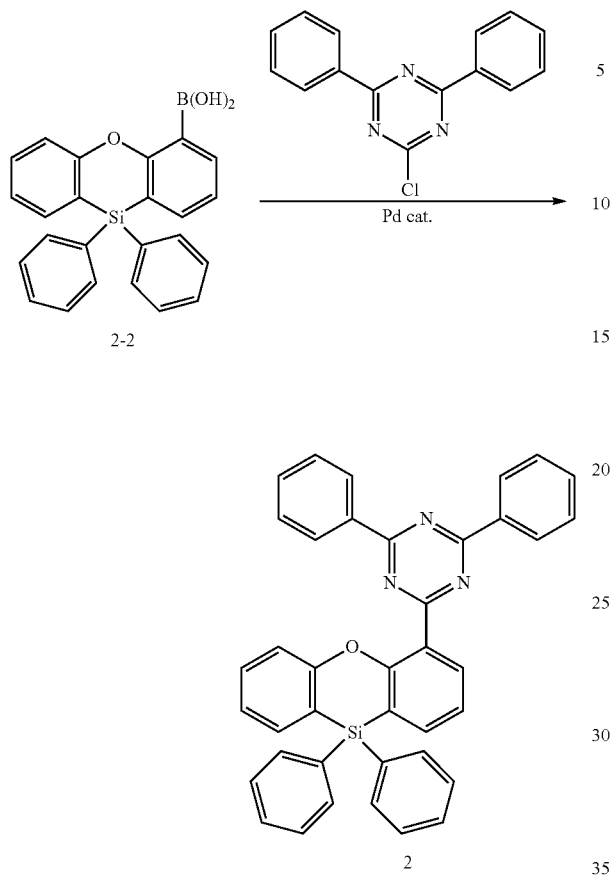

Synthesis of Intermediate 2-1

As illustrated in Reaction 1, diphenyl ether was dissolved in THF and reacted with tetramethyl ethylenediamine (TMEDA) and nBuLi, and then reacted with dichlorodiphenylsilane to obtain Intermediate 2-1. Intermediate 2-1 was identified by LC-MS. $C_{24}H_{18}OSi$: M+1 351.3

Synthesis of Intermediate 2-2

As illustrated in Reaction 1, Intermediate 2-1 was dissolved in THF, and reacted with TMEDA and nBuLi, and then reacted with trimethyl borate to obtain Intermediate 2-2. Intermediate 2-2 was identified by LC-MS. $C_{24}H_{19}BO_3Si$: M+1 395.2.

Synthesis of Compound 2

As illustrated in Reaction 1, 3.4 g of 2-chloro-4,6-diphenyltriazine (CAS No.=3842-55-5), 6.0 g of Intermediate 2-2, 0.58 g of tetrakis(triphenylphosphine)palladium, and 4.3 g of potassium carbonate were injected into a reactor, and dissolved in 80 ml of toluene, 20 ml of ethanol and 20 ml of distilled water, followed by refluxing for about 24 hours. After finishing the reaction, the reaction solution was extracted with ethyl acetate, and a collected organic layer was dried with magnesium sulfate. Solvents were evaporated, and the residue thus obtained was separated by silica gel column chromatography to obtain 4.9 g (yield: 67%) of Compound 2. Compound 2 was identified by MS/FAB and $^1$H-NMR, and the results are shown in Table 1 below.

Synthesis of Intermediate 5-1

As illustrated in Reaction 2, bis(2-bromophenyl)sulfide was dissolved in THF and reacted with nBuLi, and then reacted with dichlorodiphenylsilane to obtain Intermediate 5-1. Intermediate 5-1 was identified by LC-MS. $C_{24}H_{18}SSi$: M+1 367.2

Synthesis of Intermediate 5-2

As illustrated in Reaction 2, Intermediate 5-1 was dissolved in THF, and reacted with TMEDA and nBuLi, and then reacted with trimethyl borate to obtain Intermediate 5-2. Intermediate 5-2 was identified by LC-MS. $C_{24}H_{19}BO_2SSi$: M+1 395.2.

Synthesis of Compound 5

As illustrated in Reaction 2, 2.1 g of 2-(3-bromophenyl)-4,6-diphenyl-1,3,5-triazine (CAS No.=864377-31-1), 2.6 g of Intermediate 5-2, 0.25 g of tetrakis(triphenylphosphine) palladium, and 1.9 g of potassium carbonate were injected into a reactor, and dissolved in 30 ml of toluene, 10 ml of ethanol and 10 ml of distilled water, followed by refluxing for about 24 hours. After finishing the reaction, the reaction solution was extracted with ethyl acetate, and a collected organic layer was dried with magnesium sulfate. Solvents were evaporated, and the residue thus obtained was separated by silica gel column chromatography to obtain 2.8 g (yield: 77%) of Compound 5. Compound 5 was identified by MS/FAB and $^1$H-NMR, and the results are shown in Table 1 below.

Synthesis of Compound 8

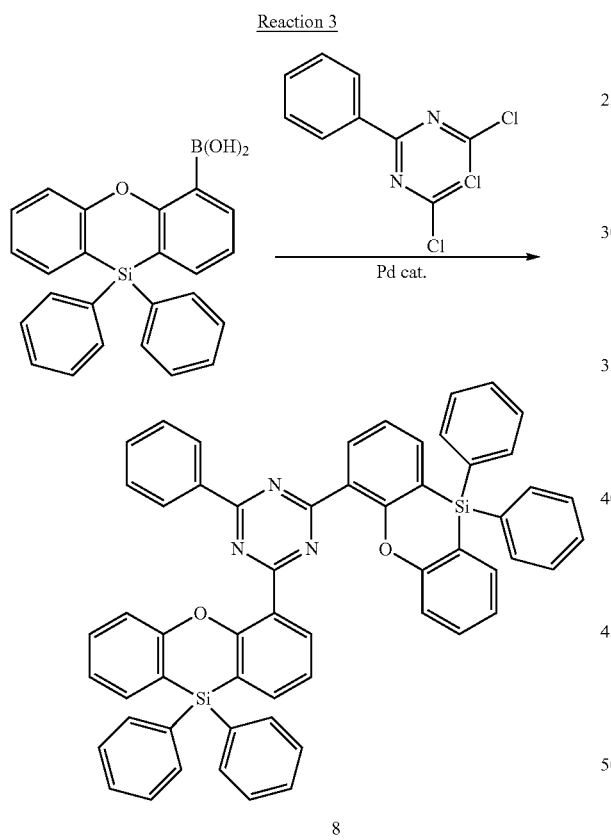

8

As illustrated in Reaction 3, 1.8 g of 2,4-dichloro-6-phenyltriazine (CAS No.=1700-02-3), 3.0 g of Intermediate 2-2, 0.33 g of tetrakis(triphenylphosphine)palladium, and 2.5 g of potassium carbonate were injected into a reactor, and dissolved in 30 ml of toluene, 10 ml of ethanol and 10 ml of distilled water, followed by refluxing for about 24 hours. After finishing the reaction, the reaction solution was extracted with ethyl acetate, and a collected organic layer was dried with magnesium sulfate. Solvents were evaporated, and the residue thus obtained was separated by silica gel column chromatography to obtain 3.4 g (yield: 55%) of Compound 8. Compound 8 was identified by MS/FAB and $^1$H-NMR, and the results are shown in Table 1 below.

Synthesis of Compound 18

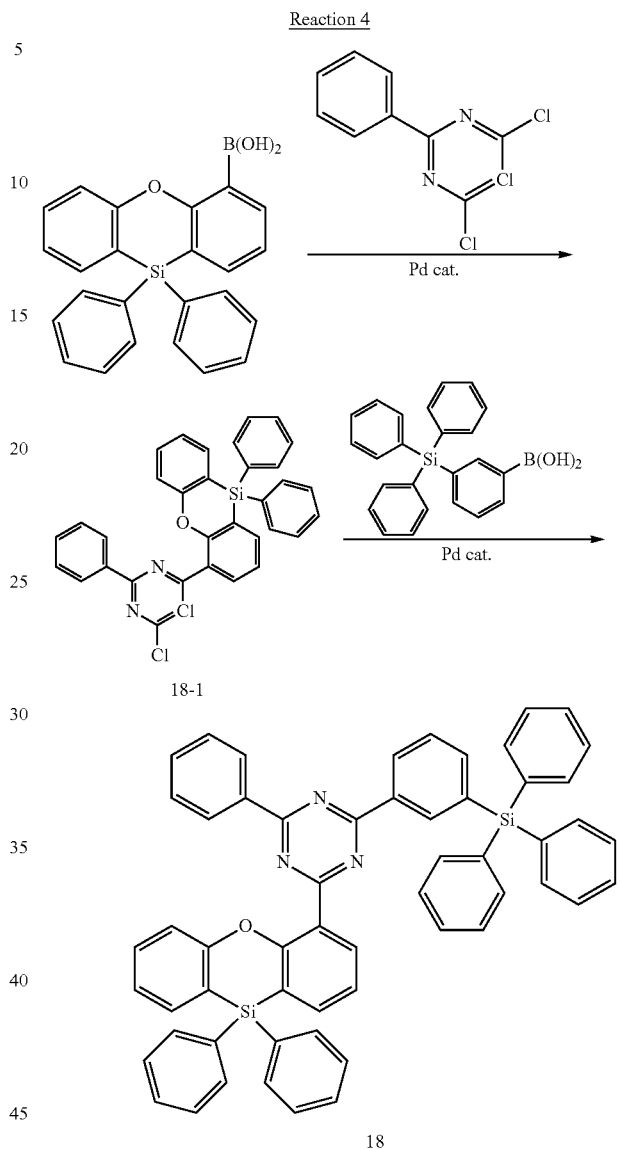

18

Synthesis of Intermediate 18-1

As illustrated in Reaction 4, Intermediate 2-2 was reacted with 2,4-dichloro-6-phenyltriazine under the conditions of a Pd catalyst to obtain Intermediate 18-1. Intermediate 18-1 was identified by LC-MS. $C_{33}H_{22}Cl_2N_2OSi$: M+1 561.2.

Synthesis of Compound 18

As illustrated in Reaction 4, 1.2 g of 3-(triphenylsilyl) phenyl)boronic acid (CAS No.=1253912-58-1), 1.5 g of Intermediate 18-1, 0.12 g of tetrakis(triphenylphosphine) palladium, and 0.9 g of potassium carbonate were injected into a reactor, and dissolved in 20 ml of toluene, 5 ml of ethanol and 5 ml of distilled water, followed by refluxing for about 24 hours. After finishing the reaction, the reaction solution was extracted with ethyl acetate, and a collected organic layer was dried with magnesium sulfate. Solvents were evaporated, and the residue thus obtained was separated by silica gel column chromatography to obtain 1.6 g (yield: 71%) of Compound 18. Compound 18 was identified by MS/FAB and $^1$H-NMR, and the results are shown in Table 1 below.

Synthesis of Compound 29

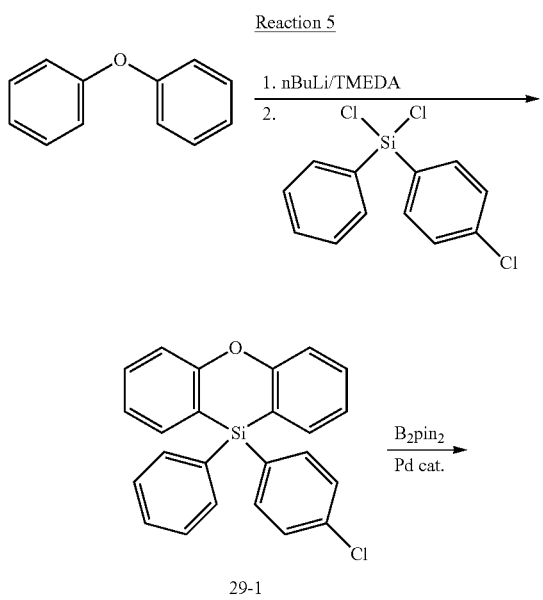

Synthesis of Intermediate 29-2

As illustrated in Reaction 5, Intermediate 29-1 and bis(pinacolato)diboron were reacted under the conditions of a Pd catalyst to obtain Intermediate 29-2. Intermediate 29-2 was identified by LC-MS. $C_{30}H_{29}BO_3Si$: M+1 477.3.

Synthesis of Compound 29

As illustrated in Reaction 5, 4.7 g of Intermediate 29-2 and 2.2 g of 2-chloro-4,6-diphenyltriazine (CAS No.=3842-55-5), 0.38 g of tetrakis(triphenylphosphine)palladium, and 2.8 g of potassium carbonate were injected into a reactor, and dissolved in 40 ml of toluene, 10 ml of ethanol and 10 ml of distilled water, followed by refluxing for about 24 hours. After finishing the reaction, the reaction solution was extracted with ethyl acetate, and a collected organic layer was dried with magnesium sulfate. Solvents were evaporated, and the residue thus obtained was separated by silica gel column chromatography to obtain 3.1 g (yield: 65%) of Compound 29. Compound 29 was identified by MS/FAB and $^1$H-NMR, and the results are shown in Table 1 below.

Synthesis of Compound 33

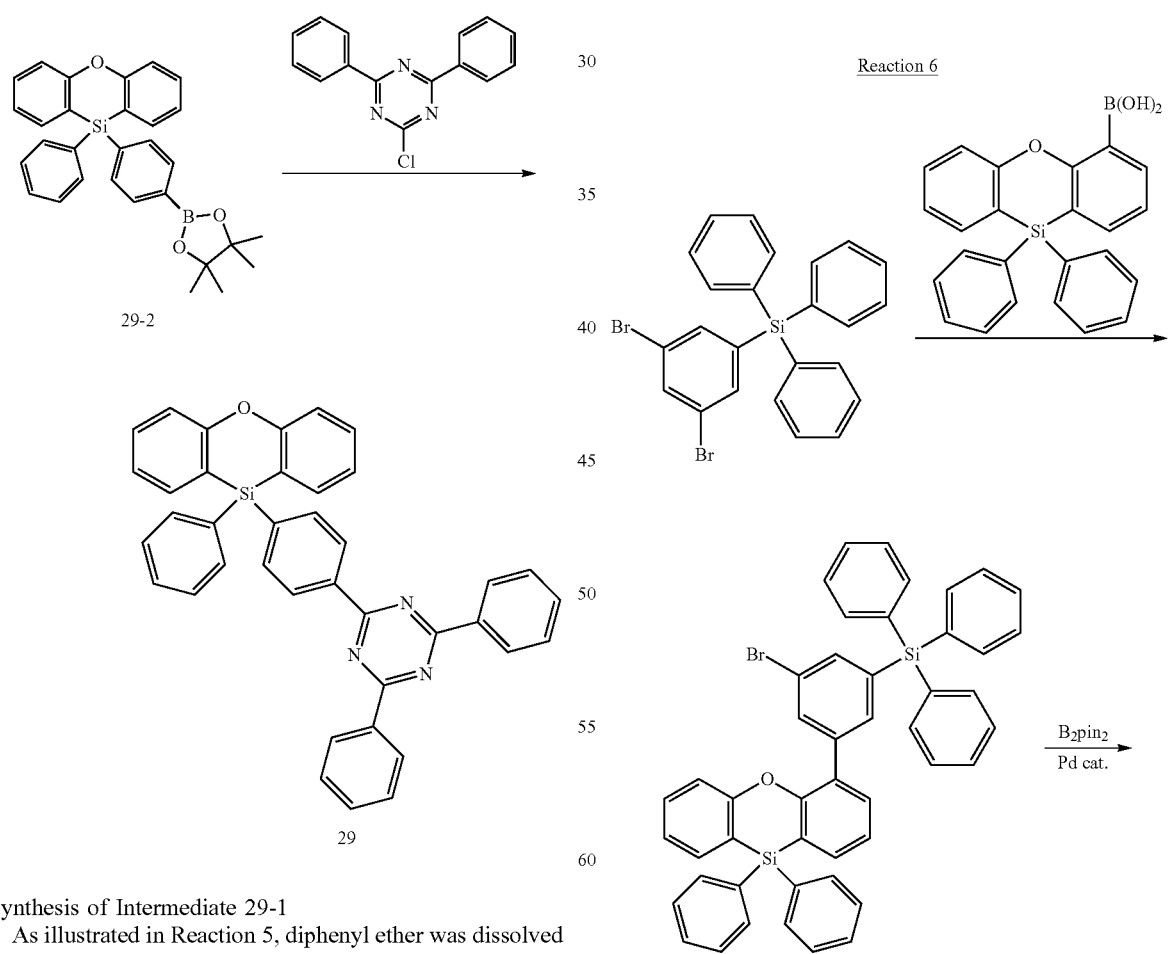

Synthesis of Intermediate 29-1

As illustrated in Reaction 5, diphenyl ether was dissolved in THF and reacted with TMEDA and nBuLi, and then reacted with dichloro (4-chlorophenyl)(phenyl)silane to obtain Intermediate 29-1. Intermediate 29-1 was identified by LC-MS. $C_{24}H_{17}ClOSi$: M+1 385.1

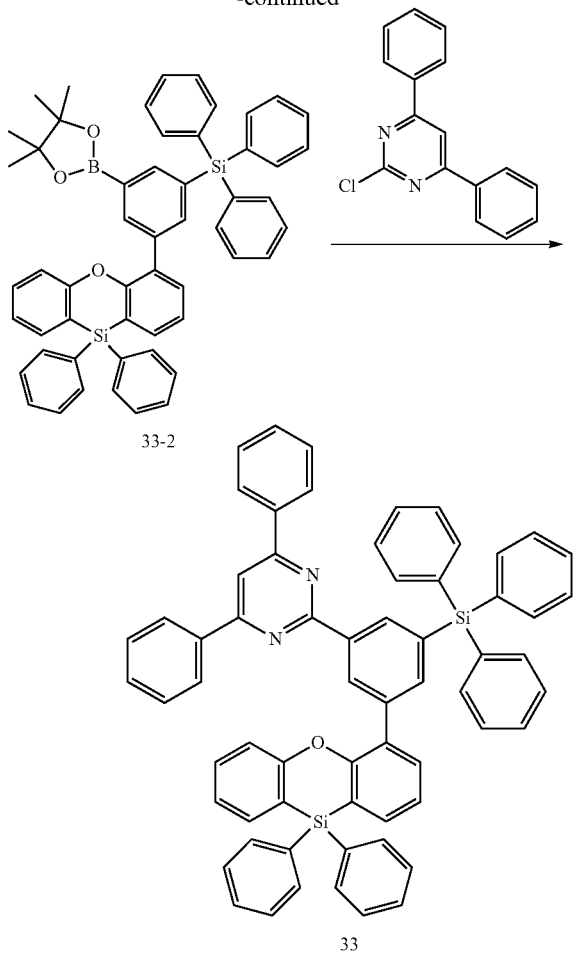

Synthesis of Intermediate 33-1

As illustrated in Reaction 6, 1,3-dibromo-5-(triphenylsilyl)benzene (CAS No.=1030856-97-3) and Intermediate2-2-were reacted under the conditions of a Pd catalyst to obtain Intermediate 33-1. Intermediate 33-1 was identified by LC-MS. $C_{48}H_{35}BrOSi_2$: M+1 763.2

Synthesis of Intermediate 33-2

As illustrated in Reaction 6, Intermediate 33-1 and bis(pinacolato)diboron were reacted under the conditions of a Pd catalyst to obtain Intermediate 33-2. Intermediate 33-2 was identified by LC-MS. $C_{54}H_{47}BO_3Si_2$: M+1 811.2.

Synthesis of Compound 33

As illustrated in Reaction 6, 4.7 g of Intermediate 33-2 and 1.3 g of 2-chloro-4,6-diphenylpyrimidine (CAS No.=2915-16-4), 0.22 g of tetrakis(triphenylphosphine)palladium, and 1.7 g of potassium carbonate were injected into a reactor, and dissolved in 40 ml of toluene, 10 ml of ethanol and 10 ml of distilled water, followed by refluxing for about 24 hours. After finishing the reaction, the reaction solution was extracted with ethyl acetate, and a collected organic layer was dried with magnesium sulfate. Solvents were evaporated, and the residue thus obtained was separated by silica gel column chromatography to obtain 2.5 g (yield: 55%) of Compound 33. Compound 33 was identified by MS/FAB and $^1$H-NMR, and the results are shown in Table 1 below.

Synthesis of Compound 43

Reaction 7

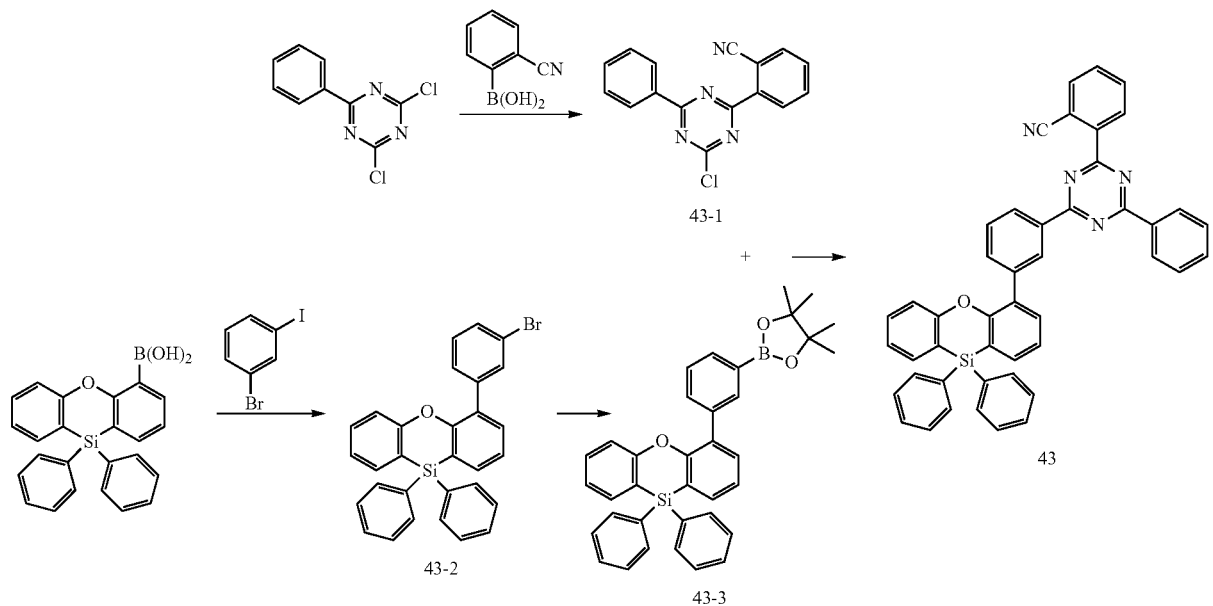

Synthesis of Intermediate 43-1

As illustrated in Reaction 7, 2,4-dichloro-6-phenyltriazine and (2-cyanophenyl)boronic acid were reacted under the conditions of a Pd catalyst to obtain Intermediate 43-1. Intermediate 43-1 was identified by LC-MS. $C_{16}H_9ClN_4$: M+1 293.1

Synthesis of Intermediate 43-2

As illustrated in Reaction 7, Intermediate 2-2 and 3-bromoiodobenzene were reacted under the conditions of a Pd catalyst to obtain Intermediate 43-2. Intermediate 43-2 was identified by LC-MS. $C_{30}H_{21}BrOSi$: M+1 505.1.

Synthesis of Intermediate 43-3

As illustrated in Reaction 7, Intermediate 43-2 and bis(pinacolato)diboron were reacted under the conditions of a Pd catalyst to obtain Intermediate 43-3. Intermediate 43-3 was identified by LC-MS. $C_{36}H_{33}BO_3Si$: M+1 553.1.

Synthesis of Compound 43

As illustrated in Reaction 7, 3.2 g of Intermediate 43-1 and 6.8 g of Intermediate 43-3, 0.50 g of tetrakis(triphenylphosphine)palladium, and 3.6 g of potassium carbonate were injected into a reactor, and dissolved in 60 ml of toluene, 15 ml of ethanol and 15 ml of distilled water, followed by refluxing for about 24 hours. After finishing the reaction, the reaction solution was extracted with ethyl acetate, and a collected organic layer was dried with magnesium sulfate. Solvents were evaporated, and the residue thus obtained was separated by silica gel column chromatography to obtain 4.4 g (yield: 63%) of Compound 43. Compound 43 was identified by MS/FAB and $^1$H-NMR, and the results are shown in Table 1 below.

TABLE 1

| Compound | $^1$H NMR (CDCl$_3$, 400 MHz) | MS/FAB Measured value [M + 1] | Calc. |
|---|---|---|---|
| 2 | 8.34 (d, 4H), 8.04 (d, 1H), 7.52-7.33 (m, 20H), 7.11 (d, 1H), 7.05 (t, 1H) | 582.1 | 581.75 |
| 5 | 8.38-8.33 (m, 5H), 7.92 (s, 1H), 7.73-7.62 (m, 3H), 7.50-7.45 (m, 11H), 7.37-7.32 (m, 10H), 7.11 (t, 1H) | 674.1 | 673.20 |
| 8 | 8.36 (d, 2H), 8.05 (d, 2H), 7.52-7.41 (m, 15H), 7.37-7.35 (m, 14H), 7.11-7.05 (m, 4H) | 854.4 | 853.26 |
| 18 | 8.37-8.30 (m, 3H), 7.86 (s, 1H), 7.63 (t, 1H), 7.52-7.36 (m, 32H), 7.11 (d, 1H), 7.07 (t, 1H) | 840.2 | 839.28 |
| 29 | 8.35 (d, 4H), 7.87 (m, 2H), 7.65 (m, 2H), 7.44-7.36 (m, 4H), 7.11-7.08 (m, 2H) | 582.6 | 581.19 |
| 33 | 8.24 (s, 1H), 8.04-7.92 (m, 8H), 7.52-7.33 (m, 35H), 7.12 (d, 1H), 7.08 (t, 1H) | 915.4 | 914.31 |
| 43 | 8.37 (d, 1H), 8.36 (m, 2H), 8.04 (d, 2H), 7.94-7.90 (m, 2H), 7.78-7.70 (m, 4H), 7.61 (d, 1H), 7.52-7.36 (m, 17H), 7.11-7.08 (m, 2H) | 683.7 | 682.86 |

2. Manufacture and Evaluation of Organic Electroluminescence Devices including Aromatic Compounds An organic electroluminescence device including an aromatic compound of an embodiment in an emission layer was manufactured as follows. Organic electroluminescence devices of Examples 1 to 7 were manufactured utilizing the aromatic compounds of Compound 2, Compound 5, Compound 8, Compound 18, Compound 29, Compound 33 and Compound 43 as emission layer materials, respectively. Organic electroluminescence devices of Comparative Examples 1 to 4 were manufactured utilizing Comparative Compounds C1 to C4 as emission layer materials, respectively.

Compounds utilized for forming emission layers of Examples 1 to 7 and Comparative Examples 1 to 4 are shown in Table 2 below.

TABLE 2

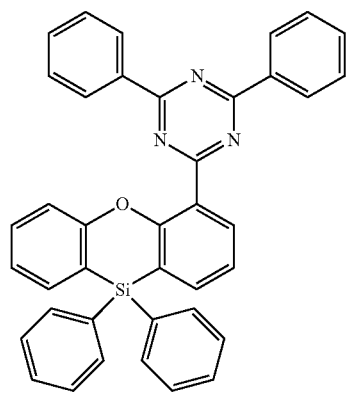

Compound 2

TABLE 2-continued
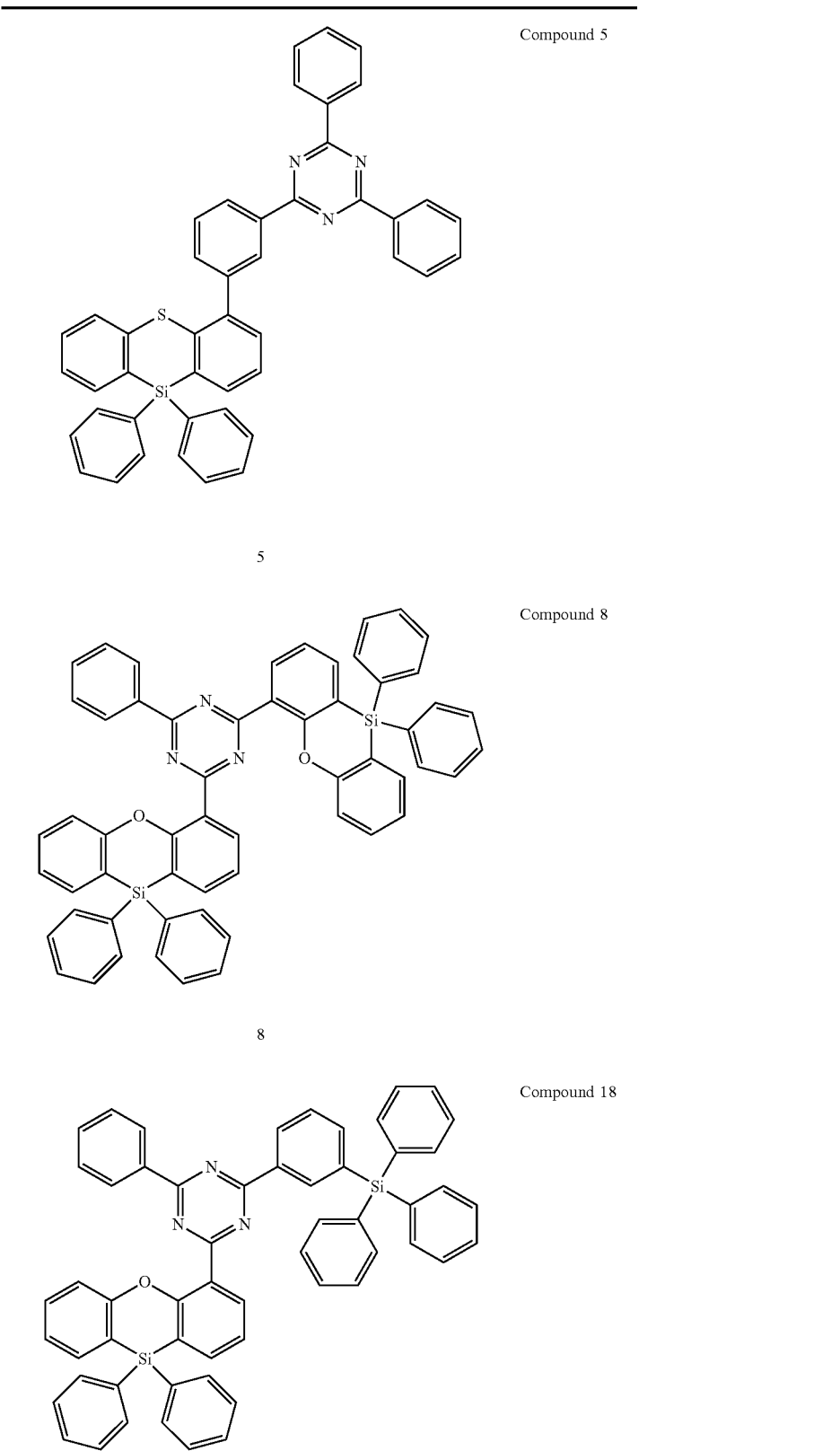
Compound 5
5
Compound 8
8
Compound 18
18

TABLE 2-continued
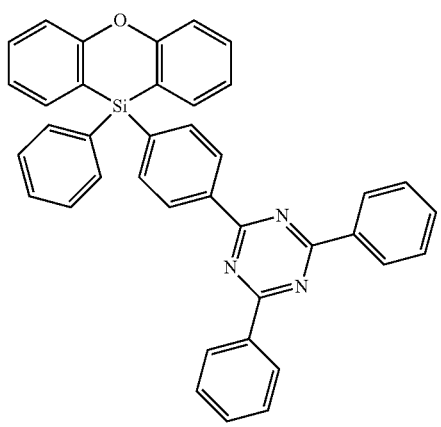
Compound 29
29
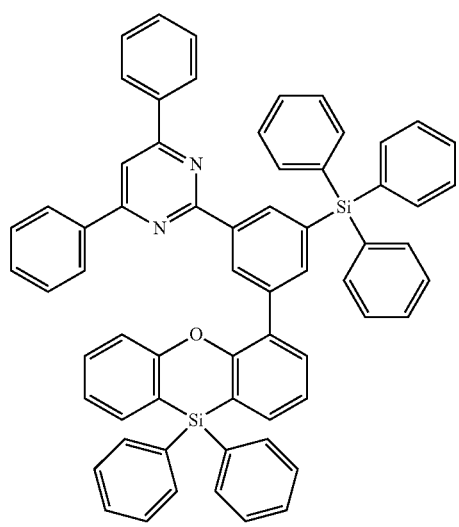
Compound 33
33
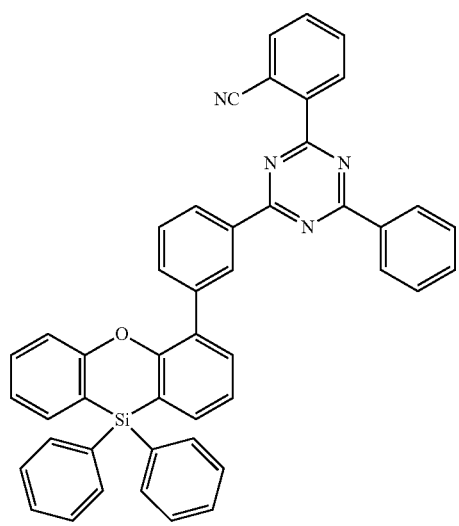 [SMILES: N#Cc1ccccc1-c1nc(-c2ccccc2)nc(-c2cccc(-c3cccc4c3Oc3ccccc3[Si]4(c3ccccc3)c3ccccc3)c2)n1]
Compound 43
43

TABLE 2-continued

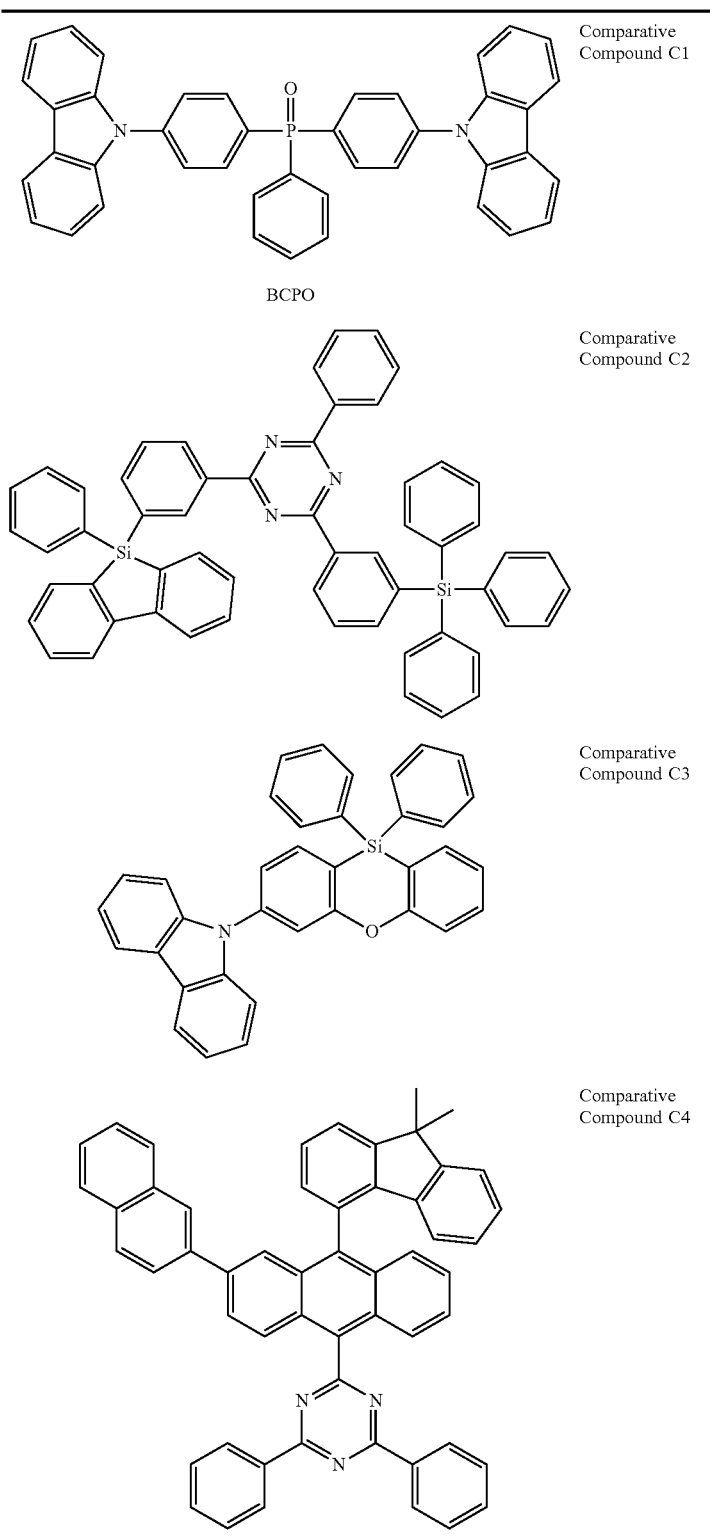

| | |
|---|---|
| BCPO | Comparative Compound C1 |
| | Comparative Compound C2 |
| | Comparative Compound C3 |
| | Comparative Compound C4 |

The organic electroluminescence devices of the examples and the comparative examples were manufactured as follows.

A first electrode was formed utilizing an ITO substrate having a thickness of about 1,200 Å. The ITO substrate was prepared by cleaning utilizing ultrasonic waves with isopropyl alcohol and pure water for about 5 minutes for each and then by exposing to ultraviolet light for about 30 minutes and ozone. The ITO substrate thus cleansed was installed in a vacuum deposition apparatus.

On the cleansed and prepared ITO substrate, a hole injection layer was formed by depositing NPD in vacuum.

The hole injection layer was formed to a thickness of about 300 Å. On the hole injection layer, mCP was deposited in vacuum to form a hole transport layer. The hole transport layer was formed to a thickness of about 200 Å.

Then, an emission layer including the aromatic compound of an embodiment was formed on the hole transport layer. The emission layer was formed by co-depositing the aromatic compound of an embodiment and a dopant material, Ir(pmp)3 in a weight ratio of 92:8 to a thickness of about 250 Å.

Then, on the emission layer, 3-(4-biphenylyl)-4-phenyl-5-tert-butylphenyl-1,2,4-triazole (TAZ) was deposited to a thickness of about 200 Å as an electron transport layer. After that, on the electron transport layer, LiF, which is an alkali metal halide, was deposited to a thickness of about 10 Å to form an electron injection layer. Then, Al was deposited to a thickness of about 100 Å to form a second electrode. By forming a LiF/Al electrode, an organic electroluminescence device was manufactured.

The materials utilized in the organic electroluminescence devices may be represented by the following formulae:

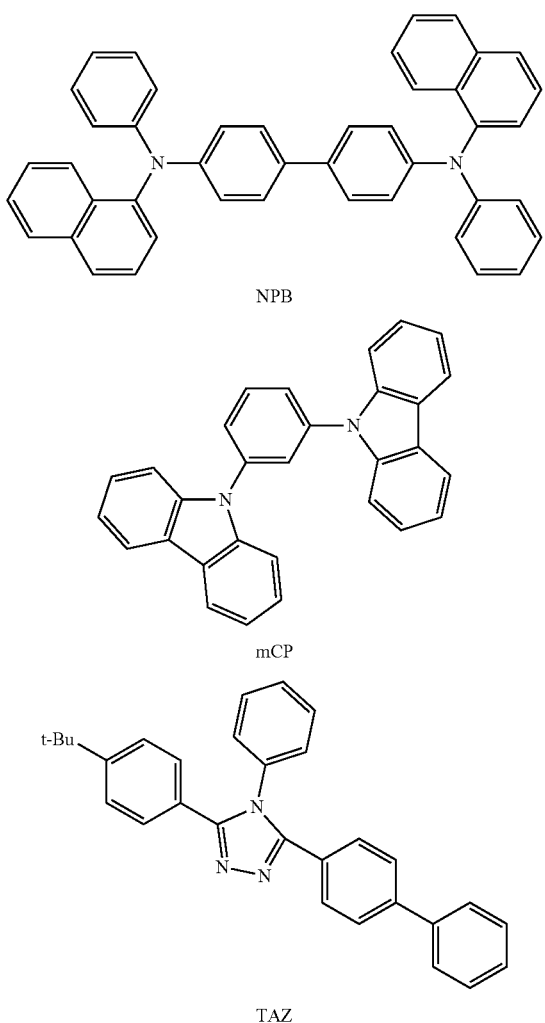

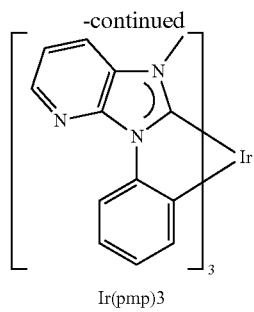

Ir(pmp)3

Examples 1 to 7 utilize different (e.g., different kinds of) aromatic compounds as the host materials of an emission layer. Meanwhile, in the comparative examples, organic electroluminescence devices were manufactured by substantially the same manufacturing method of the organic electroluminescence devices of the examples except for utilizing Comparative Compounds C1 to C4, respectively.

(Evaluation of Properties of Organic Electroluminescence Devices)

In order to evaluate the properties of the organic electroluminescence devices according to the examples and the comparative example, a driving voltage at current density of 10 mA/cm$^2$, current density and maximum quantum efficiency were measured. The driving voltage and the current density of the organic electroluminescence devices were measured utilizing a source meter (Keithley Instrument Co., 2400 series), and the maximum quantum efficiency was measured utilizing an external quantum efficiency measurement apparatus C9920-2-12 of Hamamatsu Photonics Co. For the evaluation of the maximum quantum efficiency, luminance/current density was measured utilizing a luminescence system of which wavelength sensitivity was calibrated, and converting into the maximum quantum efficiency supposing angle luminance distribution (Lambertian) introducing (e.g., assuming Lambertian angle luminance distribution) and perfect diffusion reflection surface. The evaluation results on the properties of the organic electroluminescence devices are shown in Table 3 below.

TABLE 3

| Division | Emission layer | Driving voltage (V) | Current density (mA/cm$^2$) | Maximum quantum efficiency (%) | Emission color |
|---|---|---|---|---|---|
| Example 1 | Compound 2 | 3.6 | 2.3 | 18.9 | Blue |
| Example 2 | Compound 5 | 3.8 | 2.3 | 18.2 | Blue |
| Example 3 | Compound 8 | 4.1 | 2.3 | 17.3 | Blue |
| Example 4 | Compound 18 | 4.5 | 2.3 | 20.2 | Blue |
| Example 5 | Compound 29 | 3.9 | 2.3 | 21.3 | Blue |
| Example 6 | Compound 33 | 4.1 | 2.3 | 19.1 | Blue |
| Example 7 | Compound 43 | 4.3 | 2.3 | 21.5 | Blue |
| Comparative Example 1 | Comparative Compound C1 | 5.5 | 2.3 | 12.4 | Blue |
| Comparative Example 2 | Comparative Compound C2 | 4.6 | 2.3 | 2.5 | Blue |
| Comparative Example 3 | Comparative Compound C3 | 5.6 | 2.3 | 15.5 | Blue |
| Comparative Example 4 | Comparative Compound C4 | 4.5 | 2.3 | 3.3 | Blue |

Referring to the results of Table 3, it was found that the organic electroluminescence devices of Examples 1 to 7 have higher efficiency when compared to the organic electroluminescence devices of Comparative Examples 1 to 4.

The organic electroluminescence device of an embodiment includes the aromatic compound of an embodiment in an emission layer and may achieve high emission efficiency. The aromatic compound of an embodiment may decrease the driving voltage of an organic electroluminescence device and improve blue emission efficiency. In addition, by appropriately introducing a substituent in a compound represented by Formula 1 in the organic electroluminescence device of an embodiment, blue emission may be achieved, and concurrently (e.g., at the same time), high external quantum efficiency may be achieved.

An aromatic compound of an embodiment may improve the life and emission efficiency of an organic electroluminescence device.

An organic electroluminescence device of an embodiment includes an aromatic compound of an embodiment in an organic layer, for example, in an emission layer, and may achieve high efficiency and long life.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration. As used herein, the term "and/or" includes any and all combinations of one or more of the associated listed items. Expressions such as "at least one of," when preceding a list of elements, modify the entire list of elements and do not modify the individual elements of the list.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed, and equivalents thereof.

38
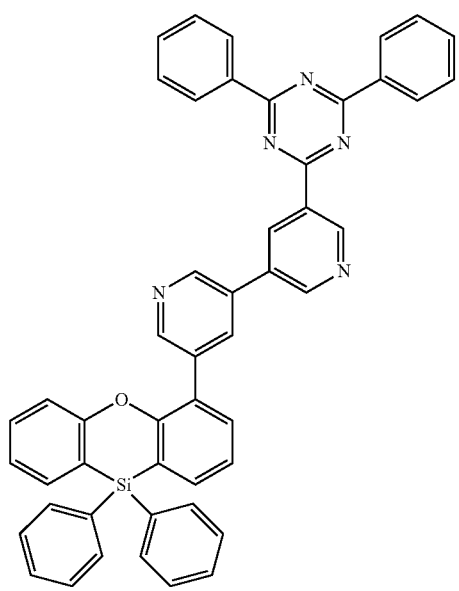
39
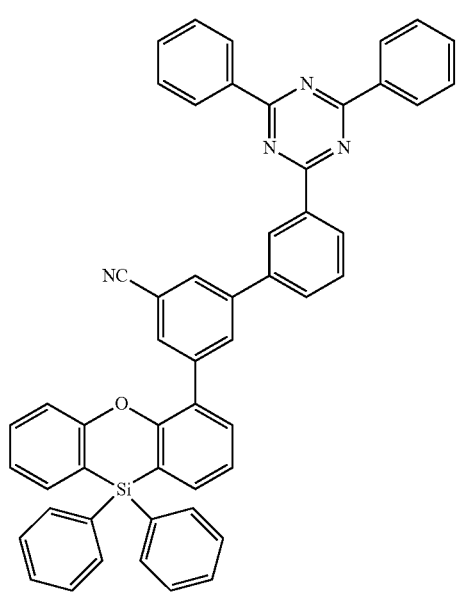
40
41
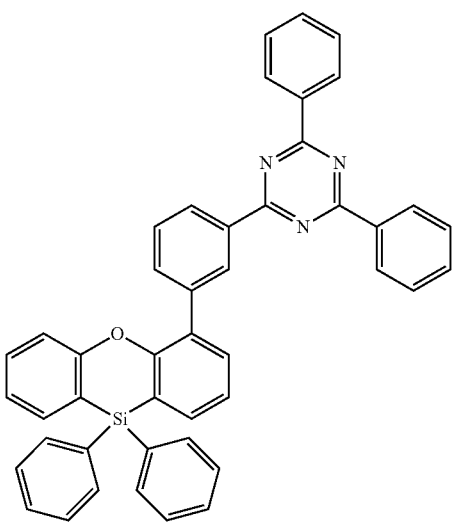
42
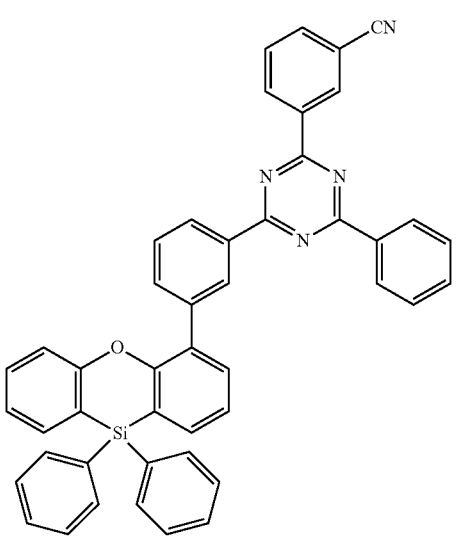
43
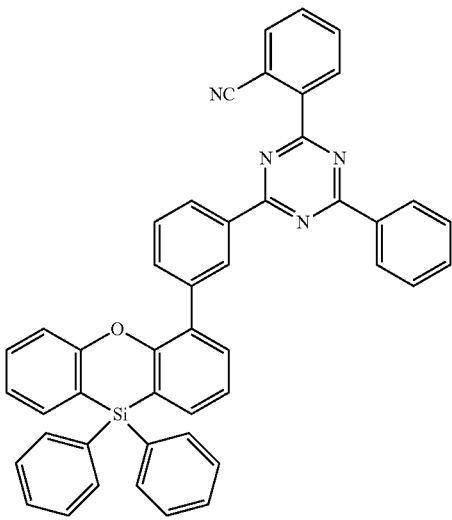

44
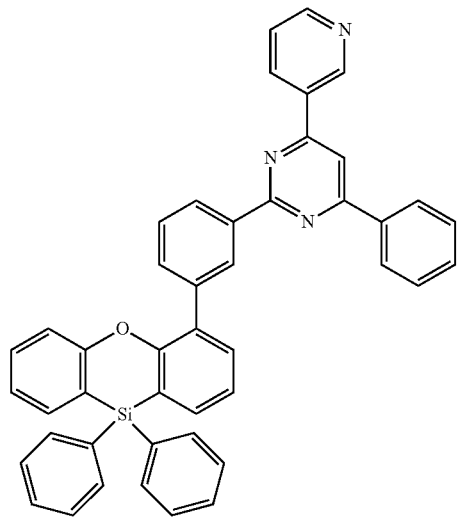
45
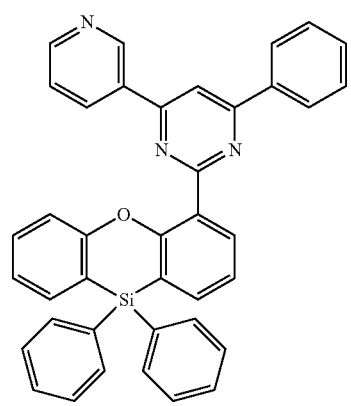
46
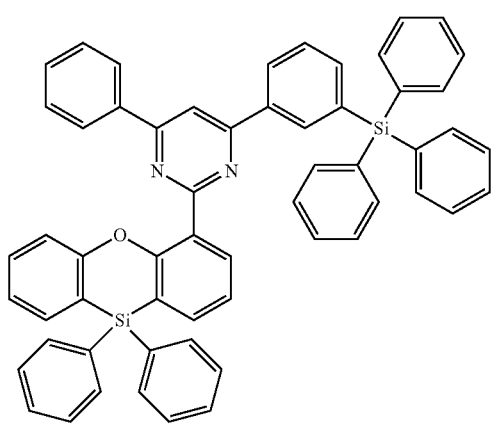
47
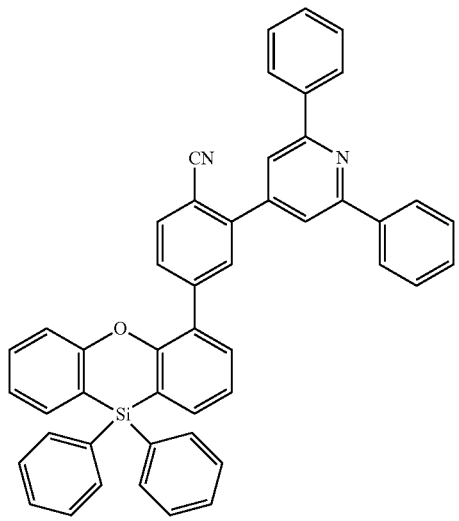
48
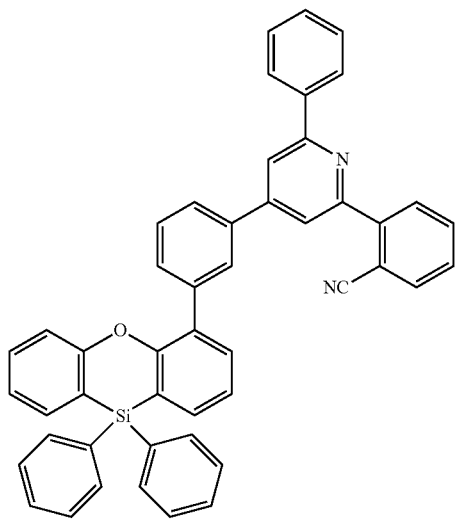
49
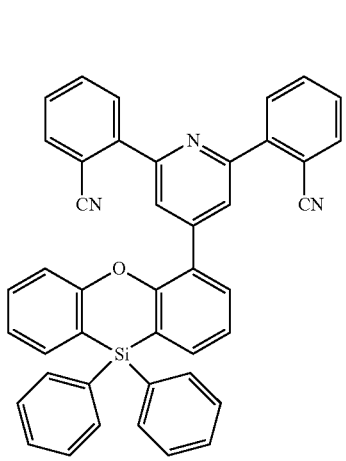

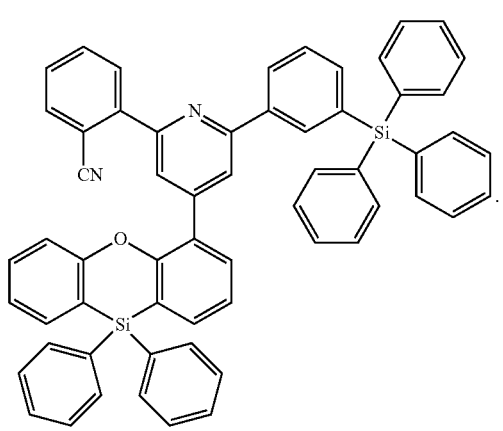

What is claimed is:

1. An aromatic compound represented by Formula 1:

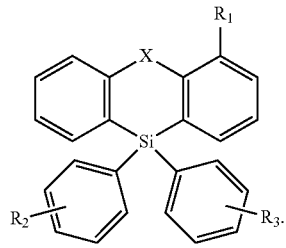

Formula 1 wherein in Formula 1,
$R_1$ to $R_3$ are each independently represented by Formula 2, or a hydrogen atom, wherein at least one of $R_1$ to $R_3$ is represented by Formula 2, and
X is O or S:

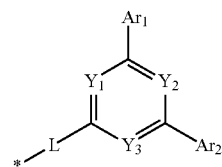

Formula 2 wherein in Formula 2,
$Y_1$ to $Y_3$ are each independently CH or N,
L is a direct linkage, a substituted or unsubstituted arylene group having 6 to 12 carbon atoms for forming a ring, or a substituted or unsubstituted heteroarylene group having 5 to 11 carbon atoms for forming a ring,
$Ar_1$ and $Ar_2$ are each independently represented by Formula 3 or Formula 4, or a hydrogen atom, wherein at least one of $Ar_1$ or $Ar_2$ is represented by Formula 3 or Formula 4:

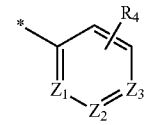

Formula 3

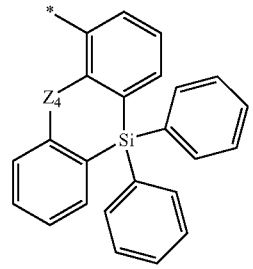

Formula 4 wherein in Formula 3 and Formula 4,
$Z_1$ to $Z_3$ are each independently $CR_5$ or N,
$Z_4$ is O or S,
$R_4$ is a hydrogen atom, a cyano group, or a substituted or unsubstituted silyl group, and
$R_5$ is a hydrogen atom, or a substituted or unsubstituted aryl group.

2. The aromatic compound of claim 1, wherein the aromatic compound represented by Formula 1 is represented by Formula 1-1 or Formula 1-2:

Formula 1-1

Formula 1-2 wherein in Formula 1-1 and Formula 1-2,

X, L, $Y_1$ to $Y_3$, $Ar_1$, and $Ar_2$ are the same as respectively defined in Formulae 1 and 2.

3. The aromatic compound of claim 1, wherein a moiety represented by Formula 2 is represented by one of Formula 2-1 to Formula 2-4:

Formula 2-1

Formula 2-2

Formula 2-3

Formula 2-4 wherein in Formula 2-1 to Formula 2-4,

L, $Y_1$ to $Y_3$, $Z_1$ to $Z_4$, and $R_4$ are the same as respectively defined in Formulae 2 to 4.

4. The aromatic compound of claim 1, wherein a moiety represented by Formula 3 is represented by one of Formula 3-1 to Formula 3-7:

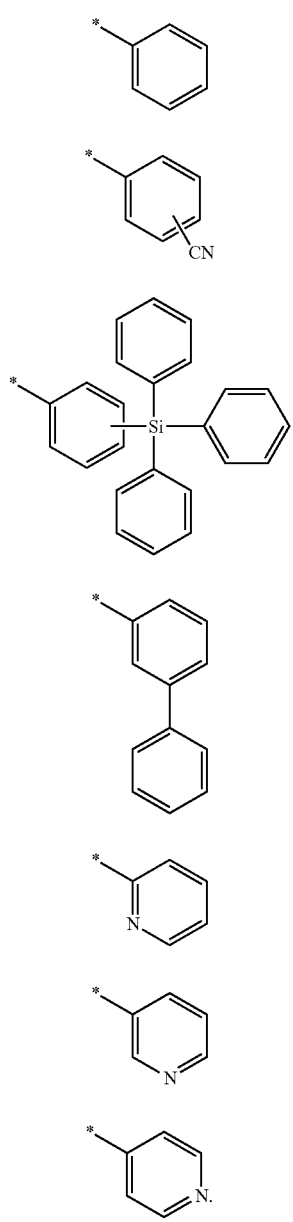

3-1

3-2

3-3

3-4

3-5

3-6

3-7

5. The aromatic compound of claim 1, wherein a moiety represented by Formula 4 is represented by Formula 4-1 or 4-2:

4-1

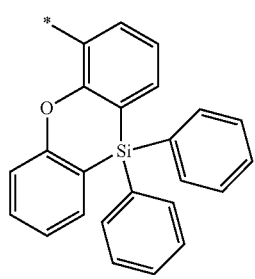

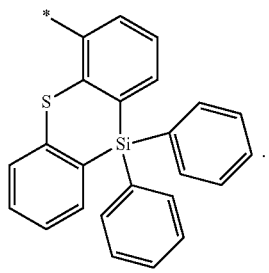

4-2

6. The aromatic compound of claim 1, wherein L is a direct linkage, a substituted or unsubstituted phenylene group, a substituted or unsubstituted divalent biphenyl group, or a substituted or unsubstituted heteroarylene group containing N as a heteroatom.

7. The aromatic compound of claim 1, wherein L is represented by one of Formula L-1 to Formula L-7:

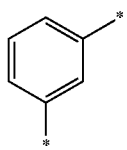

L-1

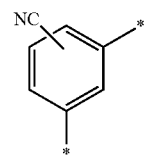

L-2

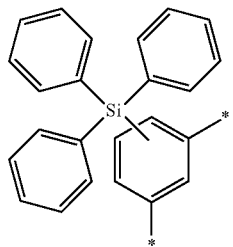

L-3

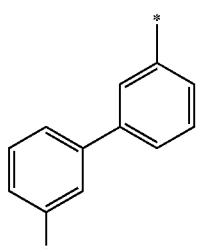

L-4

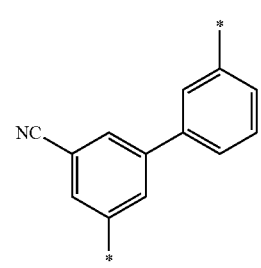

L-5

L-6
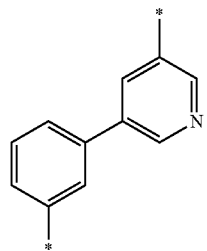
L-7
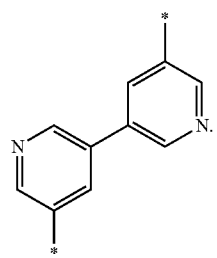
8. The aromatic compound of claim 1, wherein the aromatic compound represented by Formula 1 is one selected from compounds represented in Compound Group 1:
Compound Group 1
1
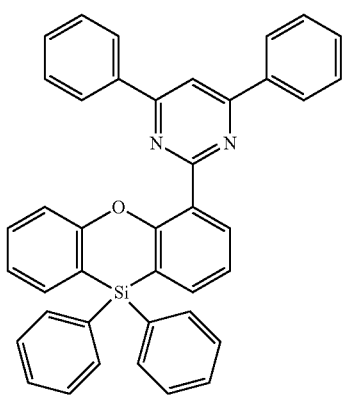
2
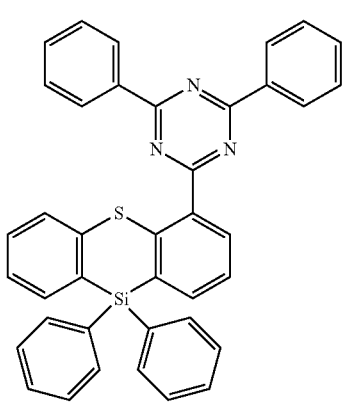
3
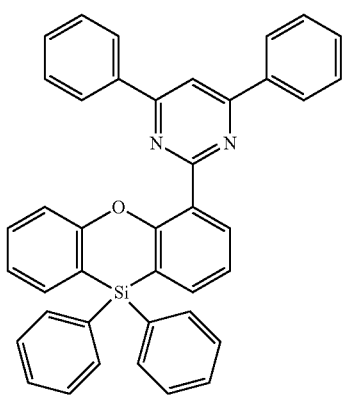
4
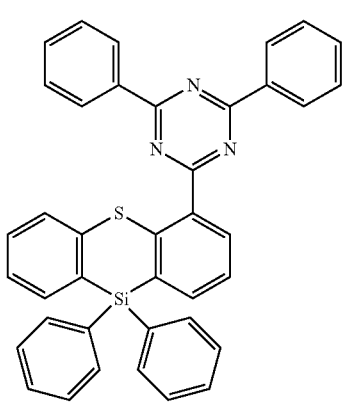
5
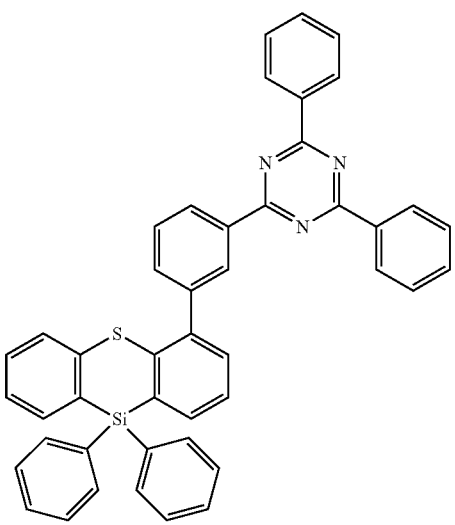

119
-continued
120
-continued
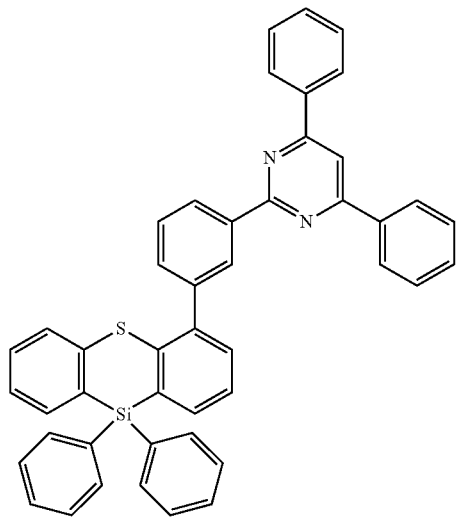
6
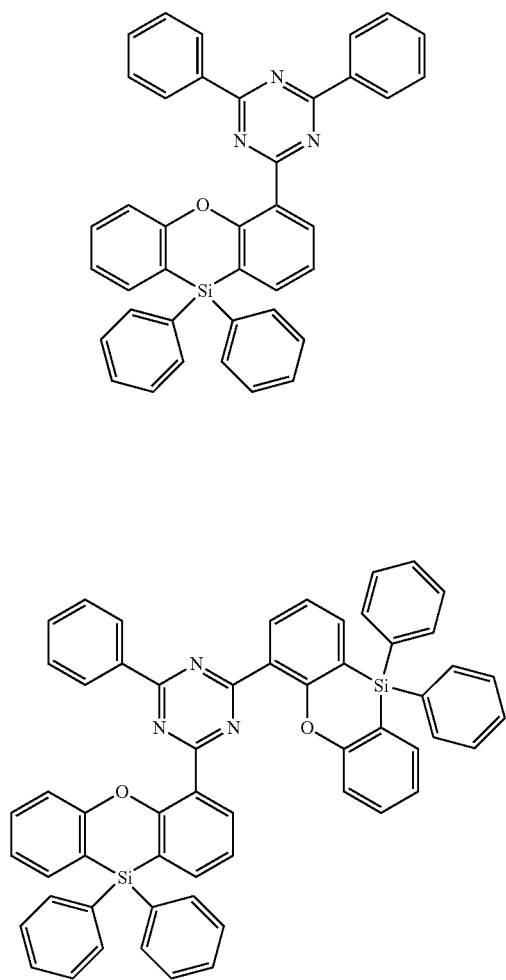
7
8
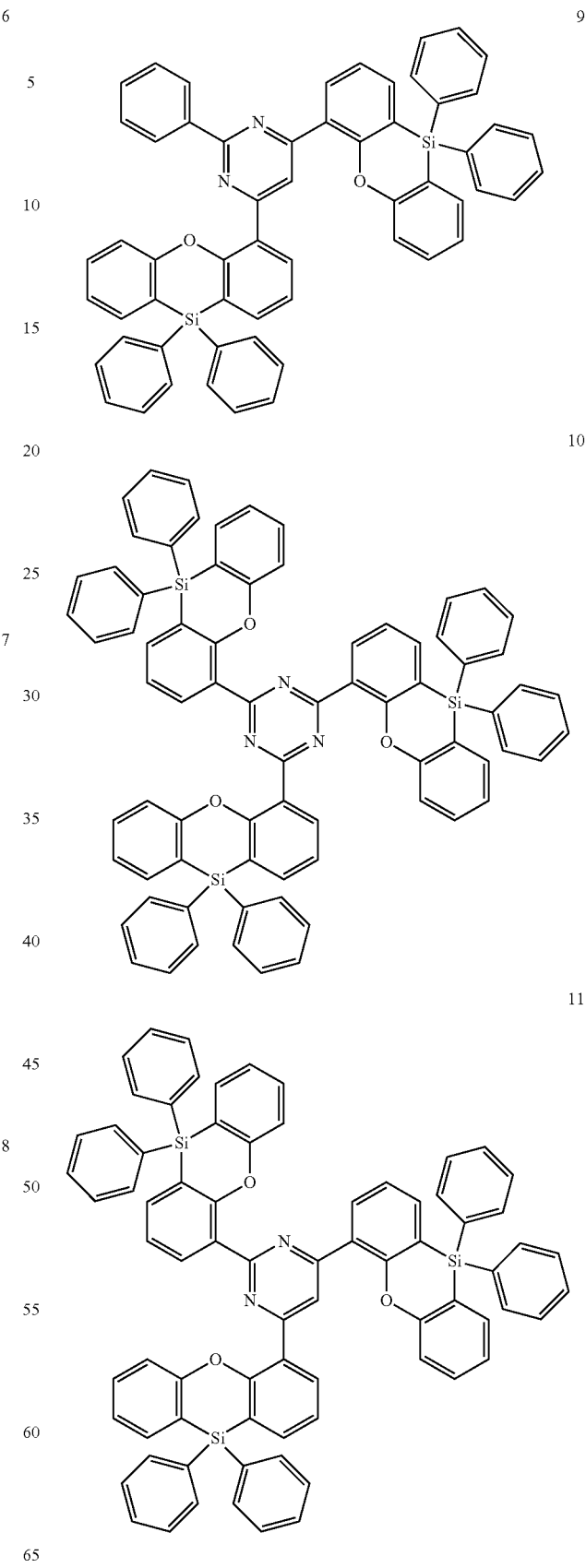
9
10
11

121
-continued
12
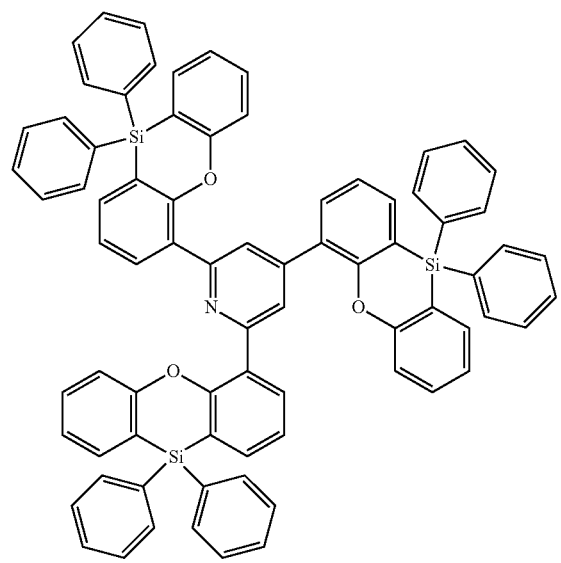
13
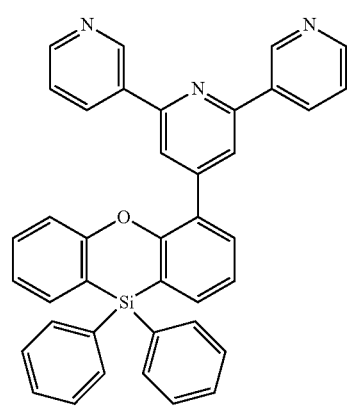
14
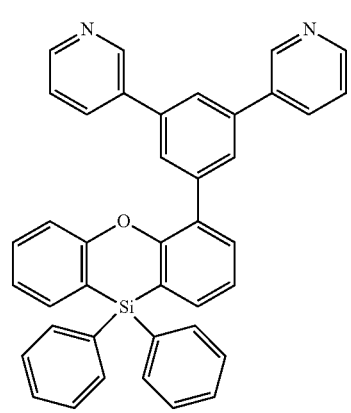
122
-continued
15
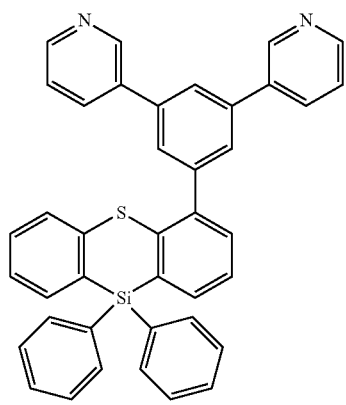
16
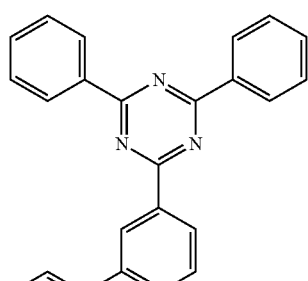
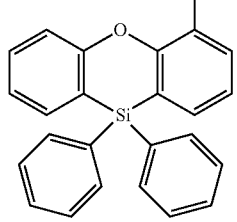
17
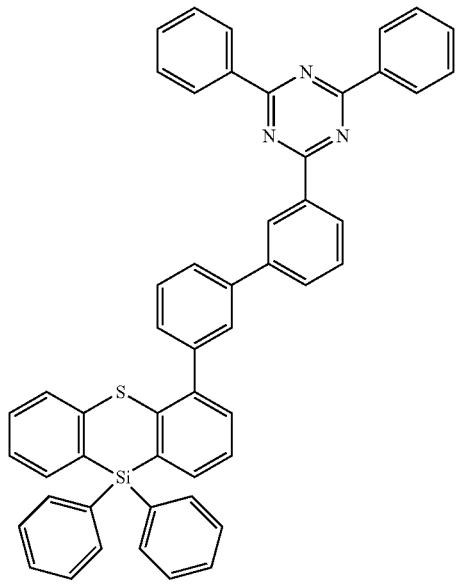

123
-continued
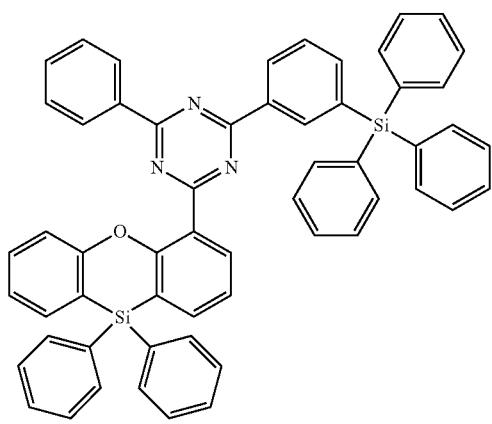
18
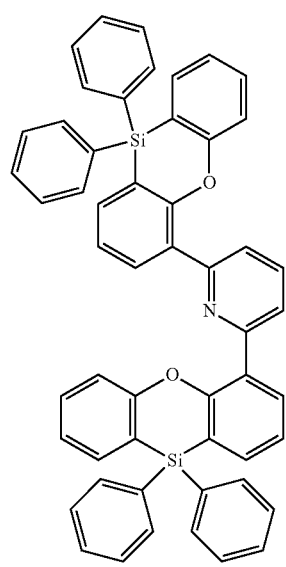
19
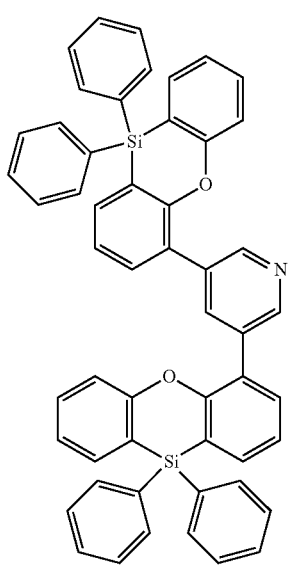
20
124
-continued
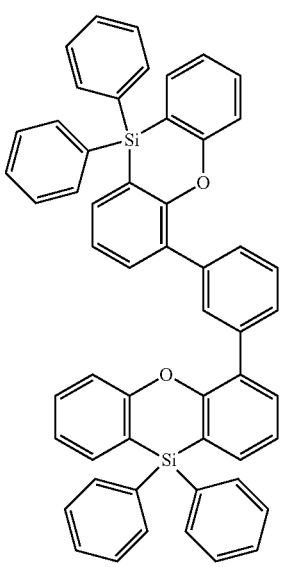
21
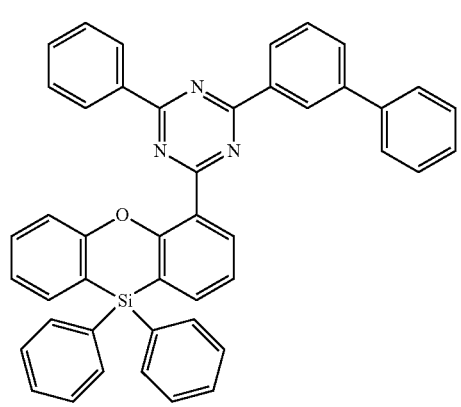
22
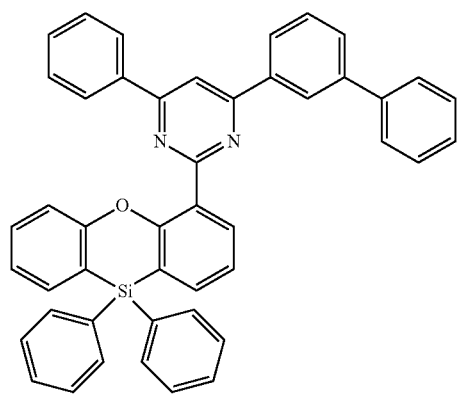
23

125
-continued
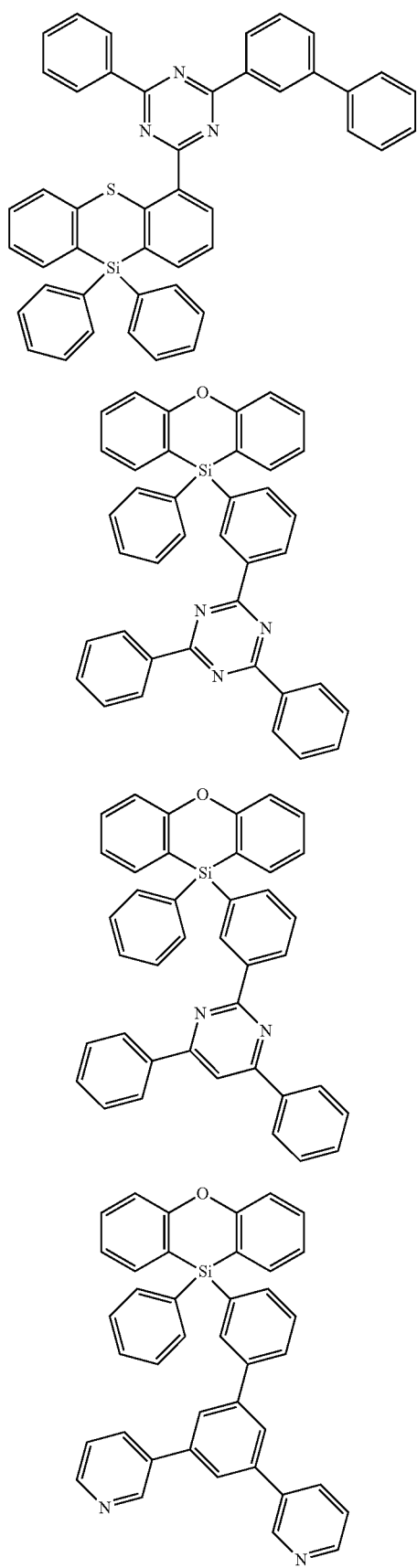
24
25
26
27
126
-continued
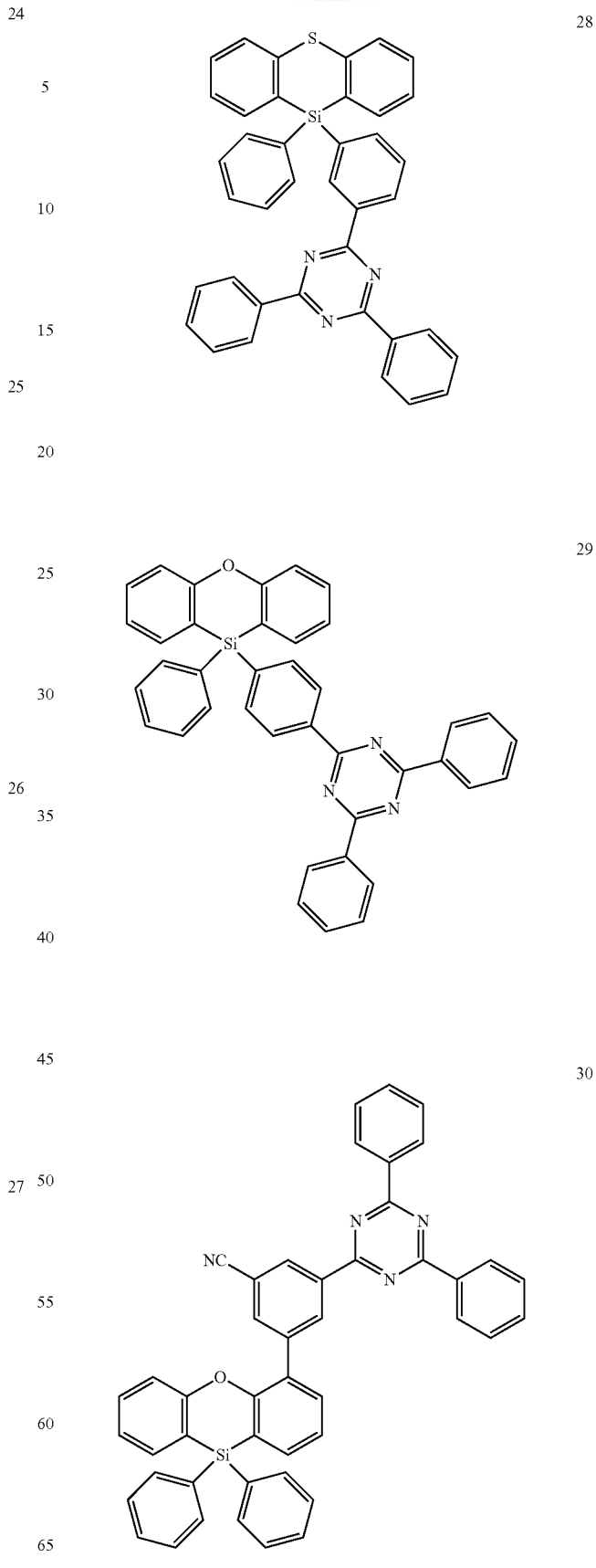
28
29
30

127
-continued
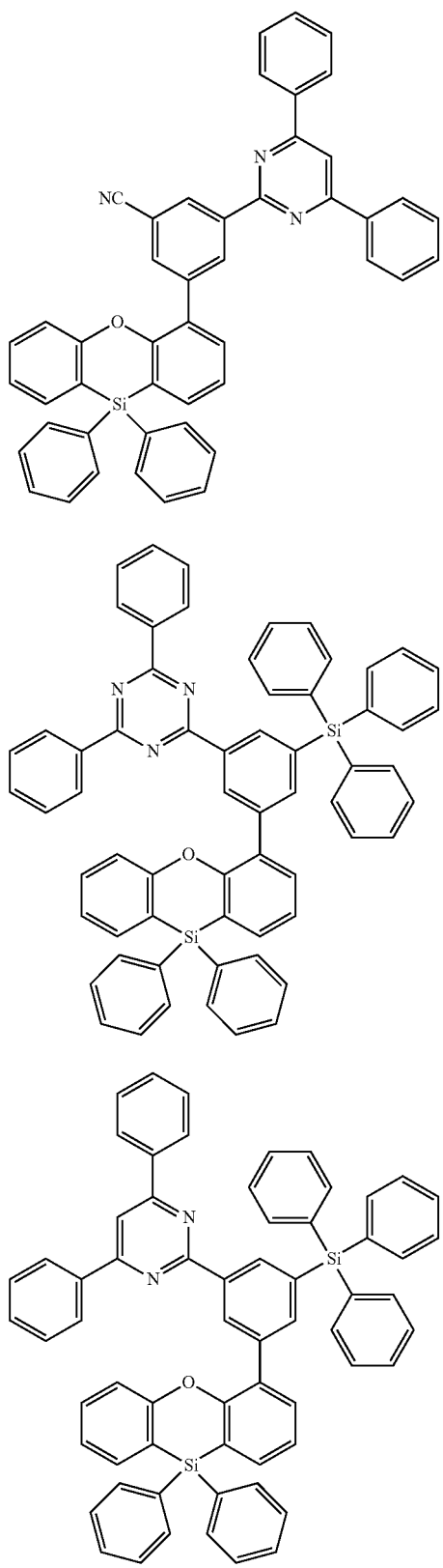
31
32
33
128
-continued
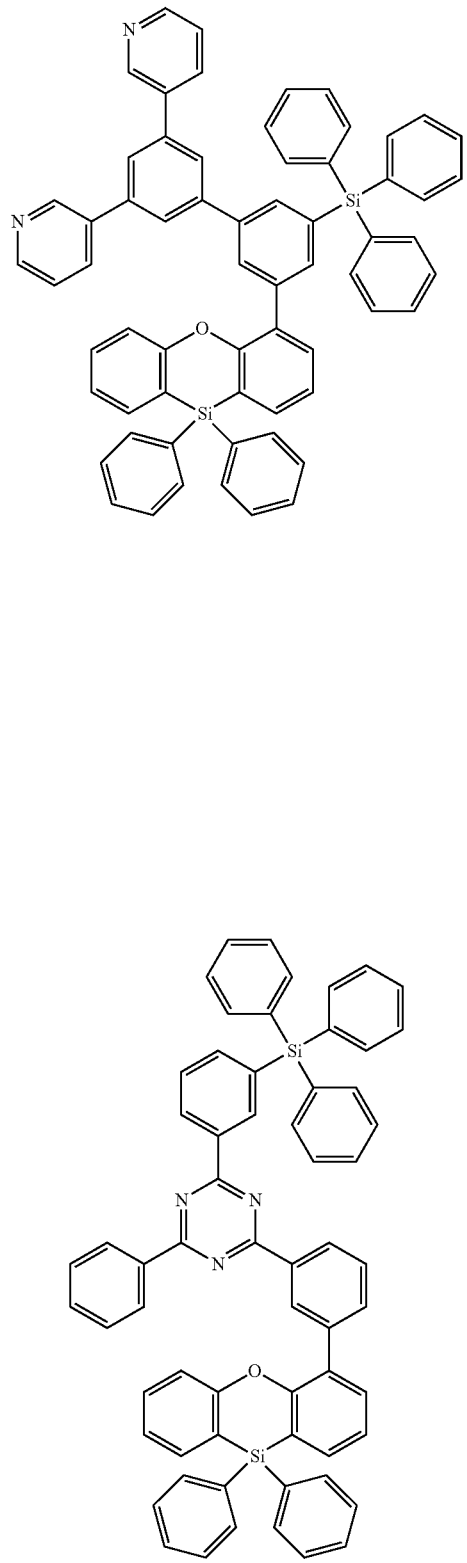
34
35

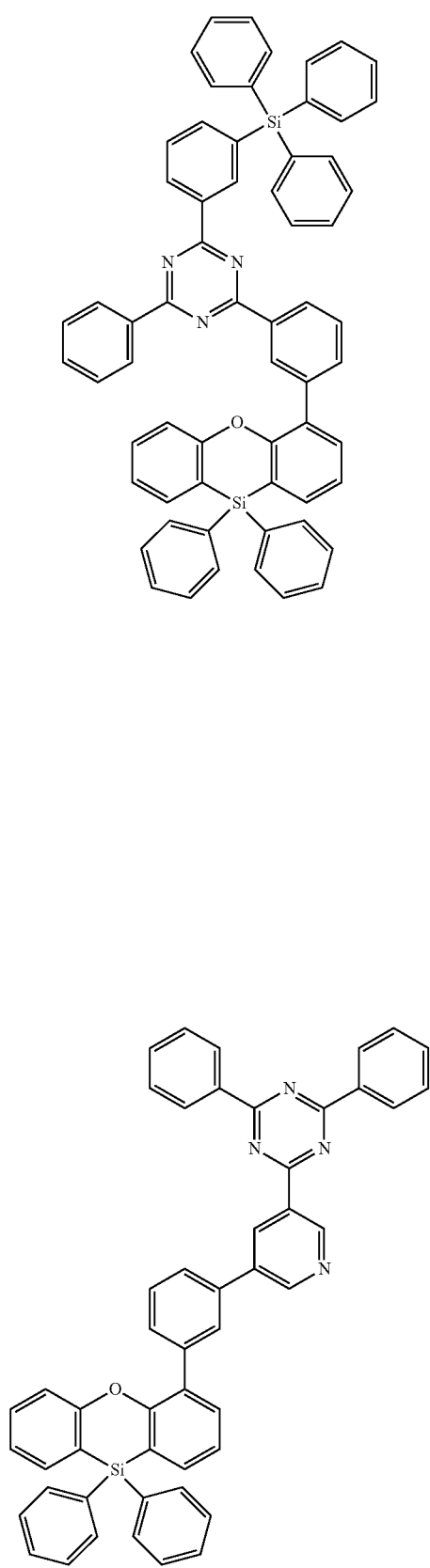
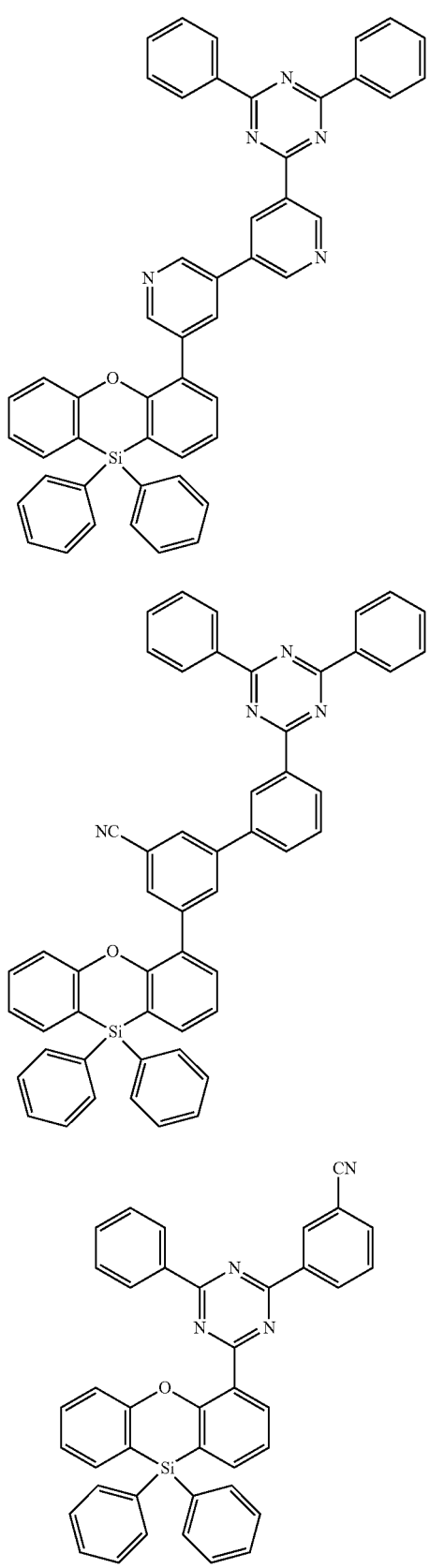

41
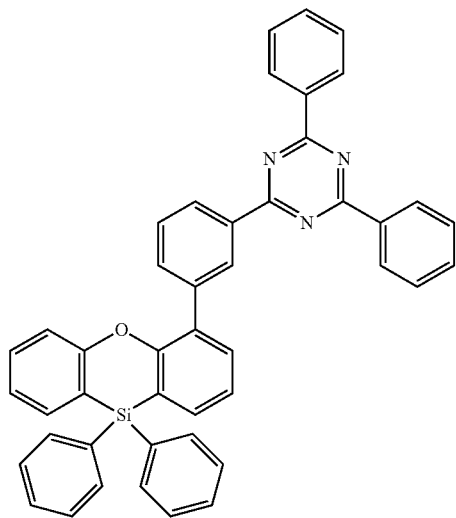
42
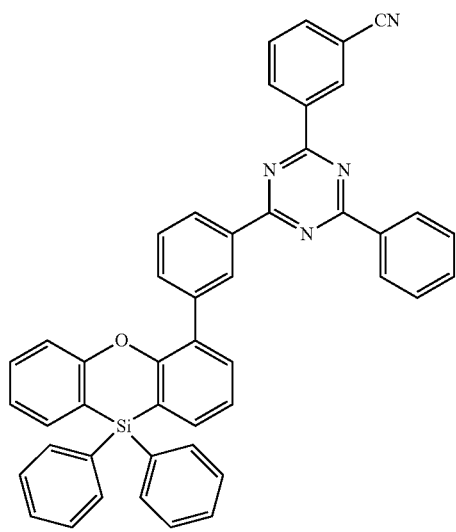
43
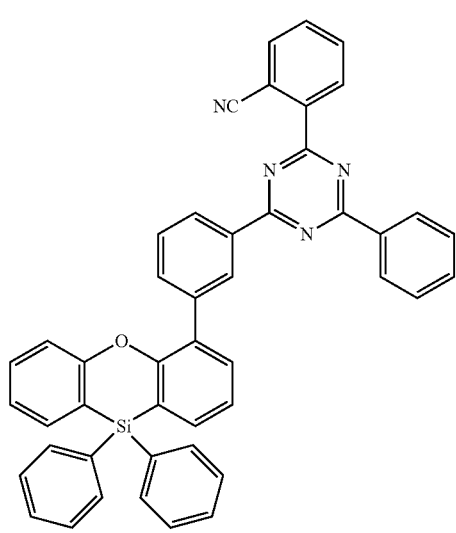
44
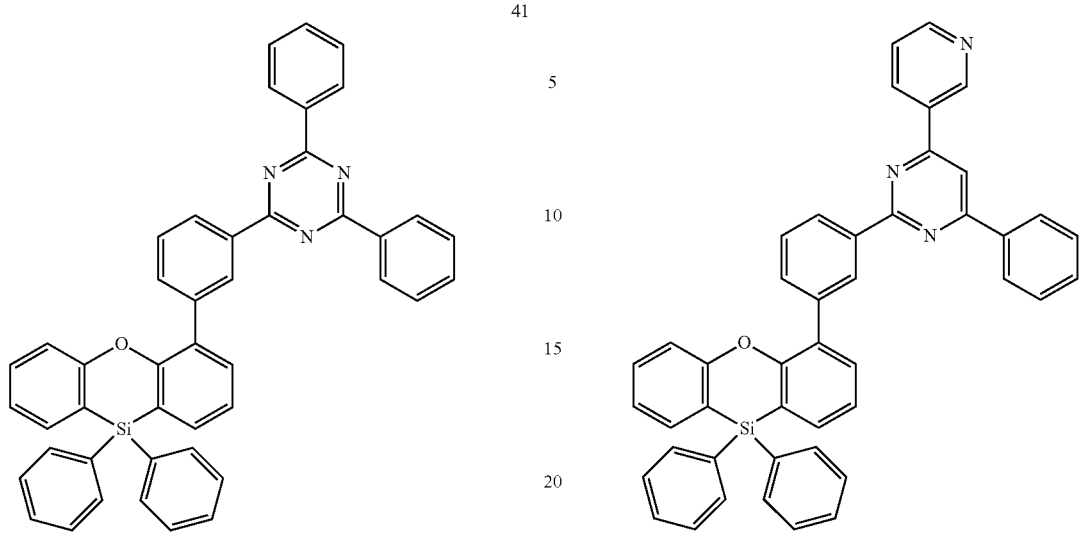
45
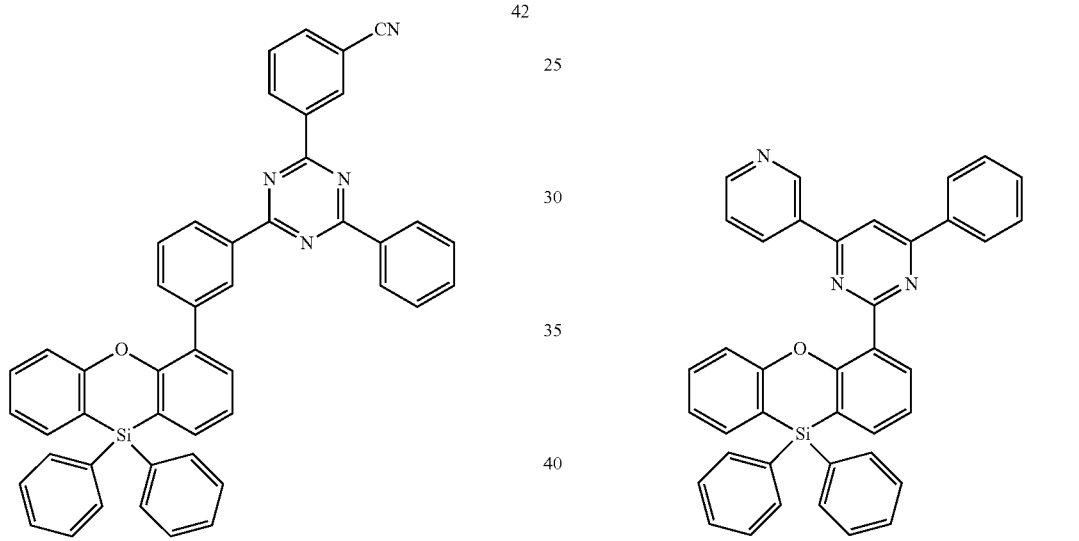
46
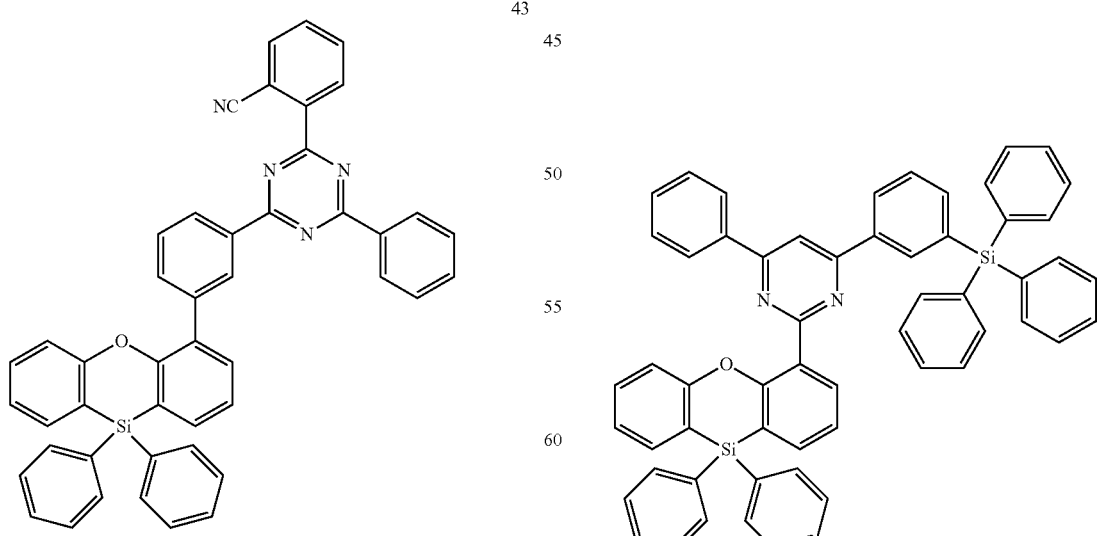

47

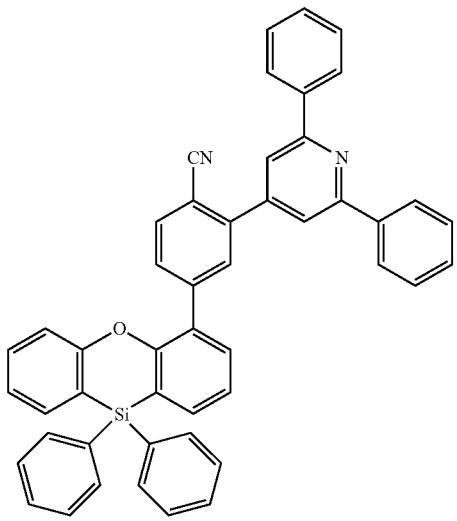

48

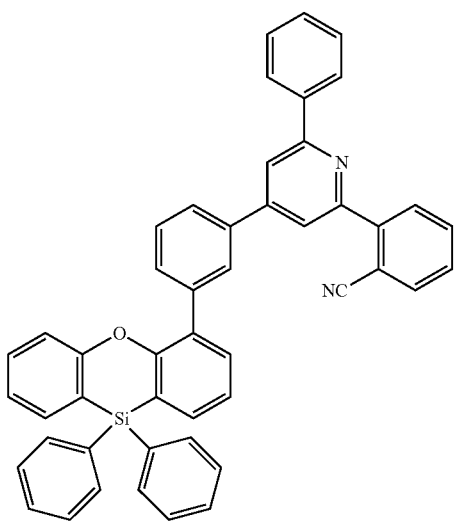

49

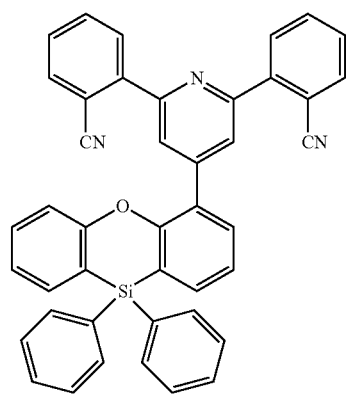

50

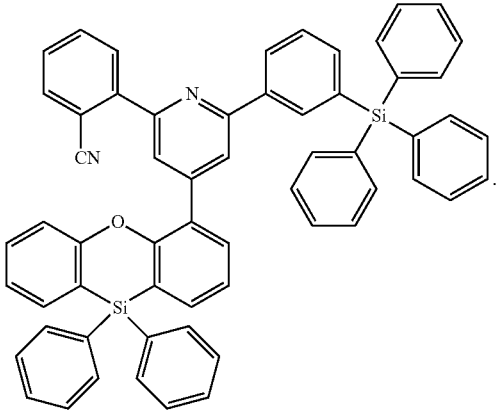

9. An organic electroluminescence device, comprising:
a first electrode;
a second electrode opposite to the first electrode; and
a plurality of organic layers between the first electrode and the second electrode,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide of one or more thereof,
wherein at least one organic layer among the plurality of organic layers comprises an aromatic compound represented by Formula 1:

Formula 1

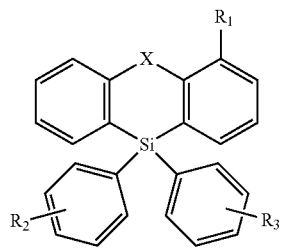

wherein in Formula 1,
$R_1$ to $R_3$ are each independently represented by Formula 2, or a hydrogen atom, wherein at least one of $R_1$ to $R_3$ is represented by Formula 2, and
X is O or S:

Formula 2

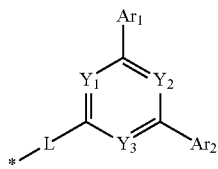

wherein in Formula 2,
$Y_1$ to $Y_3$ are each independently CH or N,
L is a direct linkage, a substituted or unsubstituted arylene group having 6 to 12 carbon atoms for forming a ring, or a substituted or unsubstituted heteroarylene group having 5 to 11 carbon atoms for forming a ring, Ar₁ and Ar₂ are each independently represented by Formula 3 or Formula 4, or a hydrogen atom, wherein at least one of Ar₁ or Ar₂ is represented by Formula 3 or Formula 4:

Formula 3

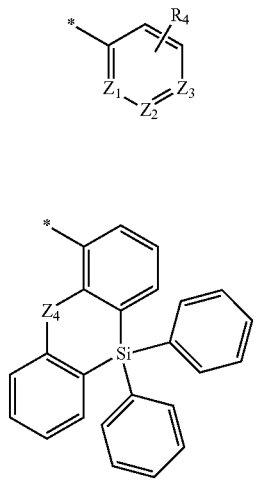

Formula 4 wherein in Formula 3 and Formula 4, $Z_1$ to $Z_3$ are each independently $CR_5$ or N, $Z_4$ is O or S, $R_4$ is a hydrogen atom, a cyano group, or a substituted or unsubstituted silyl group, and $R_5$ is a hydrogen atom, or a substituted or unsubstituted aryl group.

10. The organic electroluminescence device of claim 9, wherein the plurality of organic layers comprises:

a hole transport region on the first electrode;

an emission layer on the hole transport region; and an electron transport region on the emission layer, wherein the emission layer comprises the aromatic compound represented by Formula 1.

11. The organic electroluminescence device of claim 10, wherein the emission layer is a fluorescence emission layer comprising a first host and a first dopant, and the first host comprises the aromatic compound represented by Formula 1.

12. The organic electroluminescence device of claim 10, wherein the emission layer is a phosphorescence emission layer comprising a second host and a second dopant, and the second host comprises the aromatic compound represented by Formula 1.

13. The organic electroluminescence device of claim 10, wherein the electron transport region comprises the aromatic compound represented by Formula 1.

14. The organic electroluminescence device of claim 10, wherein the emission layer emits blue light.

15. The organic electroluminescence device of claim 9, wherein the aromatic compound represented by Formula 1 is represented by Formula 1-1 or Formula 1-2:

Formula 1-1

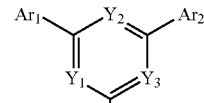

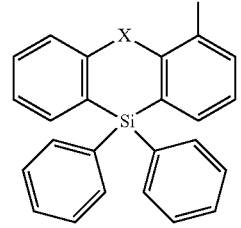

Formula 1-2

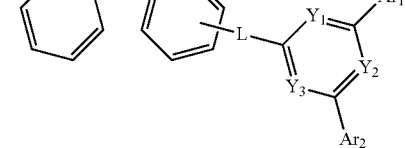

wherein in Formula 1-1 and Formula 1-2,

X, $Y_1$ to $Y_3$, $Ar_1$, and $Ar_2$ are the same as respectively defined in Formulae 1 and 2.

16. The organic electroluminescence device of claim 9, wherein a moiety represented by Formula 2 is represented by one of Formula 2-1 to Formula 2-4:

Formula 2-1

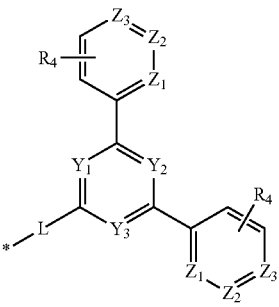

Formula 2-2

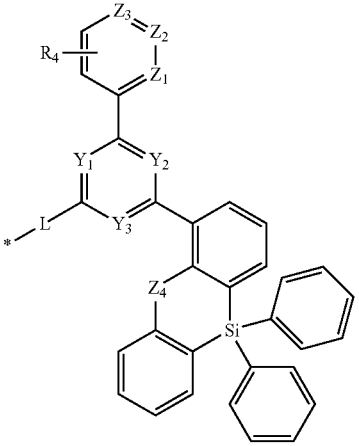

-continued

Formula 2-3

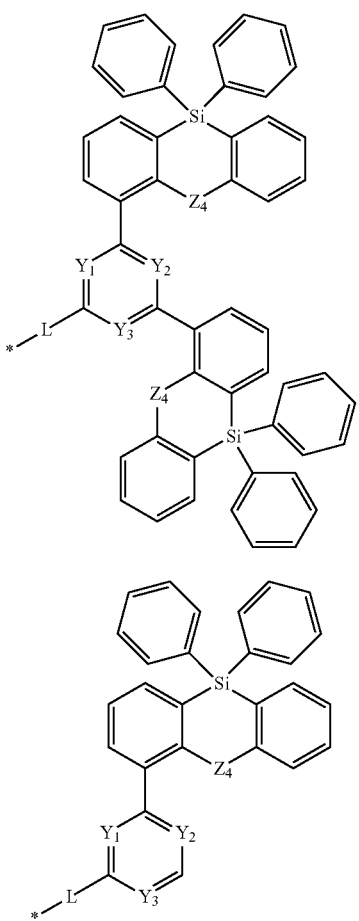

Formula 2-4

Wherein in Formula 2-1 to Formula 2-4,
L, $Y_1$ to $Y_3$, $Z_1$ to $Z_4$, and $R_4$ are the same as respectively defined in Formulae 2 to 4.

17. The organic electroluminescence device of claim 9, wherein a moiety represented by Formula 3 is represented by one of Formula 3-1 to Formula 3-7:

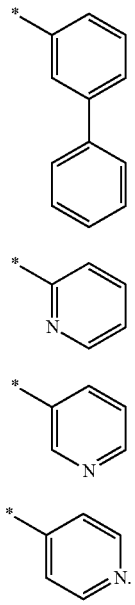

3-1

3-2

3-3

-continued

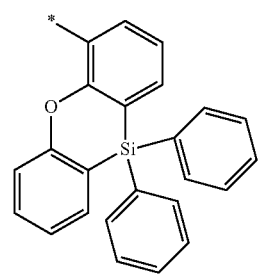

3-4

3-5

3-6

3-7

18. The organic electroluminescence device of claim 9, wherein a moiety represented by Formula 4 is represented by Formula 4-1 or 4-2:

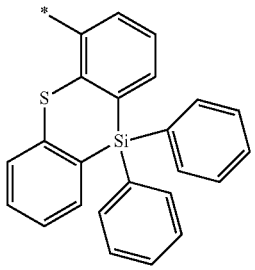

4-1

4-2

19. The organic electroluminescence device of claim 9, wherein L is represented by one of Formula L-1 to Formula L-7:

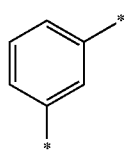

L-1

Compound Group 1
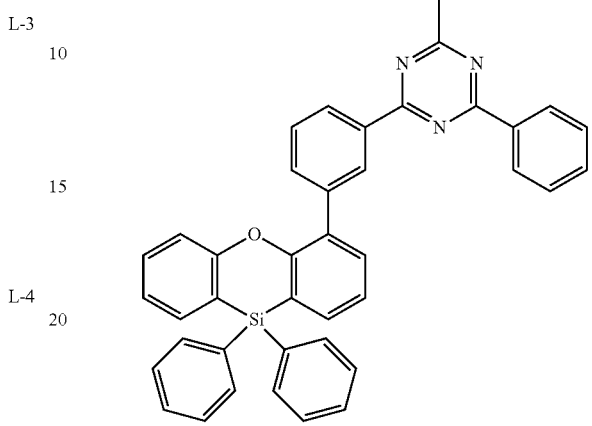
1
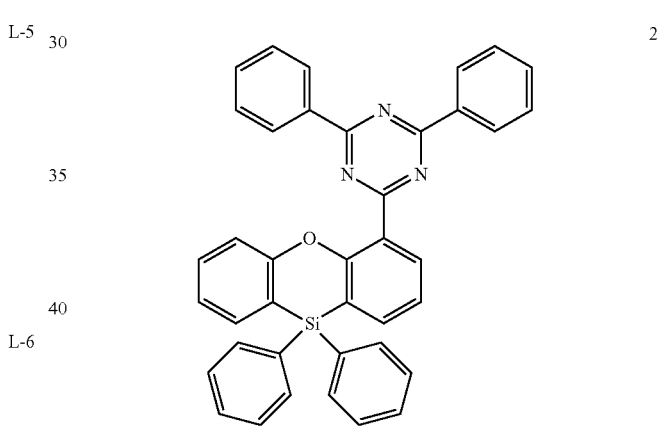
2
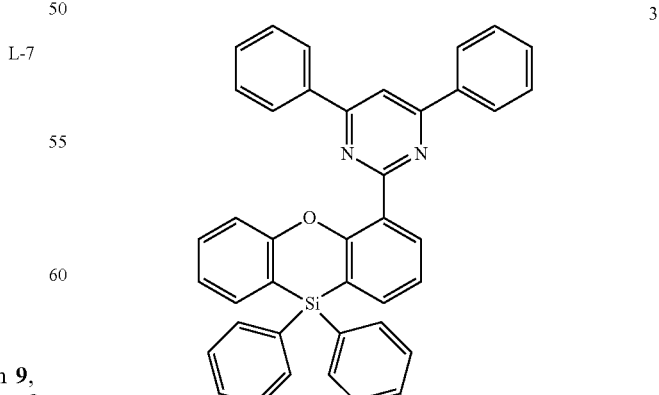
3
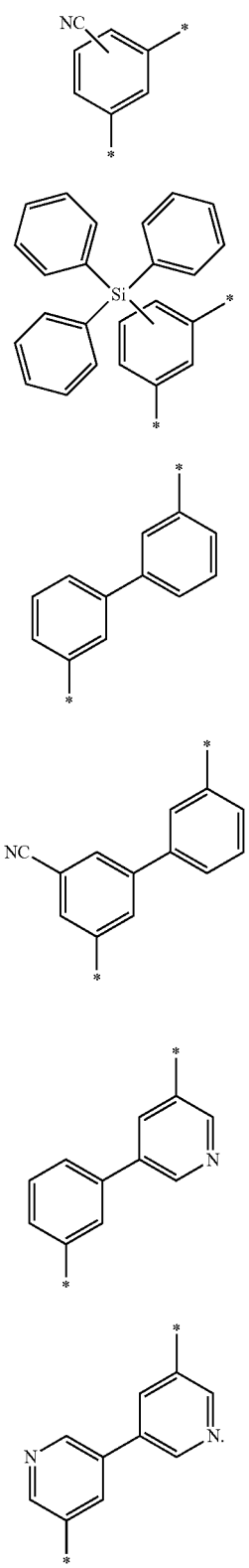
20. The organic electroluminescence device of claim 9, wherein at least one organic layer among the plurality of organic layers comprises at least one selected from aromatic compounds represented in Compound Group 1:

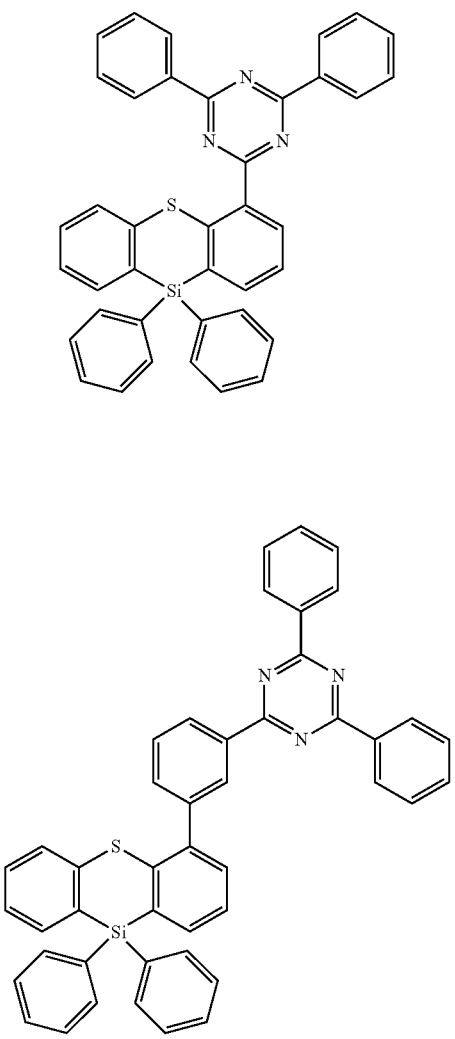
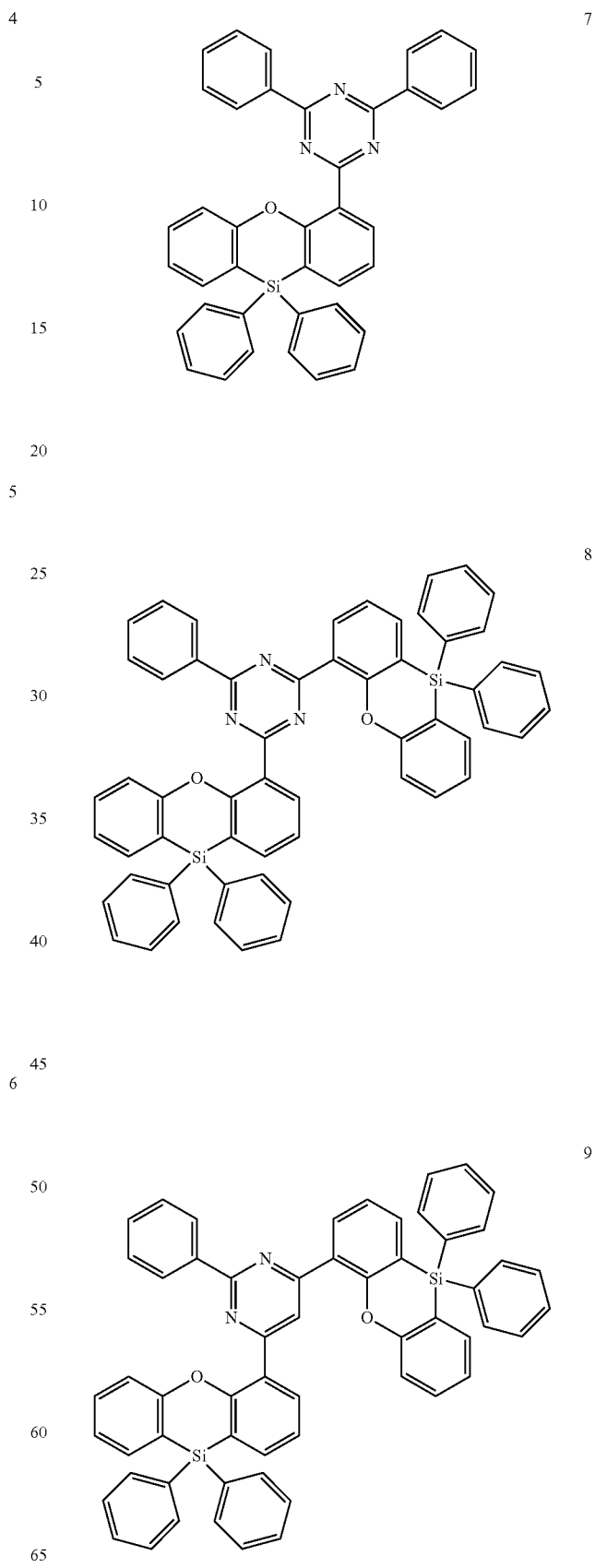

143
-continued
10
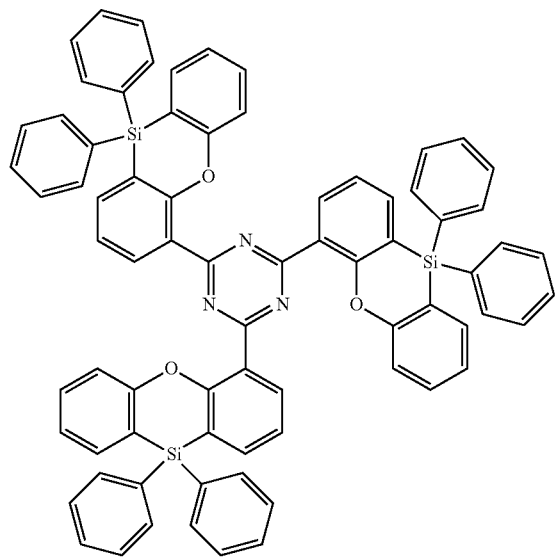
11
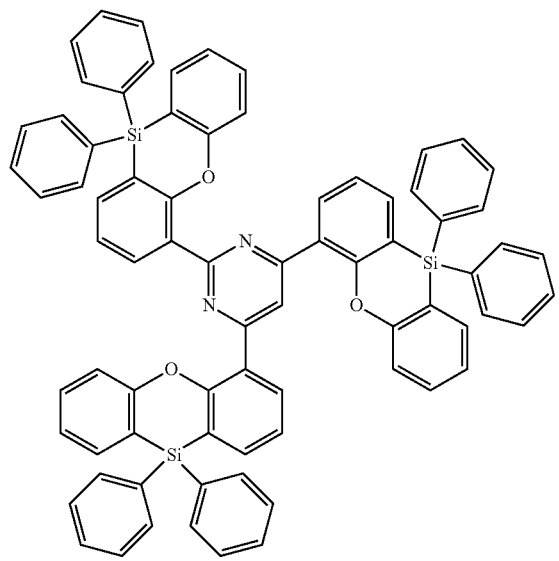
144
-continued
12
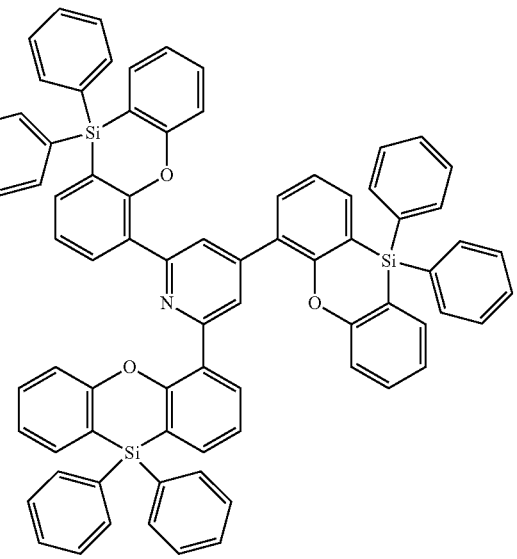
13
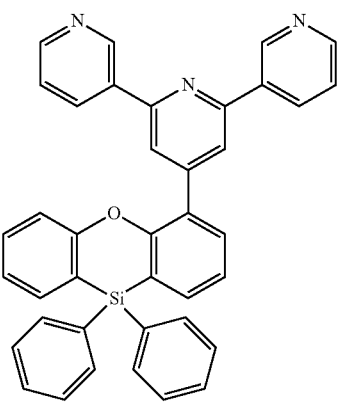
14
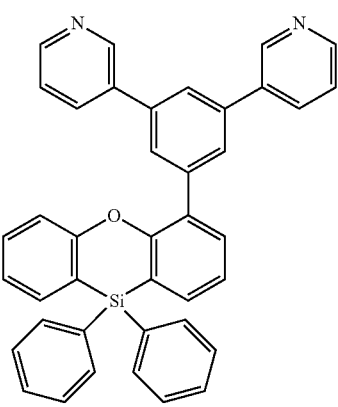

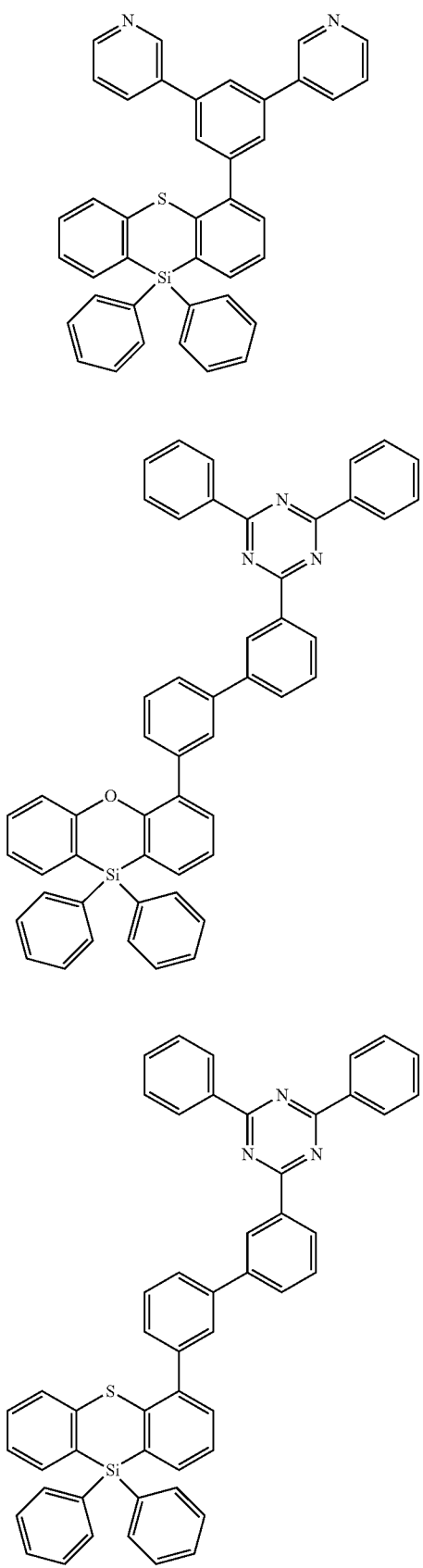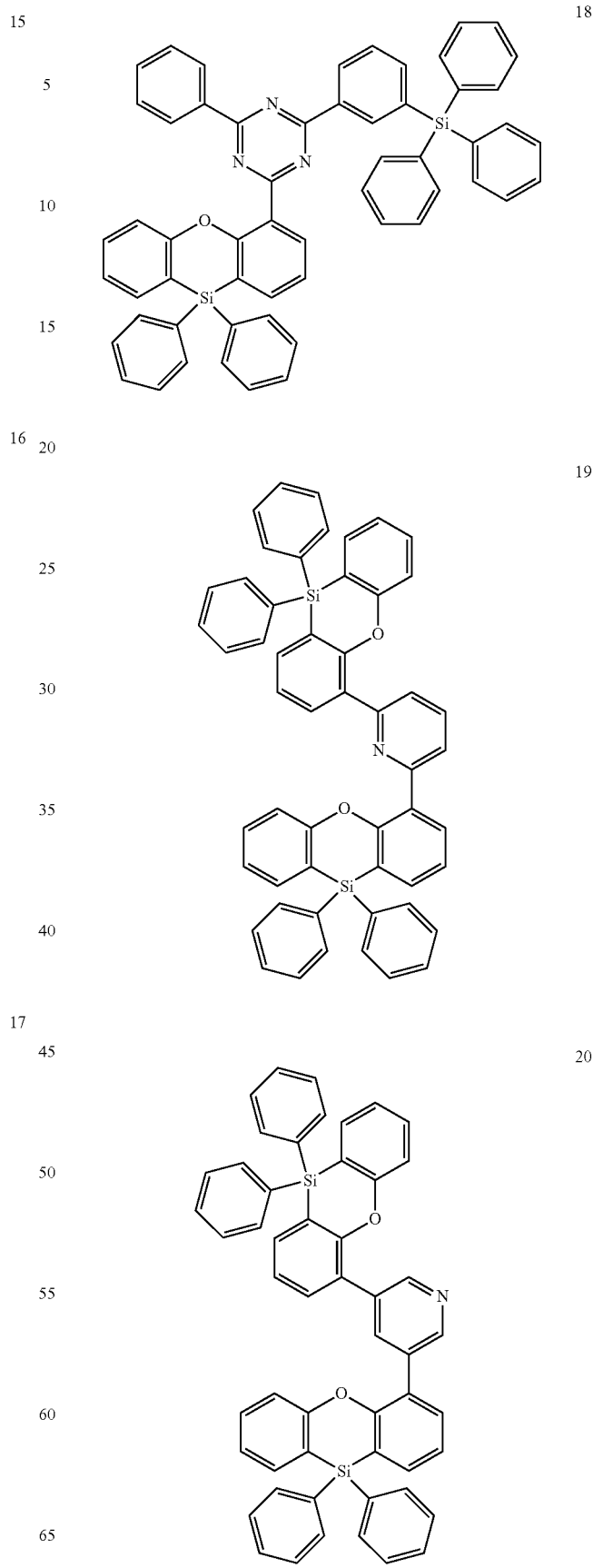

21
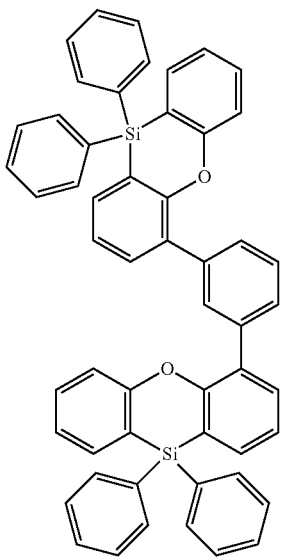
22
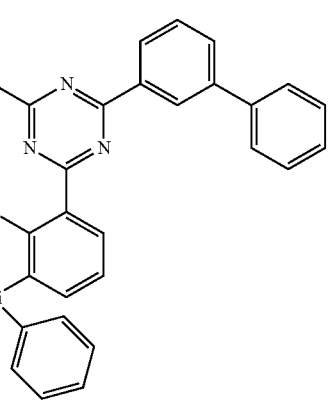
23
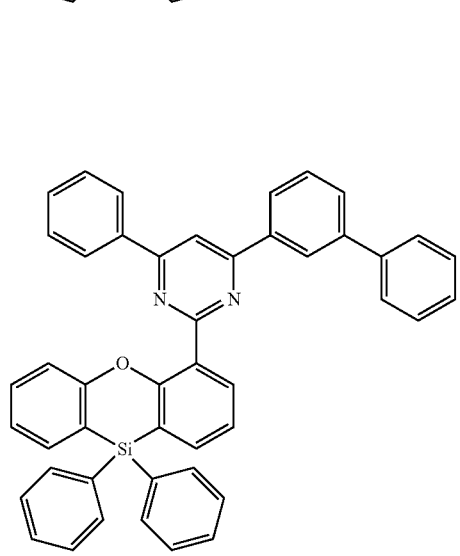
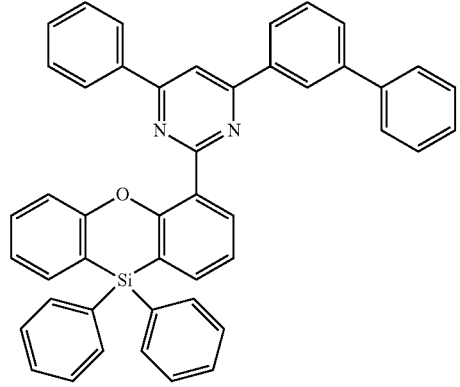
24
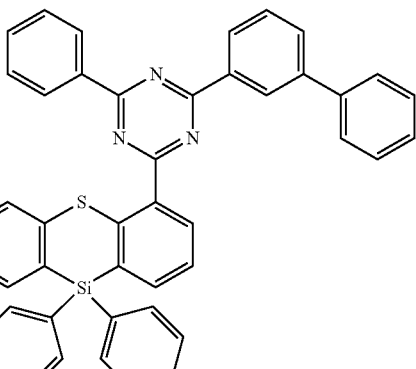
25
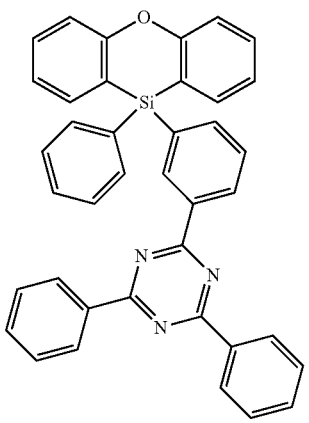
26
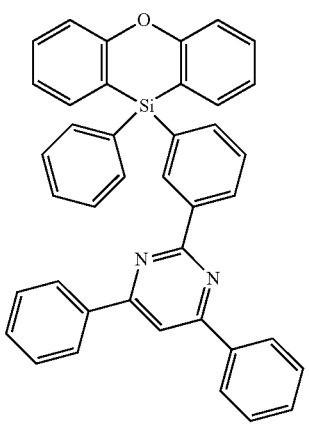
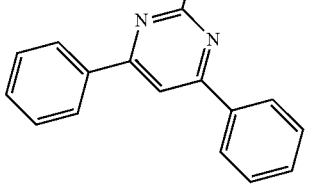
27
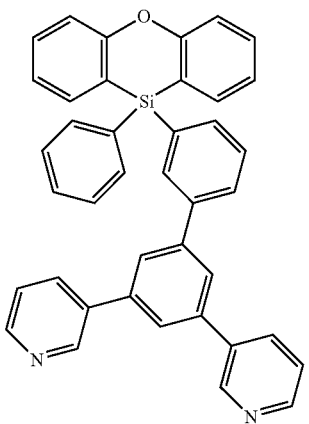

-continued
28
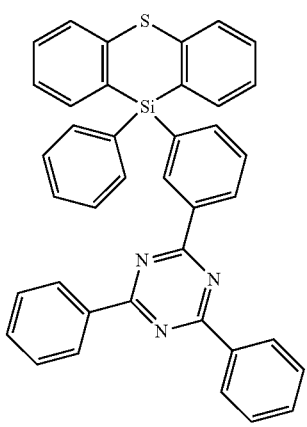
29
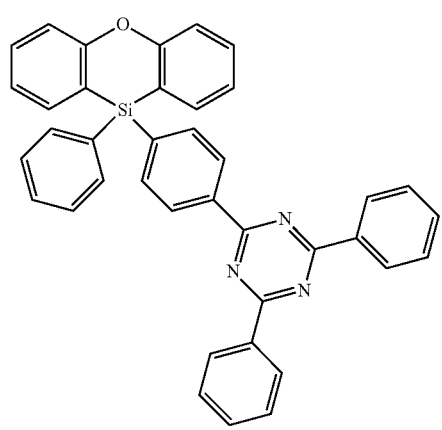
30
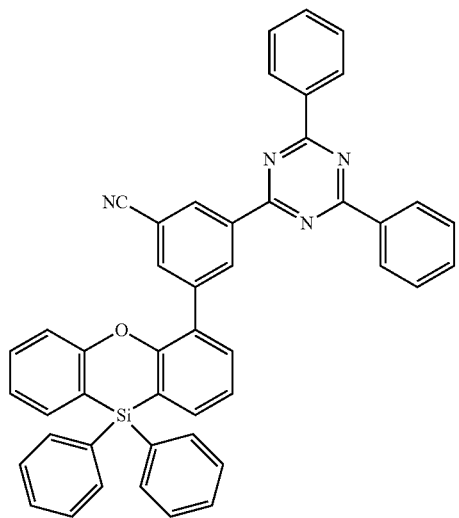
-continued
31
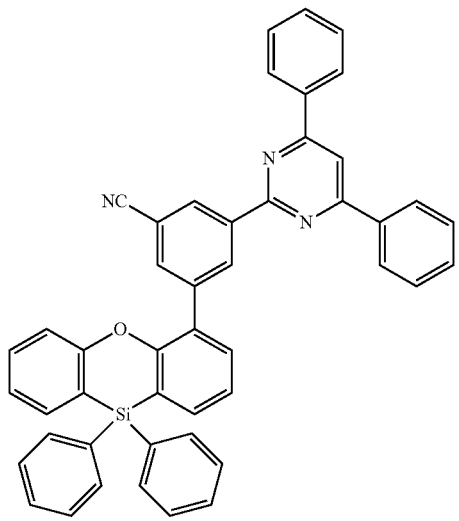
32
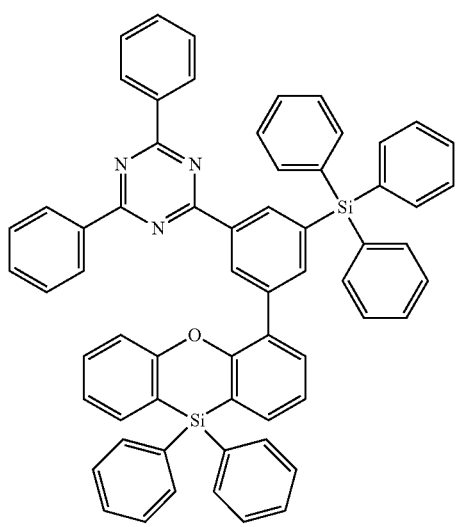
33
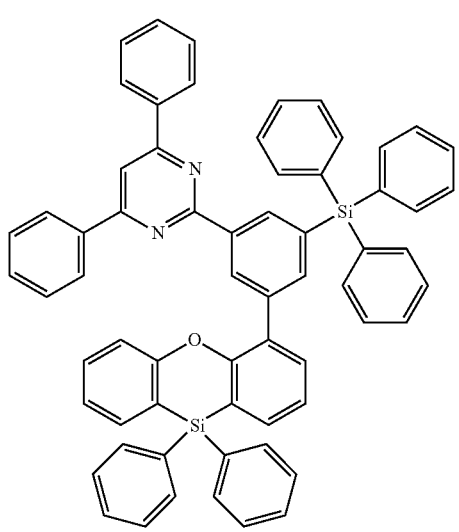

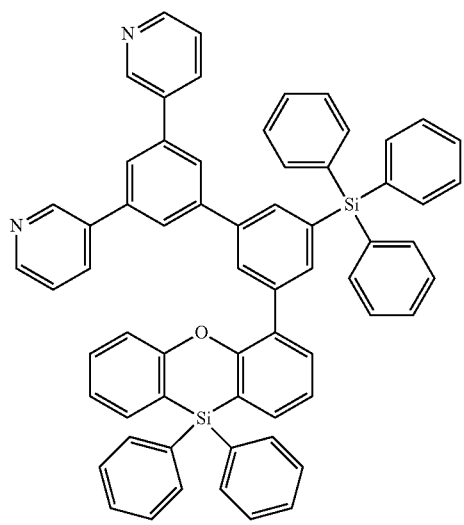
34
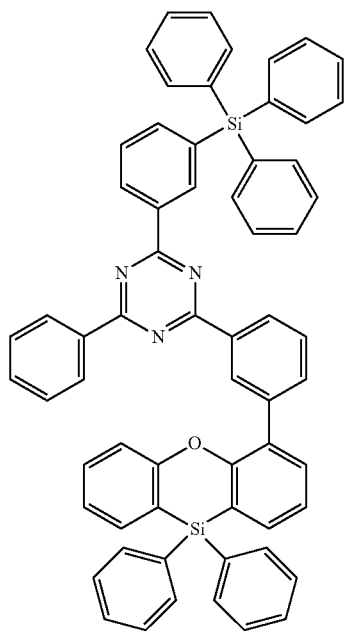
36
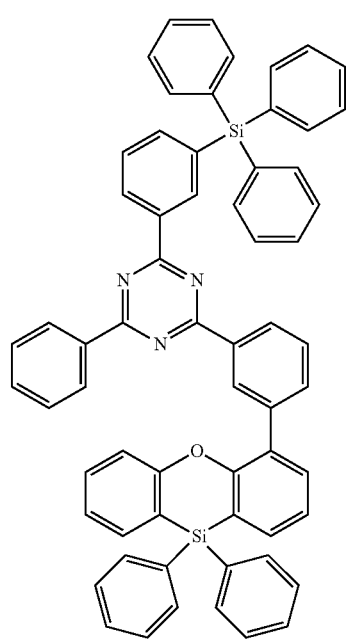
35
37